(12) United States Patent
Shin et al.

(10) Patent No.: US 11,716,865 B2
(45) Date of Patent: Aug. 1, 2023

(54) ORGANIC ELECTRIC ELEMENT, DISPLAY PANEL COMPRISING THE SAME AND DISPLAY DEVICE COMPRISING THE SAME

(71) Applicants: LG Display Co., Ltd., Seoul (KR); LG Chem, Ltd., Seoul (KR)

(72) Inventors: Jicheol Shin, Gyeonggi-do (KR); Seonkeun Yoo, Gyeonggi-do (KR); Jeongdae Seo, Gyeonggi-do (KR); Shinhan Kim, Gyeonggi-do (KR); JooYong Yoon, Gyeonggi-do (KR); Jun Yun, Gyeonggi-do (KR); DongHeon Kim, Gyeonggi-do (KR); YongHan Lee, Gyeonggi-do (KR); SungJae Lee, Gyeonggi-do (KR)

(73) Assignees: LG Display Co., Ltd., Seoul (KR); LG Chem, Ltd., Seoul (KR)

( * ) Notice: Subject to any disclaimer, the term of this patent is extended or adjusted under 35 U.S.C. 154(b) by 212 days.

(21) Appl. No.: 17/138,226

(22) Filed: Dec. 30, 2020

(65) Prior Publication Data
US 2021/0202872 A1   Jul. 1, 2021

(30) Foreign Application Priority Data
Dec. 31, 2019   (KR) .................. 10-2019-0180011

(51) Int. Cl.
  H10K 50/11   (2023.01)
  H10K 50/12   (2023.01)
  H10K 50/17   (2023.01)
  H10K 101/40  (2023.01)

(52) U.S. Cl.
  CPC ........... H10K 50/11 (2023.02); H10K 50/12 (2023.02); H10K 50/17 (2023.02); H10K 2101/40 (2023.02)

(58) Field of Classification Search
CPC combination set(s) only.
See application file for complete search history.

(56) References Cited

U.S. PATENT DOCUMENTS

| | | | |
|---|---|---|---|
| 2013/0264551 A1 | 10/2013 | Pieh et al. | |
| 2016/0343776 A1* | 11/2016 | Heo | H10K 59/38 |
| 2017/0162792 A1* | 6/2017 | Kim | C07D 213/61 |
| 2018/0033373 A1* | 2/2018 | Hong | G09G 3/325 |
| 2019/0036055 A1* | 1/2019 | Lin | H01L 51/5024 |
| 2020/0266375 A1* | 8/2020 | Li | H01L 27/3244 |

FOREIGN PATENT DOCUMENTS

| | | |
|---|---|---|
| CN | 105161637 A | 12/2015 |
| EP | 2 889 929 A1 | 7/2015 |

OTHER PUBLICATIONS

Extended European Search Report dated May 28, 2021, issued in corresponding European Patent Application No. 20217567.5.

\* cited by examiner

*Primary Examiner* — Moin M Rahman
(74) *Attorney, Agent, or Firm* — Morgan, Lewis & Bockius LLP

(57) ABSTRACT

An organic electric element, a display panel and a display device including the organic electric element are provided. The organic electric element includes a first electrode; a second electrode; and an organic layer positioned between the first electrode and the second electrode. The organic layer includes a first layer having a first compound and a second compound, and a emitting layer having a third compound. A specific general formula related to energy levels of the component compounds is satisfied so that they may have excellent efficiency or lifespan.

12 Claims, 6 Drawing Sheets

ORGANIC ELECTRIC ELEMENT, DISPLAY PANEL COMPRISING THE SAME AND DISPLAY DEVICE COMPRISING THE SAME

CROSS REFERENCE TO RELATED APPLICATION

This application claims priority from Korean Patent Application No. 10-2019-0180011, filed on Dec. 31, 2019, which is hereby incorporated by reference for all purposes as if fully set forth herein.

BACKGROUND

Technical Field

Embodiments of the disclosure relate to an organic electric element, a display panel, and a display device including the organic electric element.

Discussion of the Related Art

In general, an organic light emitting phenomenon refers to the phenomenon of converting electrical energy into light energy by means of an organic material. An organic electric element refers to an electric element using the organic light emitting phenomenon.

An organic electric element using the organic light emitting phenomenon may be applied to a display device. Since the portable display device is driven by a battery, which is a limited power source, an organic electric element used in the portable display device requires excellent light emission efficiency. In addition, since the image should be displayed normally during use of the electronic device, a long life of the organic electric element may be also required.

It is necessary to control the energy level of the organic layer of the organic electric element in order to improve the efficiency, lifespan and driving voltage in the organic electric element.

SUMMARY

Accordingly, embodiments of the present disclosure are directed to an organic electric element, a display panel and a display device including the organic electric element that substantially obviates one or more of the problems due to limitations and disadvantages of the related art.

Embodiments may provide an organic electric element having high efficiency or long life.

Embodiments may provide a display panel having high efficiency or long life by including the above-described organic electric element.

Further, embodiments may provide a display device having high efficiency or long life by including the above-described display panel.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an organic electric element comprises a first electrode, a second electrode and an organic layer.

The organic layer is positioned between the first electrode and the second electrode.

The organic layer comprises an emitting layer and a first layer.

The first layer comprises a first compound and a second compound.

The emitting layer comprises a third compound.

The organic electric element satisfies one or more of following general formulas 1 to 3.

$$0.32\ eV \leq L_1 - H_2 \leq 0.8\ eV \quad \text{[general formula 1]}$$

$$0.80\ eV \leq L_1 - H_3 \leq 1.4\ eV \quad \text{[general formula 2]}$$

$$0.40\ eV \leq H_2 - H_3 \leq 0.9\ eV \quad \text{[general formula 3]}$$

In the general formulas 1 to 3, $L_1$ is the LUMO (Lowest Unoccupied Molecular Orbital) energy level of the first compound.

$L_3$ is the LUMO (Lowest Unoccupied Molecular Orbital) energy level of the third compound.

$H_2$ is the HOMO (Highest Occupied Molecular Orbital) energy level of the second compound.

$H_3$ is the HOMO (Highest Occupied Molecular Orbital) energy level of the third compound.

In another aspect, embodiments may provide an organic electric element comprising a first electrode, a second electrode and an organic layer.

The organic layer comprises a first stack comprising a first emitting layer, a second stack comprising a second emitting layer, and a charge generating layer.

The charge generating layer is positioned between the first stack and the second stack.

The charge generating layer comprises a second layer comprising a fourth compound and a fifth compound and a third layer comprising a sixth compound.

The organic electric element satisfies the following general formulas 4 to 6.

$$L_6 - L_4 \leq 2.1\ eV \quad \text{[general formula 4]}$$

$$L_6 - H_5 \leq 2.8\ eV \quad \text{[general formula 5]}$$

$$0.32\ eV \leq L_4 - H_5 \leq 0.8\ eV \quad \text{[general formula 6]}$$

In the general formulas 4 to 6, $L_6$ is the LUMO (Lowest Unoccupied Molecular Orbital) energy level of the sixth compound.

$L_4$ is the LUMO (Lowest Unoccupied Molecular Orbital) energy level of the fourth compound.

$H_5$ is the HOMO (Highest Occupied Molecular Orbital) energy level of the fifth compound.

embodiments may provide a display panel comprising a subpixel comprising the organic electric element.

In another aspect, embodiments may provide a display device comprising the display panel and a driving circuit for driving the display panel.

According to embodiments, it is possible to provide the organic electric device having high luminous efficiency and long life by providing an organic layer including a plurality of layers satisfying a predetermined expression.

According to embodiments, it is possible to provide a display panel including the organic electric device having a high luminous efficiency and long life and a display device comprising the same.

It is to be understood that both the foregoing general description and the following detailed description are exemplary and explanatory and are intended to provide further explanation of the inventive concepts as claimed.

DESCRIPTION OF DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
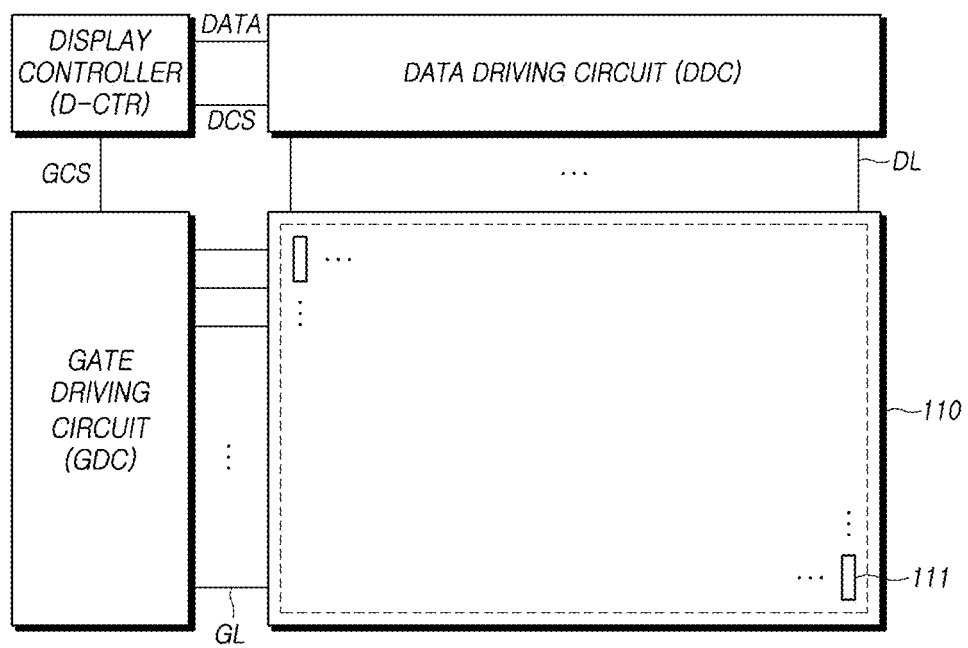
FIG. 1 is a system configuration diagram of a display device according to embodiments.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

In the present specification, the organic electric element may mean a component(s) between an anode and a cathode, or an organic light emitting diode including the anode, the cathode and the component(s) positioned therebetween.

In the present specification, the organic electric element may mean one of an organic electric device, the organic light emitting diode and the panel including the same, and an electronic device including the panel and a circuit. For example, the electronic device includes a display device, a lighting device, a solar cell, a portable or mobile terminal (eg, a smart phone, a tablet, a PDA, an electronic dictionary, a PMP, etc.), a navigation terminal, a game machine, various TVs, and various computers monitor and the like, but is not limited thereto, and may be any type of device as long as the component(s) are included.

Hereinafter, exemplary embodiments of the present disclosure will be described in detail with reference to the accompanying drawings.

FIG. 1 is a system configuration diagram of a display device according to embodiments.

Referring to FIG. 1, the display device 100 in accordance with embodiments of the present disclosure includes a display panel 110 in which a plurality of data lines DL and a plurality of gate lines GL are arranged and a plurality of sub-pixels 111 defined by the plurality of data lines DL and the plurality of gate lines GL is arranged, a data driving circuit DDC (or a data driver) for driving the plurality of data lines DL, a gate driving circuit GDC (or a gate driver) for driving the plurality of gate lines GL, a controller D-CTR controlling the data driving circuit DDC and the gate driving circuit GDC, and the like.

The controller D-CTR controls operations of the data driving circuit DDC and the gate driving circuit GDC by supplying respective control signals (DCS, GCS) to the data driving circuit DDC and the gate driving circuit GDC.

The controller D-CTR starts the scan of pixels according to timings processed in each frame, converts image data inputted from other devices or other image providing sources to be adapted to a data signal form used in the data driving circuit DDC and then outputs image data DATA resulted from the converting, and causes the data to be loaded into the pixels at a pre-configured time according to the scan.

The controller D-CTR may be implemented as a separate component from the data driving circuit DDC or may be integrated with data driving circuit DDC so the controller D-CTR can be implemented as an integrated circuit.

The data driving circuit DDC drives the plurality of data lines DL by providing data voltages corresponding to image data DATA received from the controller D-CTR to the data lines DL. Here, the data driving circuit DDC is sometimes referred to as a source driving circuit or a source driver.

The data driving circuit DDC may include at least one source driver integrated circuit SDIC to be implemented.

Each source driver integrated circuit SDIC may include a shift register, a latch circuit, a digital to analog converter DAC, an output buffer, and/or the like.

In some instances, each source driver integrated circuit SDIC may further include one or more analog to digital converters ADC.

The gate driving circuit GDC sequentially drives a plurality of gate lines GL by sequentially providing scan signals to the plurality of gate lines GL. Here, the gate driving circuit GDC is sometimes referred to as a scan driving circuit or a scan driver.

The gate driving circuit GDC may include at least one gate driver integrated circuit GDIC to be implemented.

Each gate driver integrated circuit GDIC may include a shift register, a level shifter, and/or the like.

Each gate driver integrated circuit GDIC may be connected to a bonding pad of the display panel 110 in a tape automated bonding (TAB) type or a chip on glass (COG) type, or be directly disposed on the display panel 110 as being implemented in a gate in panel (GIP) type. In some instances, the gate driver integrated circuit GDIC may be disposed to be integrated with the display panel 110. Further, each gate driver integrated circuit GDIC may be implemented in a chip on film (COF) type in which the gate driver integrated circuit GDIC is mounted on a film connected with the display panel 110.

According to the controlling of the controller D-CTR, the gate driving circuit GDC sequentially provides scan signals of an on-voltage or an off-voltage to the plurality of gate lines GL.

When a specific gate line is asserted by a scan signal from the gate driving circuit GDC, the data driving circuit DDC converts image data DATA received from the controller D-CTR into analog data voltages and provides the obtained analog data voltages to the plurality of data lines DL.

The data driving circuit DDC may be located on, but not limited to, only one side (e.g., an upper side or a lower side) of the display panel 110, or in some instances, be located on, but not limited to, two sides (e.g., the upper side and the lower side) of the display panel 110 according to driving schemes, panel design schemes, or the like.

The gate driving circuit GDC may be located on, but not limited to, only one side (e.g., a left side or a right side) of the panel 110, or in some instances, be located on, but not limited to, two sides (e.g., the left side and the right side) of the display panel 110 according to driving schemes, panel design schemes, or the like.

The display device 100 according to embodiments of the present disclosure may be one of various types of display devices, such as, a liquid crystal display device, an organic light emitting display device, a plasma display device, or the like.

In case the display device 100 according to embodiments of the present disclosure is an organic light emitting display device, each sub-pixel 111 arranged in the display panel 110 may include circuit components, such as an organic light emitting diode (OLED), which is a self-emissive element, a driving transistor for driving the organic light emitting diode OLED, and the like.

Types of circuit elements and the number of the circuit elements included in each subpixel 111 may be different depending on types of the panel (e.g., an LCD panel, an OLED panel, etc.), provided functions, design schemes/features, or the like.

Figure 2:
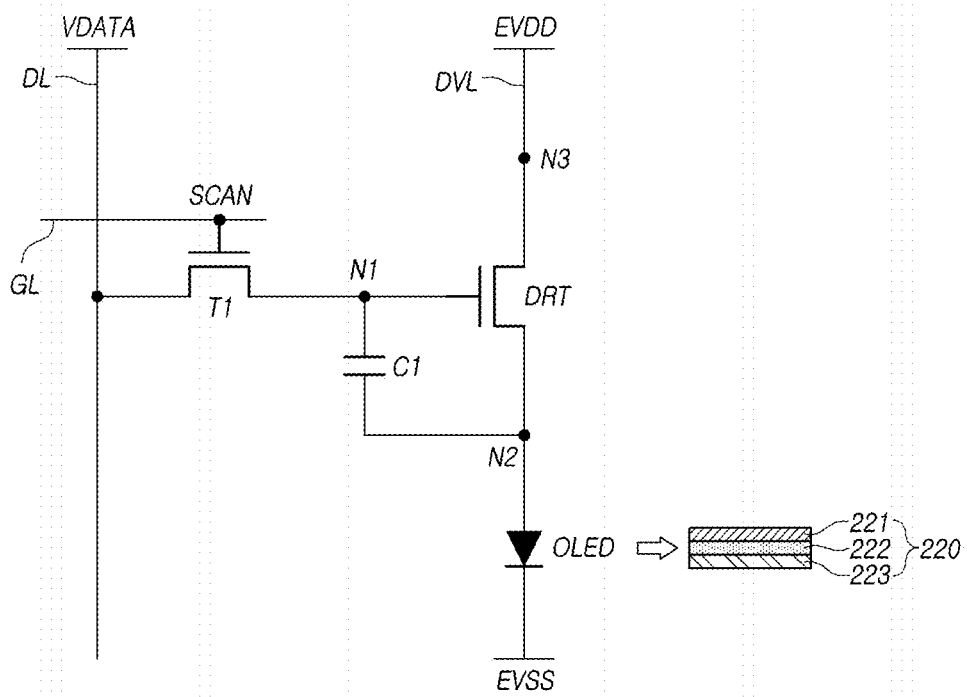
FIG. 2 is a view illustrating a subpixel circuit of a display panel according to embodiments.

FIG. 2 is a view illustrating a subpixel circuit of a display panel according to embodiments.

Referring to FIG. 2, each subpixel 111 may include an organic light emitting diode OLED and a driving transistor DRT for driving the organic light emitting diode OLED as basic circuit components.

Referring to FIG. 2, each sub-pixel 111 may further include a first transistor T1 allowing a data voltage VDATA to be applied to a first node N1 corresponding to a gate node of the driving transistor DRT, and a storage capacitor C1 for remaining a data voltage VDATA corresponding to an image signal voltage or a voltage corresponding to this during one frame time.

The organic light emitting diode OLED may include a first electrode 221 (an anode electrode or a cathode electrode), a light emitting layer 222, a second electrode 223 (the cathode electrode or the anode electrode), and the like.

In one embodiment, a low-level voltage EVSS may be applied to the second electrode 223 of the organic light emitting diode OLED.

The driving transistor DRT causes the organic light emitting diode OLED to be driven by providing a driving current to the organic light emitting diode OLED.

The driving transistor DRT includes a first node N1, a second node N2 and a third node N3.

The first node N1 of the driving transistor DRT may be a node corresponding to the gate node thereof, and may be electrically connected to a source node or a drain node of the first transistor T1.

The second node N2 of the driving transistor DRT may be electrically connected to the first electrode 221 of the organic light emitting diode OLED and may be a source node or a drain node.

The third node N3 of the driving transistor DRT may be the drain node or the source node as a node to which a driving voltage EVDD is applied, and may be electrically connected to a driving voltage line DVL used to supply a driving voltage EVDD.

The first transistor T1 may be electrically connected between a data line DL and the first node N1 of the driving transistor DRT and may be controlled by a scan signal SCAN that is provided through a gate line and applied to the gate node of the first transistor T1.

The storage capacitor C1 may be electrically connected between the first node N1 and the second node N2 of the driving transistor DRT.

The storage capacitor C1 is an external capacitor intentionally designed to be located outside of the driving transistor DRT, not an internal storage, such as a parasitic capacitor (e.g., a Cgs, a Cgd) that presents between the first node N1 and the second node N2 of the driving transistor DRT.

Figure 3:
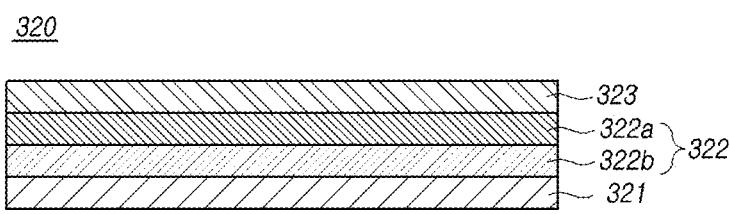
FIG. 3 is a schematic cross-sectional view of an organic electric device according to embodiments.

FIG. 3 is a cross-sectional view of a display device according to the embodiments.

Referring to FIG. 3, an organic electric element 320 according to the embodiments includes a first electrode 321 and a second electrode 323, an organic layer 322 positioned therebetween.

The first electrode 321 may be an anode and the second electrode 323 may be a cathode. In the case of an inverted type, the first electrode 321 may be a cathode and the second electrode 323 may be an anode.

For example, the first electrode 321 may be a transparent electrode, and the second electrode 323 may be a reflective electrode. In another example, the first electrode 321 may be a reflective electrode, and the second electrode 323 may be a transparent electrode.

The organic layer 322 may include a plurality of layers which is located between the first electrode 321 and the second electrode 323 and includes an organic material.

The organic layer 322 includes a light emitting layer 322a and a first layer 322b.

Since the organic layer 322 includes at least one light emitting layer 322a, for example, the organic electric element 320 according to embodiments may be a single type organic electric device including one light emitting layer, and may be a tandem organic electric element comprising a plurality of light emitting layers. When the organic electric element 320 includes a plurality of the light emitting layers, the plurality of the light emitting layers may be made of the same material, but may be made of different materials from each other.

The emitting layer 322a is a layer in which energy generated when electrons and holes recombine to emit light. For example, the emitting layer 322a includes a host material and a dopant, and the third compound may be either a host or a dopant.

The first layer 322b may be positioned between the emitting layer 322a and the first electrode 321. In this example, the first electrode 321 is an anode electrode, and the first layer 322b may be one of a charge generating layer, a hole transport layer, and a hole injection layer. When the first layer 322b is positioned between the light emitting layer 322a and the first electrode 321, the organic electric element may have high efficiency or long life.

The first layer 322b includes a first compound and a second compound. The first layer 322b may be one layer including the first compound and the second compound, or may be composed of a plurality of layers each containing one or more of the first compound and the second compound. For example, the first layer 322b may include a first compound layer including the first compound and a second compound layer including the second compound. In FIG. 3, the first layer 322b is illustrated as one layer, but the first layer 322b of the embodiments is not limited to a single layer structure.

Although not illustrated in FIG. 3, the organic electric element 320 may further at least one of a hole injection layer, a hole transport layer, an electron transport layer, and an electron injection layer.

The organic electric element 320 includes the hole injection layer, and the first layer 322b may be the hole injection layer. For example, the first layer 322b may be a hole injection layer, the first compound may be a p-type dopant, and the second compound may be a p-type host.

In addition, the organic electric element 320 includes the hole transport layer. The hole transport layer may be positioned between the light emitting layer 322a and the first electrode 321 as an anode, while located between the first layer 322b as the hole injection layer and the light emitting layer 322a. The electron injection layer may be positioned between the second electrode 323 as a cathode electrode and the light emitting layer 322a. The electron transport layer may be positioned between the second electrode 323 as a cathode electrode and the light emitting layer 322a, while located between the light emitting layer 322a and the electron injection layer. In examples including the hole injection layer, the first layer 322b may be the hole injection layer.

The organic electric element satisfies the following general formulas 1 to 3.

$$0.32 \text{ eV} \leq L_1 - H_2 \leq 0.8 \text{ eV} \quad \text{[general formula 1]}$$

$$0.80 \text{ eV} \leq L_1 - H_3 \leq 1.4 \text{ eV} \quad \text{[general formula 2]}$$

$$0.40 \text{ eV} \leq H_2 - H_3 \leq 0.9 \text{ eV} \quad \text{[general formula 3]}$$

The general formulas 1 to 3 will be described.

$L_1$ is the LUMO (Lowest Unoccupied Molecular Orbital) energy level of the first compound.

$L_3$ is the LUMO (Lowest Unoccupied Molecular Orbital) energy level of the third compound, and $H_2$ is the HOMO (Highest Occupied Molecular Orbital) energy level of the second compound.

$H_3$ is the HOMO (Highest Occupied Molecular Orbital) energy level of the third compound.

The upper limit of $L_1-H_2$ defined in the general formula 1 may be o.7 eV or less or 0.6 eV or less.

The upper limit of $L_1-H_3$ defined in the general formula 2 may be 1.2 eV or less or 1.0 eV or less.

The upper limit of $H_2-H_3$ defined in the general formula 3 may be o.6 eV or less or 0.5 eV or less.

The organic electric device 320 satisfies one or more of the general formulas 1 to 3 so that it may have a high efficiency or long life.

The organic electric device 320 satisfies all of the general formulas 1 to 3 so that it may have a higher efficiency or longer life.

The thickness of the first layer 322b is not particularly limited, but may be, for example, 50 Å to 500 Å.

The thickness of the second layer 326b is not particularly limited, but may be, for example, 50 Å to 500 Å.

Figure 4:
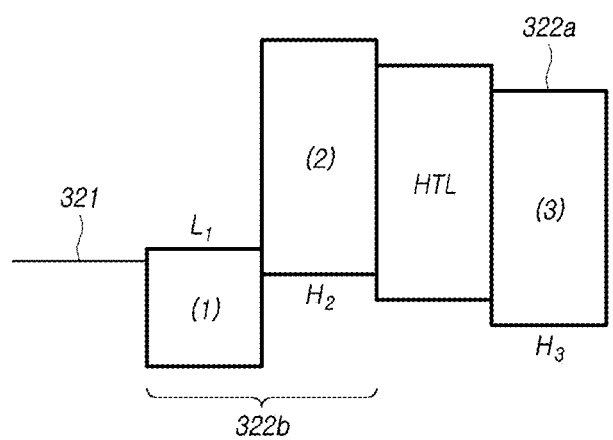
FIG. 4 is a view for explaining the energy level of the layers included in the organic layer of the organic electric element according to embodiments.

FIG. 4 is a view for explaining the energy level of the layers included in the organic layer of the organic electric element according to embodiments.

Referring to FIG. 4, the LUMO (Lowest Unoccupied Molecular Orbital) energy level $L_1$ of the first compound (1) included in the first layer 322b may be higher than the HOMO (Highest Occupied Molecular Orbital) energy level $H_2$ of the second compound (2). In this example, the first compound (1) and the second compound (2) included in the first layer 322b may satisfy the general formula 1. When the organic electric element 320 satisfies the general formula 1, the organic electric element 320 may have excellent efficiency or long life.

The LUMO energy level $L_1$ of the first compound 1 included in the first layer 322b may be higher than the HOMO energy level $H_3$ of the third compound (3) included in the light emitting layer 322a. In this example, the first compound (1) included in the first layer 322b and the third compound (3) included in the light emitting layer 322a may satisfy the general formula 2. When the organic electric element 320 satisfies the general formula 2, the organic electric element 320 may have excellent efficiency or long life.

The HOMO energy level $H_2$ of the second compound (2) included in the first layer 322b may be higher than the HOMO energy level $H_3$ of the third compound (3) included in the light emitting layer 322a. In this example, the second compound (2) included in the first layer 322b and the third compound (3) included in the light emitting layer 322a may satisfy the general formula 3. When the organic electric element 320 satisfies the general formula (3), the organic electric element 320 may have excellent efficiency or long life.

The organic electric element 320 may include the hole transport layer (HTL). The hole transport layer HTL may be located between the first layer 322b and the light emitting layer 322a. In addition, the hole transport layer (HTL) includes a hole transport material having a HOMO energy level lower than the HOMO energy level ($H_2$) of the second compound (2) while being higher than the HOMO energy level ($H_3$) of the third compound (3).

The first compound is represented by one or more of the following chemical formula 1 and chemical formula 2.

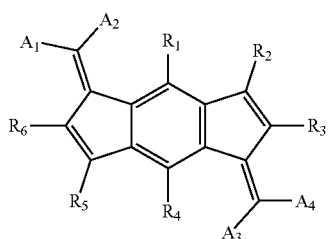

[chemical formula 1]

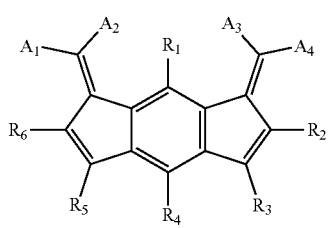

[chemical formula 2]

Hereinafter, chemical formula 1 and chemical formula 2 will be described.

$R_1$ to $R_6$, which are same or different, are each independently one selected from the group consisting of a hydrogen; a deuterium; a tritium; a halogen; a cyano group; a nitro group; a $C_6$-$C_{60}$ aryl group; a fluorenyl group; a $C_2$-$C_{60}$ hetero ring group containing at least one hetero atom from O, N, S, Si and P; a fused ring group of a $C_3$-$C_{60}$ aliphatic ring and a $C_6$-$C_{60}$ aromatic ring; a $C_1$-$C_{50}$ alkyl group; a $C_2$-$C_{20}$ alkenyl group; a $C_2$-$C_{20}$ alkynyl group; a $C_1$-$C_{30}$ alkoxy group; a $C_6$-$C_{30}$ aryloxy group; a $C_3$-$C_{60}$ alkylsilyl group; a $C_{18}$-$C_{60}$ arylsilyl group; and a $C_8$-$C_{60}$ alkylarylsilyl group, and one or more of $R_1$ to $R_6$ is the cyano group.

When $R_1$ to $R_6$ are the aryl groups, they may be each independently a $C_6$-$C_{60}$ aryl group, a $C_6$-$C_{30}$ aryl group or a $C_6$-$C_{12}$ aryl group.

$A_1$ to $A_4$, which may be the same or different, are each independently one selected from the group consisting of a hydrogen; a deuterium; a tritium; a halogen; a cyano group; a nitro group; a $C_6$-$C_{60}$ aryl group; a fluorenyl group; a $C_2$-$C_{60}$ hetero ring group containing at least one hetero atom from O, N, S, Si and P; a fused ring group of a $C_3$-$C_{60}$ aliphatic ring and a $C_6$-$C_{60}$ aromatic ring; a $C_1$-$C_{50}$ alkyl group; a $C_2$-$C_{20}$ alkenyl group; a $C_2$-$C_{20}$ alkynyl group; a $C_1$-$C_{30}$ alkoxy group; a $C_6$-$C_{30}$ aryloxy group; a $C_3$-$C_{60}$ alkylsilyl group; a $C_{18}$-$C_{60}$ arylsilyl group; and a $C_8$-$C_{60}$ alkylarylsilyl group.

In $R_1$ to $R_6$ and $A_1$ to $A_4$ of the chemical formula 1 and the chemical formula 2, the aryl group, the fluorenyl group, the hetero ring group, the fused ring group, the alkyl group, the alkenyl group, the alkynyl group, the alkoxy group, the aryloxy group, the alkylsilyl group, the arylsilyl group and the alkylarylsilyl group may each be further substituted with at least one substituent selected from the group consisting of a deuterium; a nitro group; a cyano group; a halogen; an amino group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{20}$ aryl group; a $C_6$-$C_{20}$ aryl group substituted with the deuterium; a fluorenyl group; a $C_2$-$C_{20}$ hetero ring group; a $C_3$-$C_{60}$ alkylsilyl group; a $C_{18}$-$C_{60}$ arylsilyl group; and a $C_8$-$C_{60}$ alkylarylsilyl group.

When the first compound is represented by one or more of the chemical formula 1 and the chemical formula 2, for example, the first layer includes one compound (A) represented by chemical formula 1 and one compound (B) represented by chemical formula 2, it means that all the two compounds (A, B) are included in the first compound.

When the first layer 322b includes the first compound represented by one or more of the chemical formula 1 and the chemical formula 2, the organic electric device 320 satisfies one or more of the general formulas 1 to 3 so that it may have a high efficiency or long life.

The first chemical compound is represented by one or more of the following chemical formula 3 and chemical formula 4.

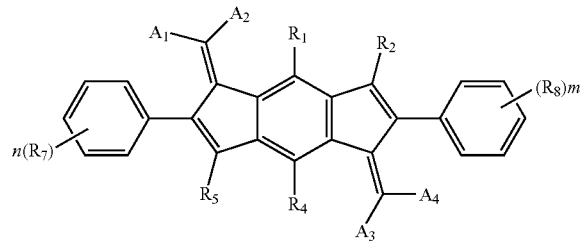

[chemical formula 3]

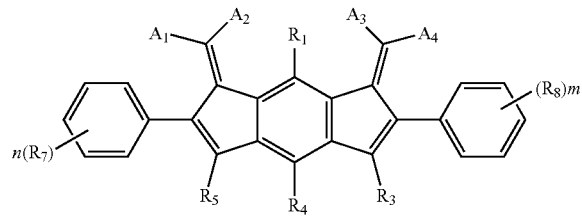

[chemical formula 4]

Hereafter, the chemical formula 3 and the chemical formula 4 will be described.

n and m are each independently an integer from 0 to 5.

$R_7$ to $R_8$, which may be the same or different, are each independently one selected from the group consisting of a deuterium; a tritium; a halogen; a cyano group; a $C_1$-$C_{50}$ alkyl group; and a $C_1$-$C_{30}$ alkoxy group.

When $R_7$ and $R_8$ are alkoxy groups, they may be, for example, a $C_1$-$C_{30}$ alkoxy group, a $C_1$-$C_{20}$ alkoxy group or a $C_1$-$C_{10}$ alkoxy group.

In $R_7$ and $R_8$ of the chemical formula 3 and the chemical formula 4, the alkyl group and the alkoxy group may each be further substituted with at least one substituent selected from the group consisting of a deuterium and a halogen.

When the first compound is represented by one or more of the chemical formula 3 and the chemical formula 4, for example, the first layer includes one compound (C) represented by chemical formula 5 and one compound (D) represented by chemical formula 6, it means that all the two compounds (C, D) are included in the first compound.

When the first layer 322a includes the first compound represented by one or more of the above chemical formulas 3 and 4, the organic electric device 320 satisfies one or more of the general formulas 1 to 3 so that it may have a high efficiency or long life.

The first chemical compound is represented by one or more of the following chemical formula 5 and formula 6.

[chemical formula 5]

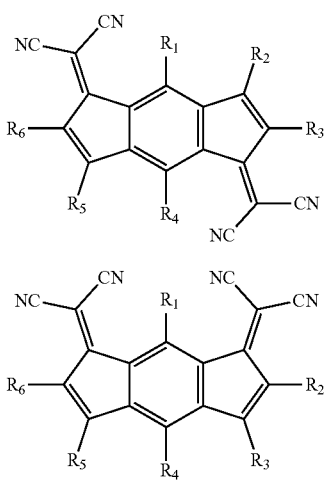

[chemical formula 6]

The chemical formula 5 and the chemical formula 6 will be described.

$R_1$ to $R_6$, which are same or different, are each independently one selected from the group consisting of a hydrogen; a deuterium; a tritium; a halogen; a cyano group; a nitro group; a $C_6$-$C_{60}$ aryl group; a fluorenyl group; a $C_2$-$C_{60}$ hetero ring group containing at least one hetero atom from O, N, S, Si and P; a fused ring group of a $C_3$-$C_{60}$ aliphatic ring and a $C_6$-$C_{60}$ aromatic ring; a $C_1$-$C_{50}$ alkyl group; a $C_2$-$C_{20}$ alkenyl group; a $C_2$-$C_{20}$ alkynyl group; a $C_1$-$C_{30}$ alkoxy group; a $C_6$-$C_{30}$ aryloxy group; a $C_3$-$C_{60}$ alkylsilyl group; a $C_{18}$-$C_{60}$ arylsilyl group; and a $C_8$-$C_{60}$ alkylarylsilyl group, and one or more of $R_1$ to $R_6$ is the cyano group.

When $R_1$ to $R_6$ are the aryl groups, they may be each independently a $C_6$-$C_{60}$ aryl group, a $C_6$-$C_{30}$ aryl group or a $C_6$-$C_{12}$ aryl group.

In $R_1$ to $R_6$ of the chemical formula 5 and the chemical formula 6, the aryl group, the fluorenyl group, the hetero ring group, the fused ring group, the alkyl group, the alkenyl group, the alkynyl group, the alkoxy group, the aryloxy group, the alkylsilyl group, the arylsilyl group and the alkylarylsilyl group may each be further substituted with at least one substituent selected from the group consisting of a deuterium; a nitro group; a cyano group; a halogen; an amino group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{20}$ aryl group; a $C_6$-$C_{20}$ aryl group substituted with the deuterium; a fluorenyl group; a $C_2$-$C_{20}$ hetero ring group; a $C_3$-$C_{60}$ alkylsilyl group; a $C_{18}$-$C_{60}$ arylsilyl group; and a $C_8$-$C_{60}$ alkylarylsilyl group.

When the first compound is represented by one or more of the chemical formula 5 and the chemical formula 6, for example, the first layer includes one compound (E) represented by chemical formula 7 and one compound (F) represented by chemical formula 8, it means that all the two compounds (E, F) are included in the first compound.

When the first layer 326a includes the first compound represented by one or more of the above chemical formulas 5 and 6, the organic electric device 320 satisfies one or more of the general formulas 1 to 3 so that it may have a high efficiency or long life.

The first chemical compound may be one or more of the following chemical compounds.

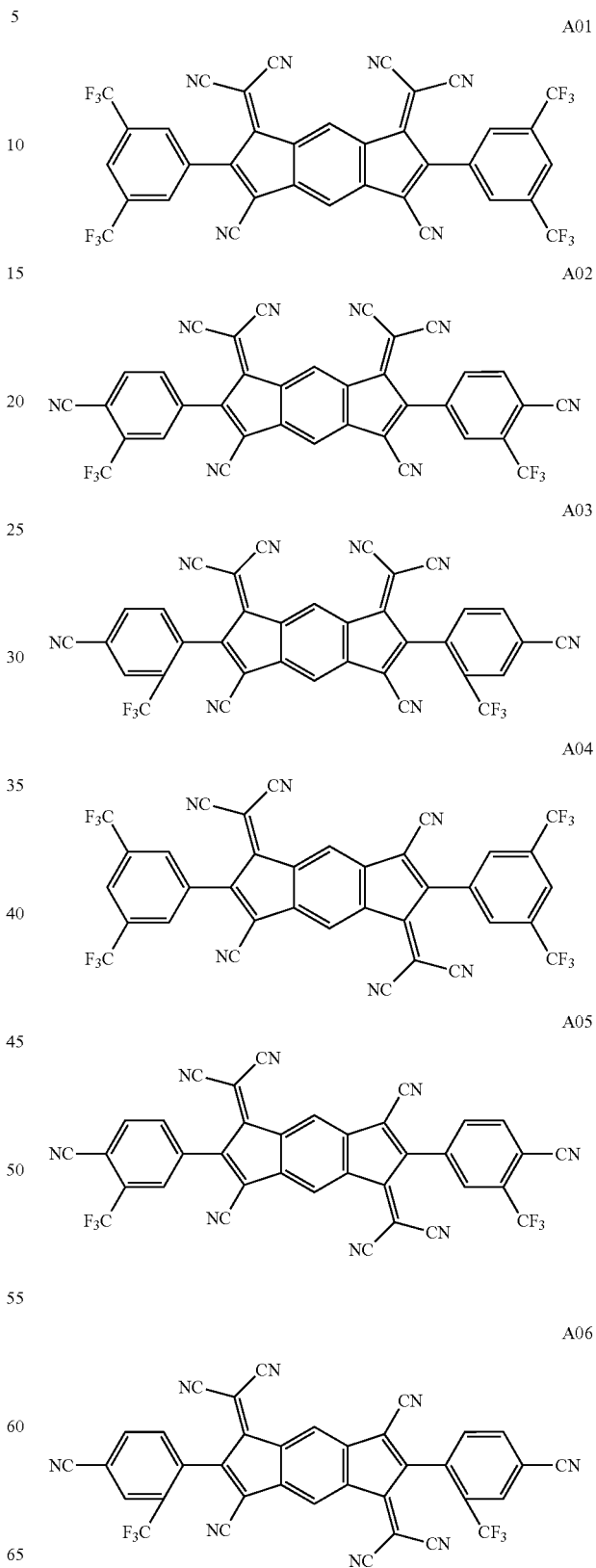

-continued
A07
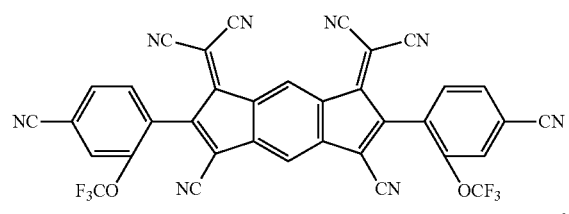
A08
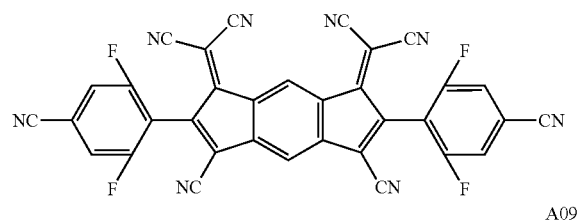
A09
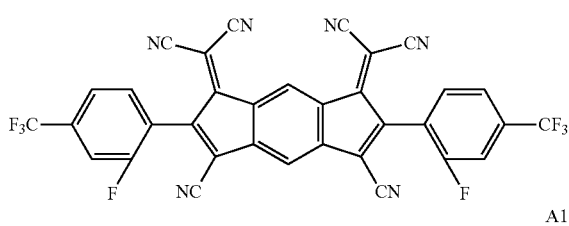
A10
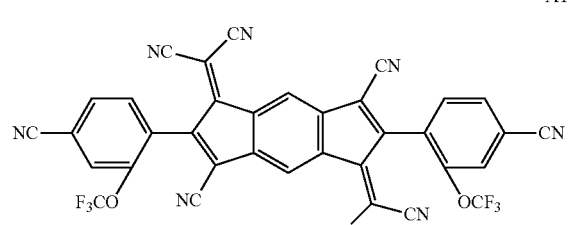
A11
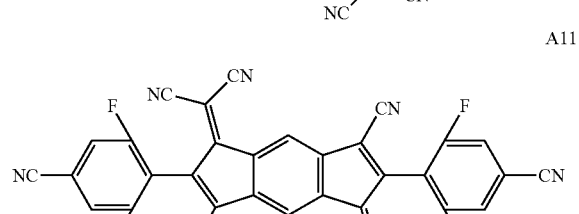
A12
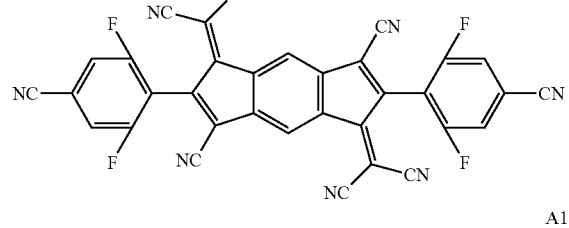
A13
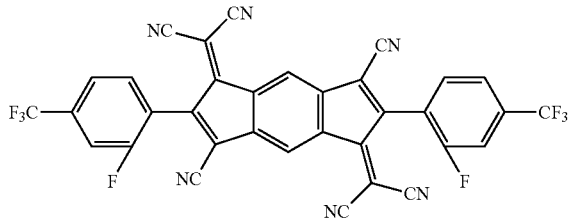
-continued
A14
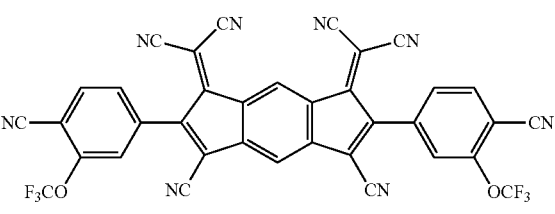
A15
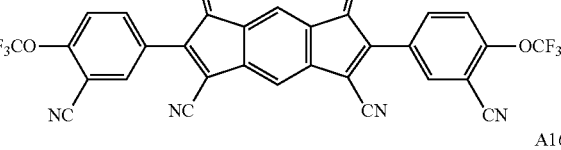
A16
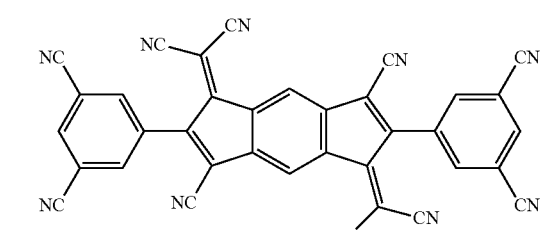
A17
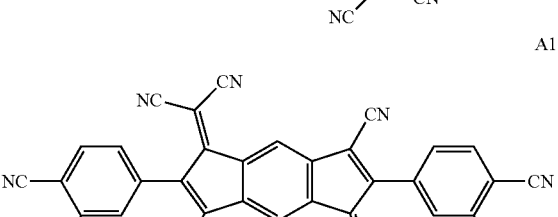
A18
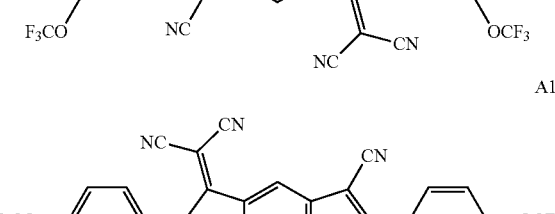
A19
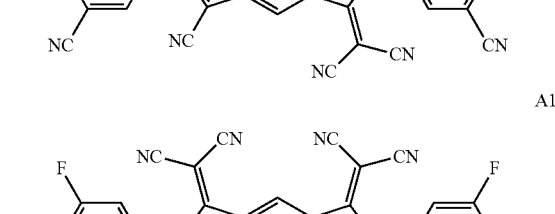
A20
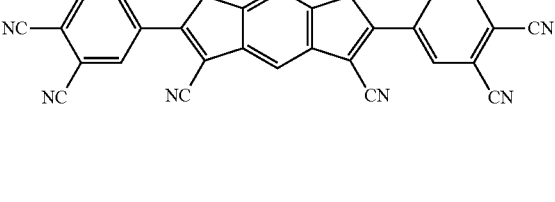

-continued
A21
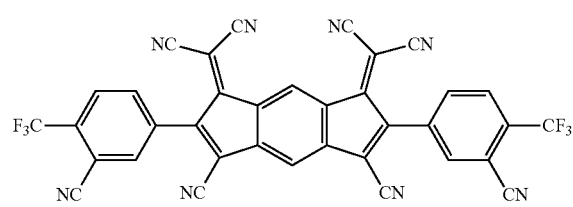
A22
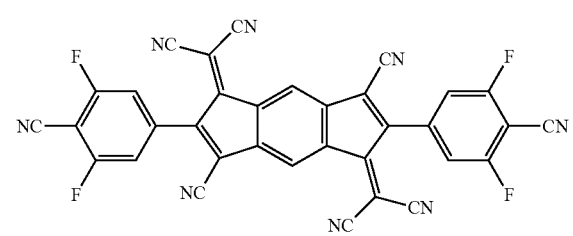
A23
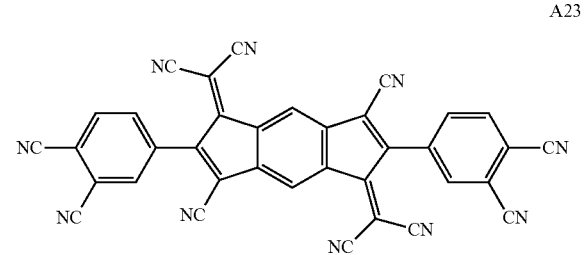
A24
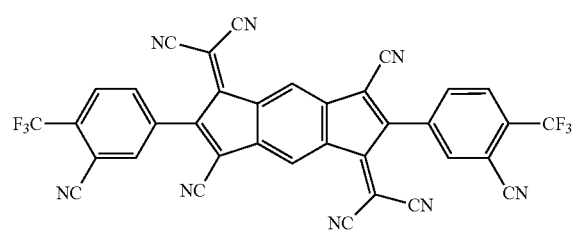
A25
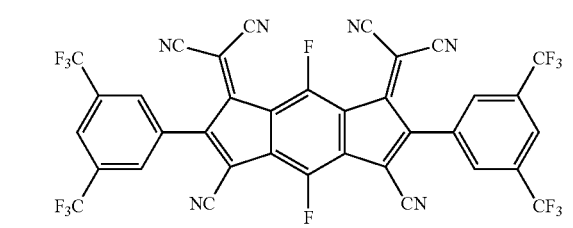
A26
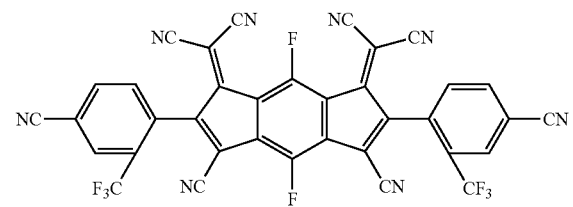
-continued
A27
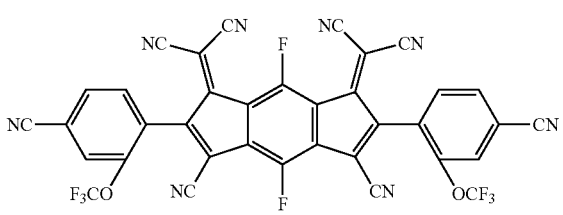
A28
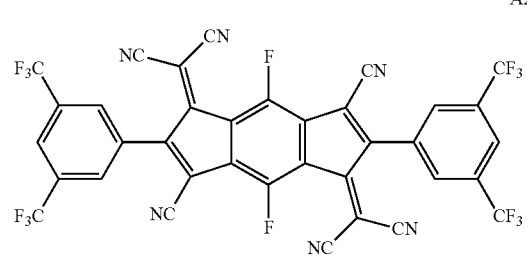
A29
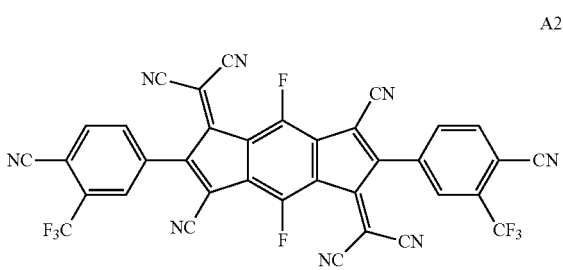
A30
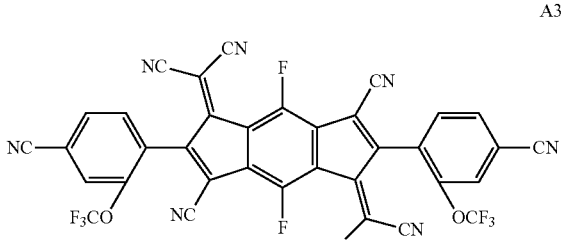
A31
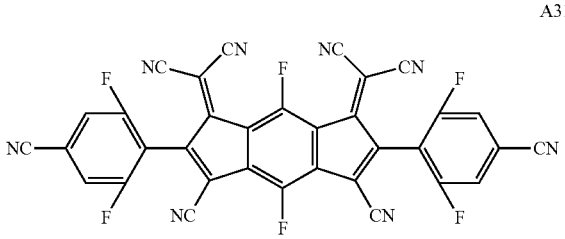
A32
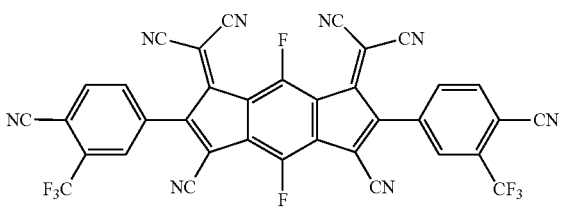

A33
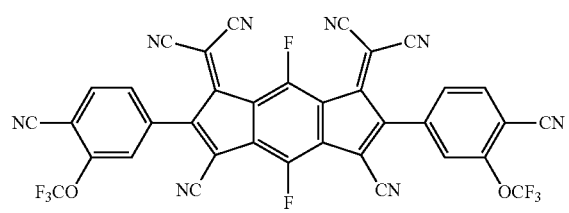
A34
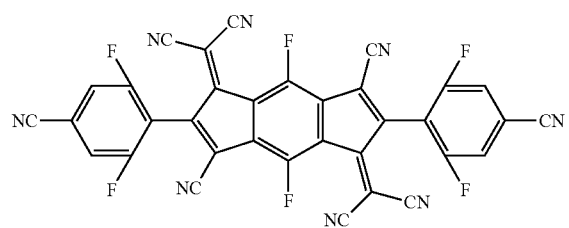
A35
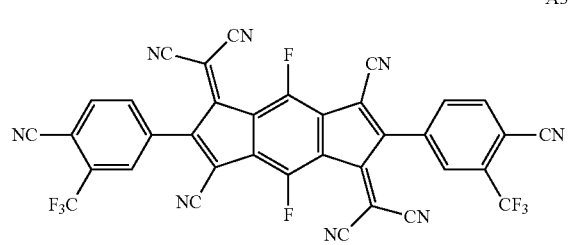
A36
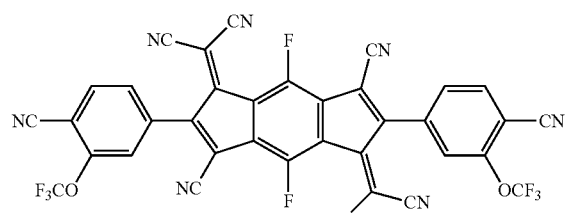
A37
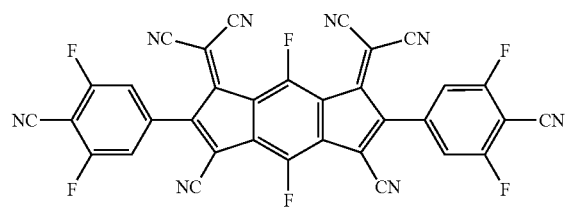
A38
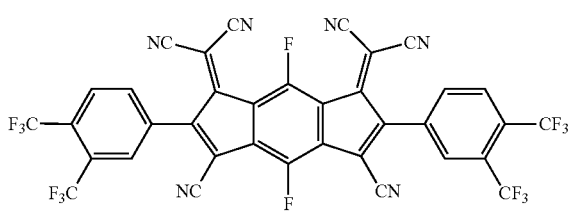
A39
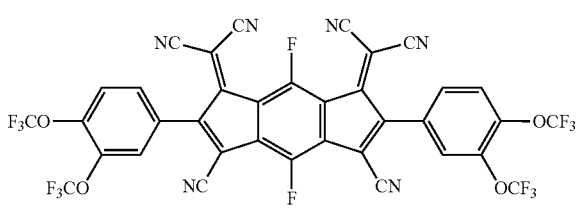
A40
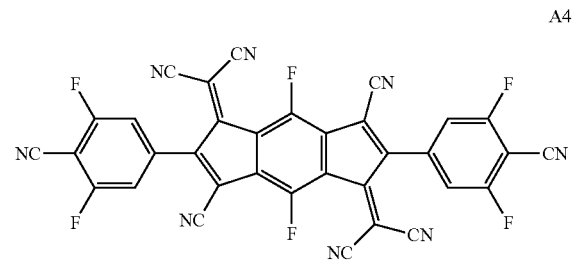
A41
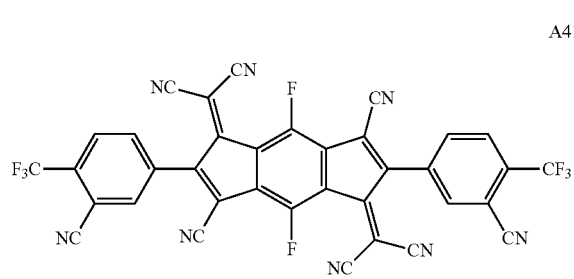
A42
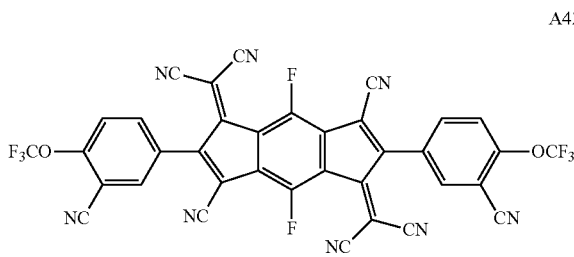
A43
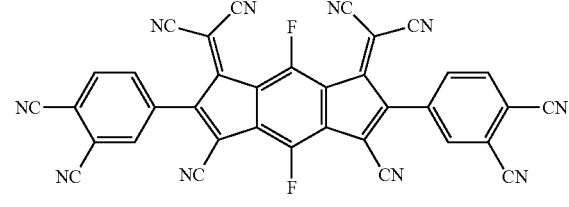
A44
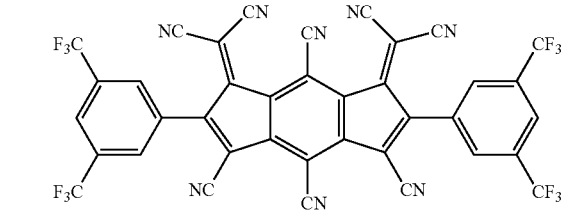

A45

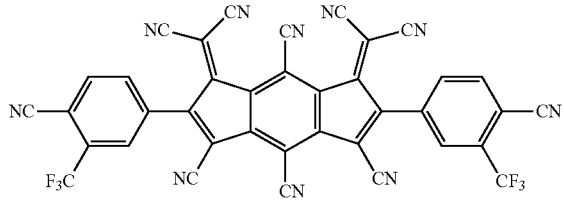

A46

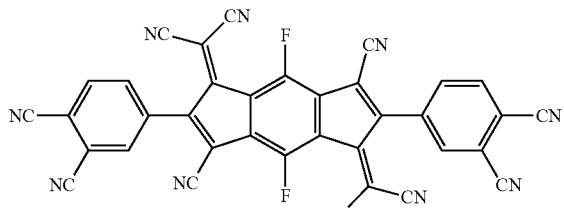

A47

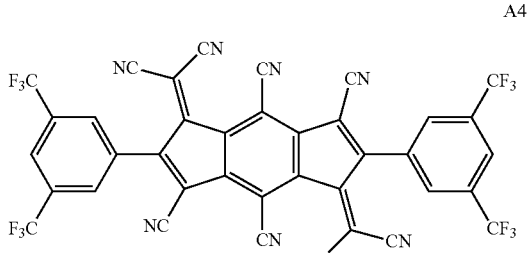

A48

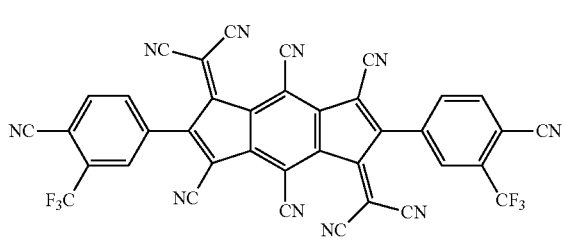

When the first layer 322a includes the first compound represented by one or more of the above chemical compound, the organic electric element 320 may have high efficiency or long life.

The second compound is represented by the following chemical formula 7.

[chemical formula 7]

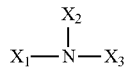

Hereinafter, chemical formula 7 will be described.

$X_1$ to $X_3$, which may be the same or different, are each independently one selected from the group consisting of a $C_6$-$C_{60}$ aryl group; a fluorenyl group; a $C_2$-$C_{60}$ hetero ring group containing at least one hetero atom from O, N, S, Si and P; a fused ring group of a $C_3$-$C_{60}$ aliphatic ring and a $C_6$-$C_{60}$ aromatic ring, or is represented by one of the following formulas 7-1 to 7-5.

In $X_1$ to $X_3$ of the chemical formula 7, the aryl group, the fluorenyl group, the hetero ring group, and the fused ring group may each be further substituted with at least one substituent selected from the group consisting of a deuterium; a nitro group; a cyano group; a halogen; an amino group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{20}$ aryl group; a $C_6$-$C_{20}$ aryl group substituted with the deuterium; a fluorenyl group; a $C_2$-$C_{20}$ hetero ring group; a $C_3$-$C_{60}$ alkylsilyl group; a $C_{18}$-$C_{60}$ arylsilyl group; and a $C_8$-$C_{60}$ alkylarylsilyl group.

[chemical formula 7-1]

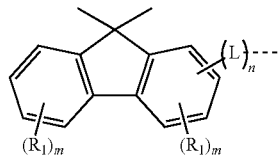

[chemical formula 7-2]

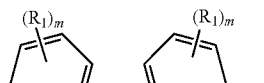

[chemical formula 7-3]

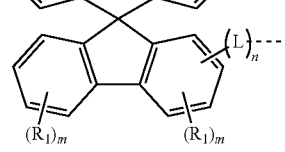

[chemical formula 7-4]

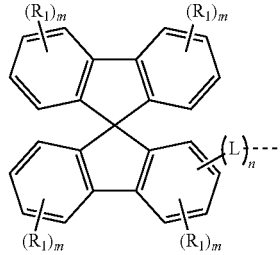

[chemical formula 7-5]

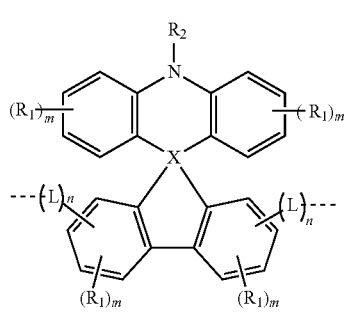

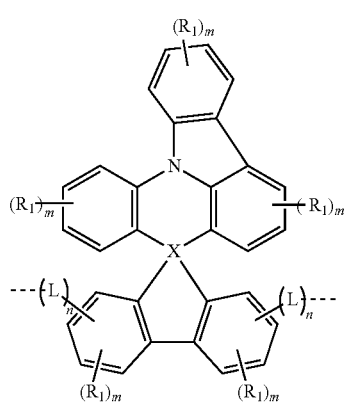

Hereinafter, the chemical formulas 7-1 to 7-5 will be described.

m and n are each independently an integer of 0 to 3.

$R_1$ is each independently one selected from the group consisting of a hydrogen; a deuterium; a tritium; a halogen; a cyano group; a nitro group; a $C_6$-$C_{60}$ aryl group; a fluorenyl group; a $C_2$-$C_{60}$ hetero ring group containing at least one hetero atom from O, N, S, Si and P; a fused ring group of a $C_3$-$C_{60}$ aliphatic ring and a $C_6$-$C_{60}$ aromatic ring; a $C_1$-$C_{50}$ alkyl group; a $C_2$-$C_{20}$ alkenyl group; a $C_2$-$C_{20}$ alkynyl group; a $C_1$-$C_{30}$ alkoxy group; a $C_6$-$C_{30}$ aryloxy group; a $C_3$-$C_{60}$ alkylsilyl group; a $C_{18}$-$C_{60}$ arylsilyl group; and a $C_8$-$C_{60}$ alkylarylsilyl group.

When $R_1$ is the aryl groups, it may be each independently a $C_6$-$C_{60}$ aryl group, a $C_6$-$C_{30}$ aryl group or a $C_6$-$C_{12}$ aryl group.

When $R_1$ is the alkyl group, it may be each independently a $C_1$-$C_{30}$ alkyl group, a $C_6$-$C_{20}$ alkyl group or a $C_6$-$C_{12}$ alkyl group.

L is one selected from the group consisting of a $C_6$-$C_{60}$ arylene group; a fluorylene group; a $C_2$-$C_{60}$ divalent hetero ring group containing at least one heteroatom from O, N, S, Si and P; a divalent fused ring group of a $C_3$-$C_{60}$ aliphatic ring and a $C_6$-$C_{60}$ aromatic ring.

In the chemical formulas 7-1 to 7-5, a portion of a broken line connected to L represents a position where $X_1$ to $X_3$ are bonded to N in the chemical formula 7, or a position where the hydrogen is bonded. For example, in the chemical formulas 7-1 to 7-3, the portion of the broken line connected to L may be a position to be bonded to N of the chemical formula 7. In the case of the chemical formulas 7-4 and 7-5, any one of the broken lines may be bonded to N of the chemical formula 7, and the other one of the broken lines may be bonded to the hydrogen.

In $R_1$ and L of the chemical formulas 7-1 to 7-5, the aryl group, the fluorenyl group, the hetero ring group, the fused ring group, the alkyl group, the alkenyl group, the alkynyl group, the alkoxy group, the aryloxy group, the alkylsilyl group, the arylsilyl group, the alkylarylsilyl group, the arylene group, the fluorylene group, the divalent fused ring group, the divalent fused ring group may each be further substituted with at least one substituent selected from the group consisting of a deuterium; a nitro group; a cyano group; a halogen; an amino group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{20}$ aryl group; a $C_6$-$C_{20}$ aryl group substituted with the deuterium; a fluorenyl group; a $C_2$-$C_{20}$ hetero ring group; a $C_3$-$C_{60}$ alkylsilyl group; a $C_{18}$-$C_{60}$ arylsilyl group; and a $C_8$-$C_{60}$ alkylarylsilyl group.

Since the organic electric element 320 includes the first layer 322a including the first compound and the second compound, it satisfies one or more of the general formulas 1 to 3 so that it may have a high efficiency or long life.

The second chemical compound may be one or more of the following chemical compounds.

D01

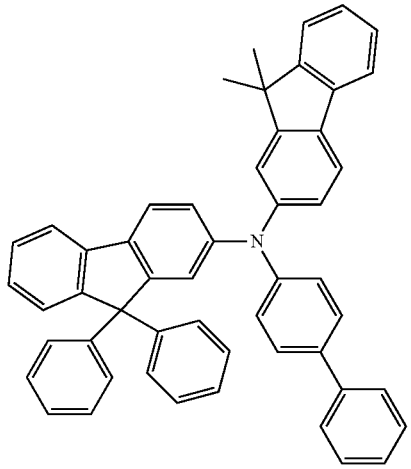

D02

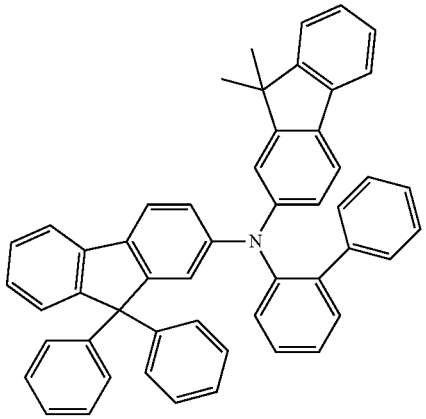

D03

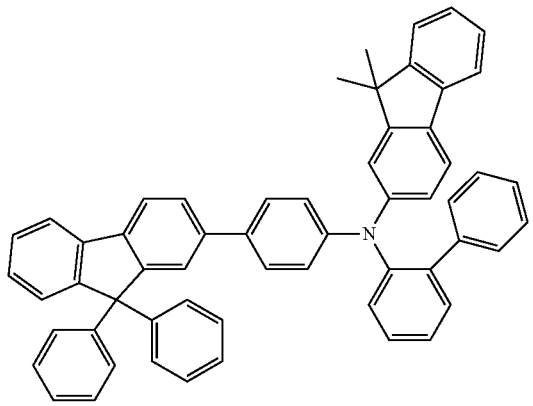

D04

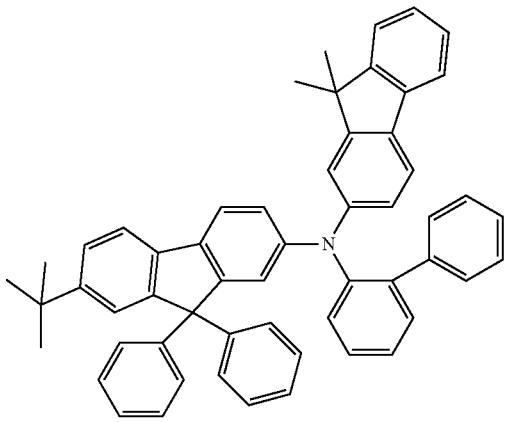

-continued
D05
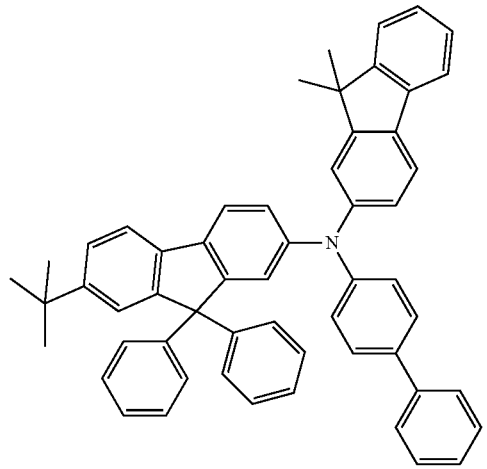
D06
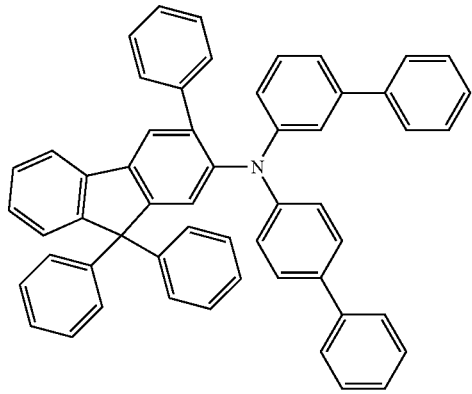
D07
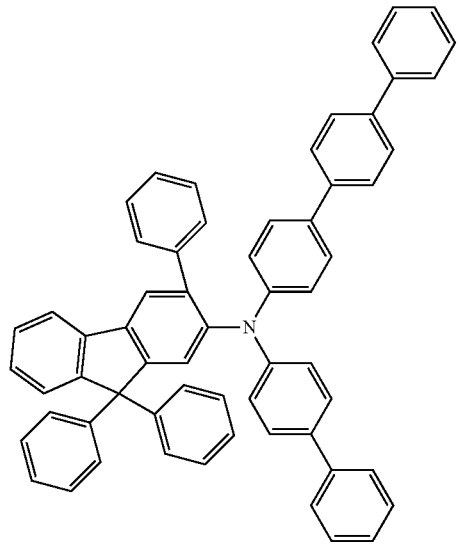
D08
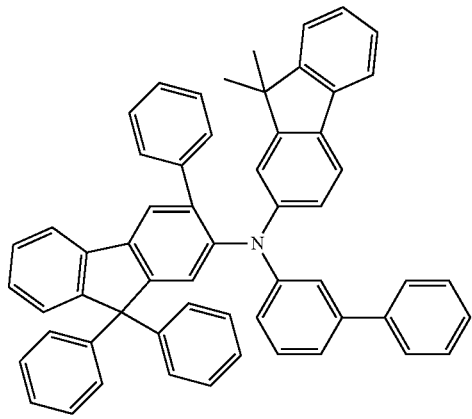
D09
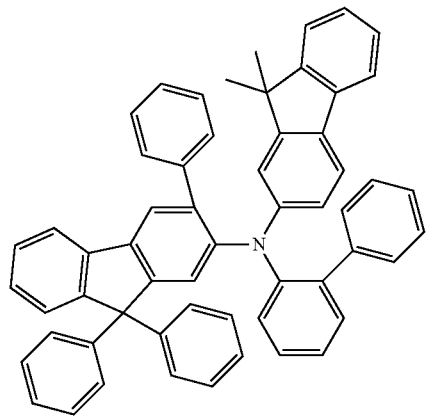
D10
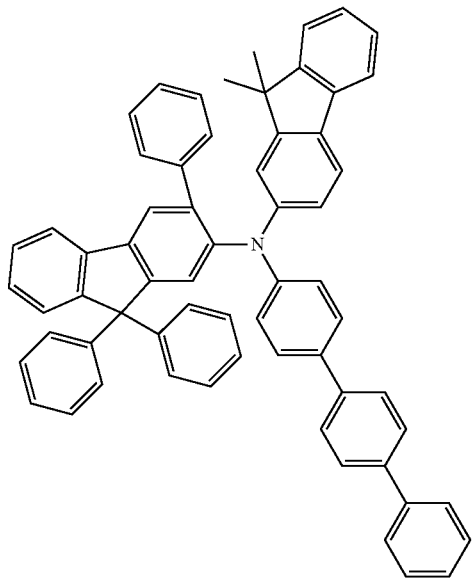

-continued
D11
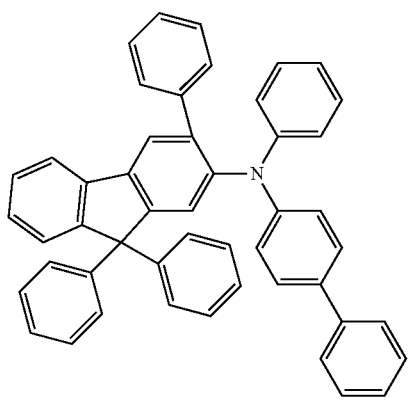
D12
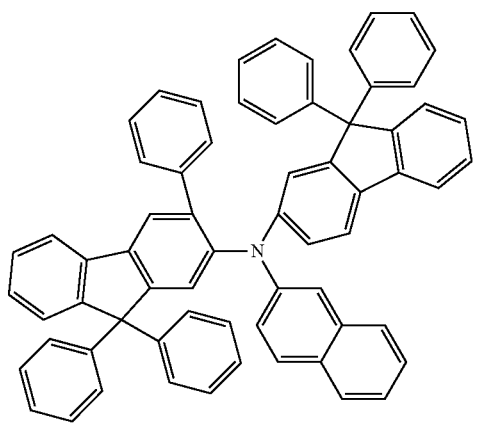
D13
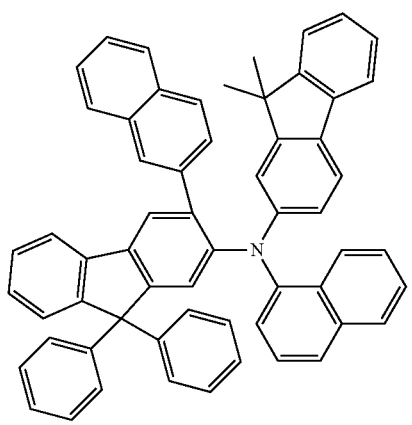
D14
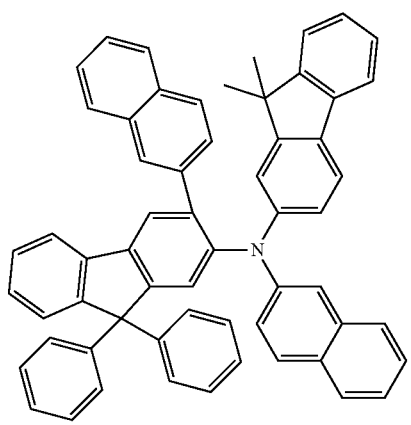
D15
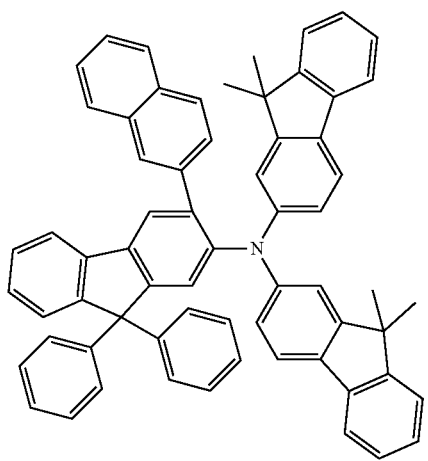
D16
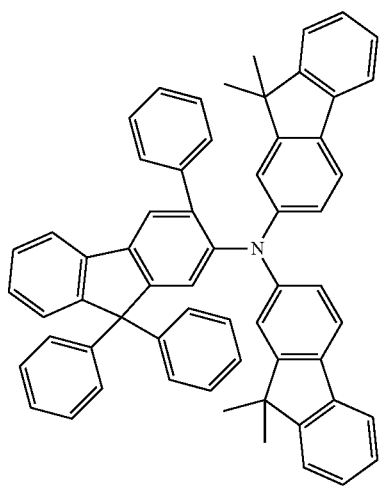

-continued
D17
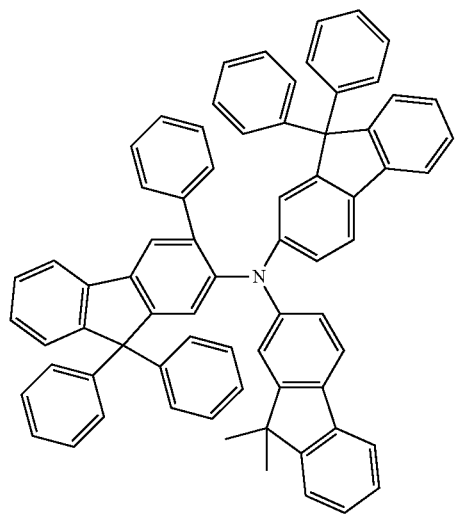
D18
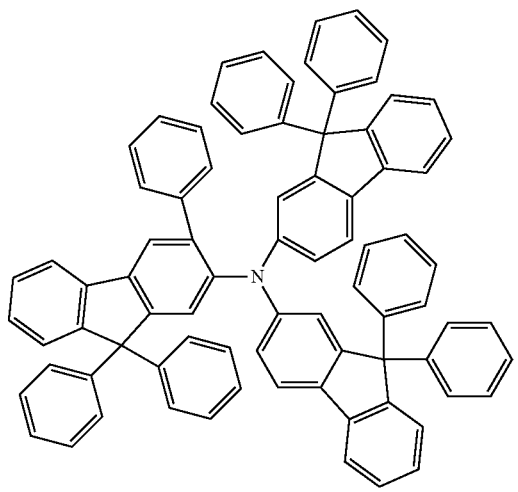
D19
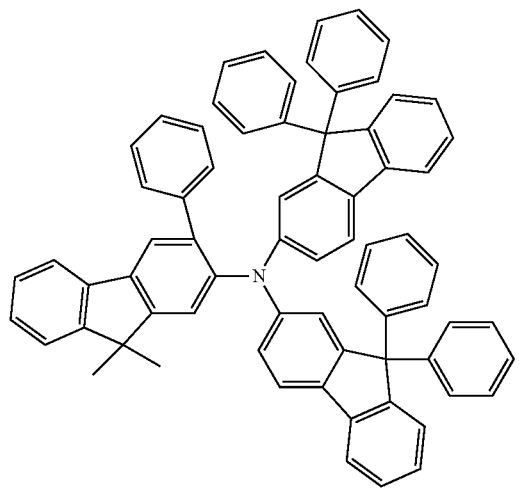
D20
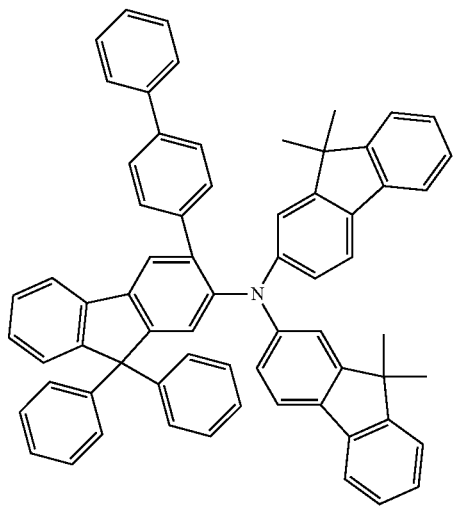
D21
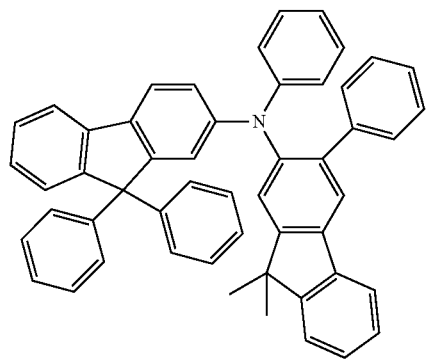
D22
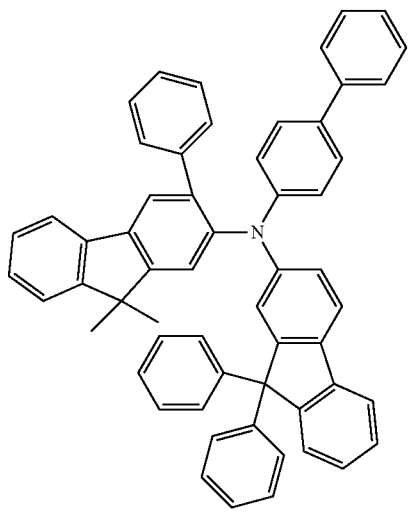

-continued
D23
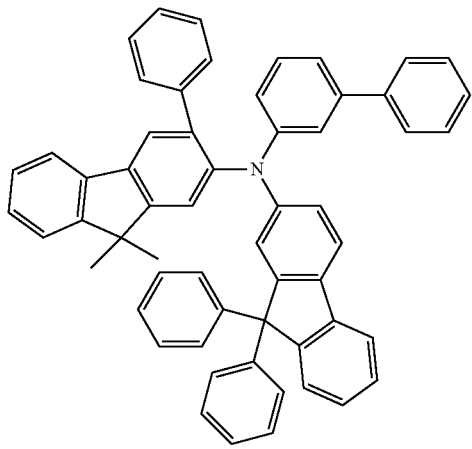
D24
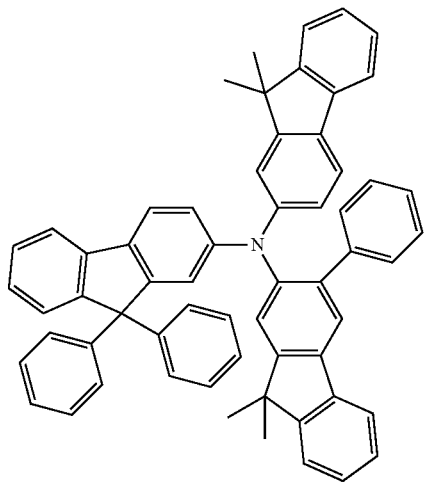
D25
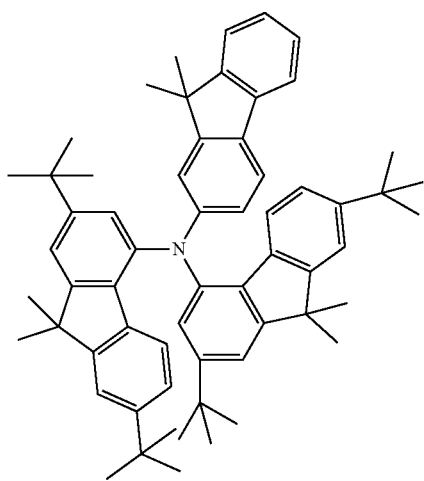
D26
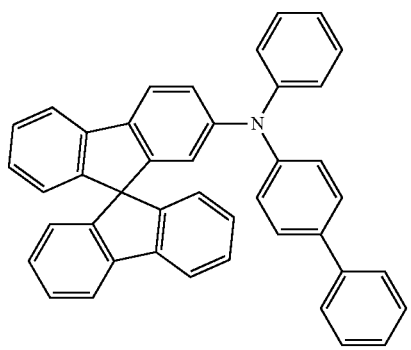
D27
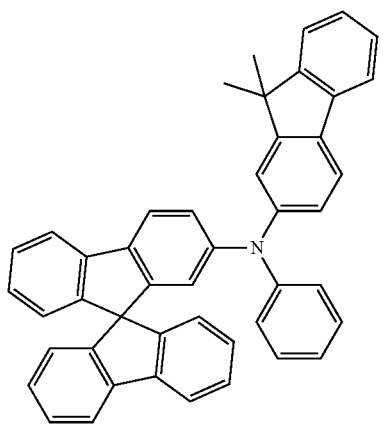
D28
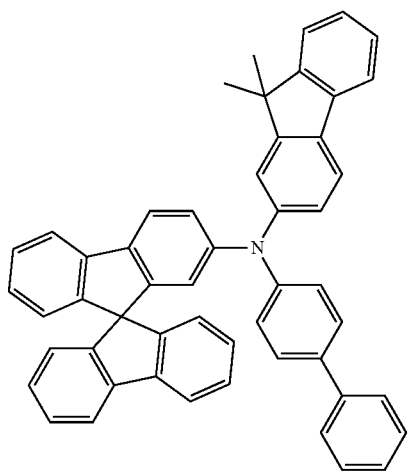

-continued
D29
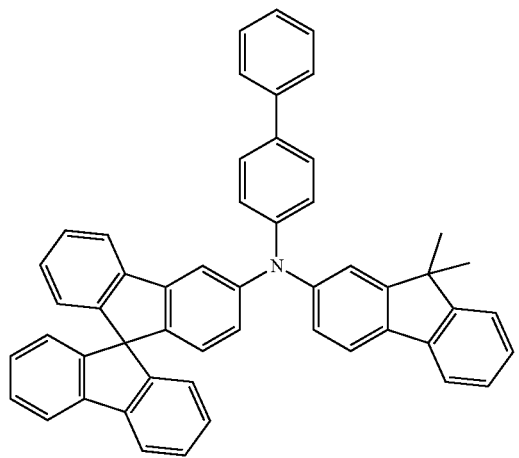
D30
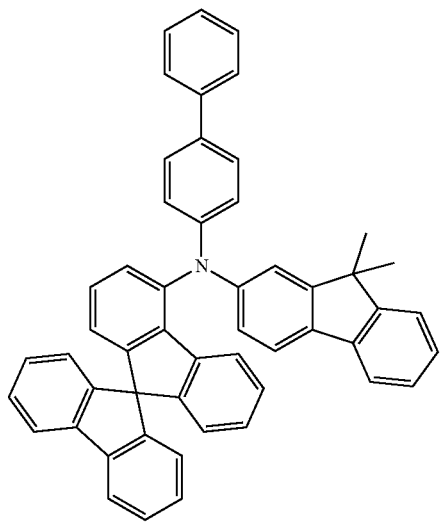
D31
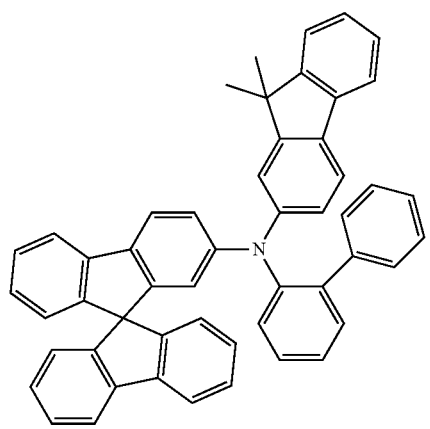
D32
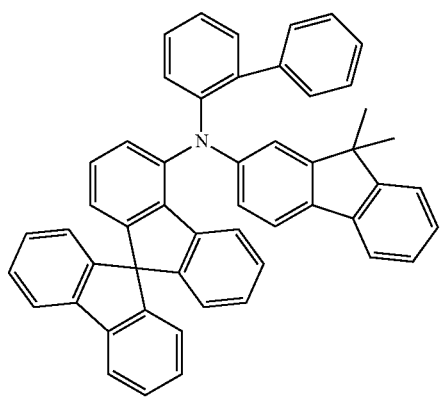
D33
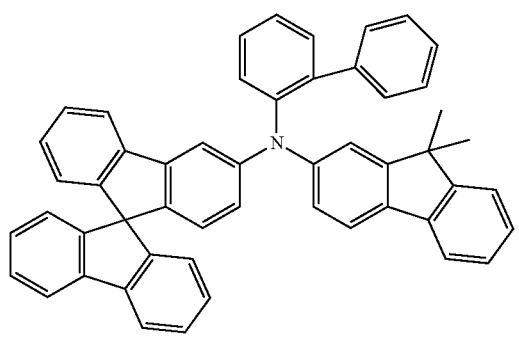
D34
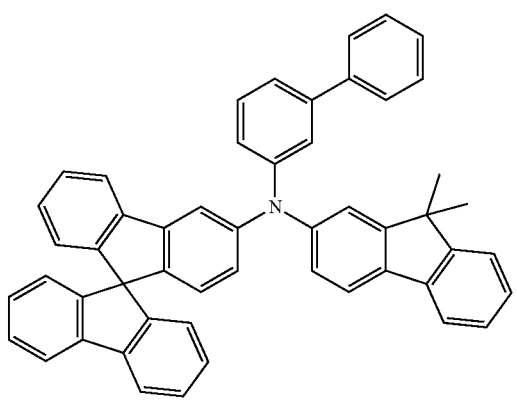

-continued
D35
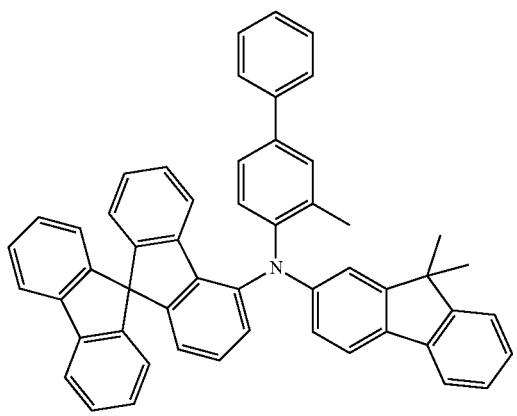
D36
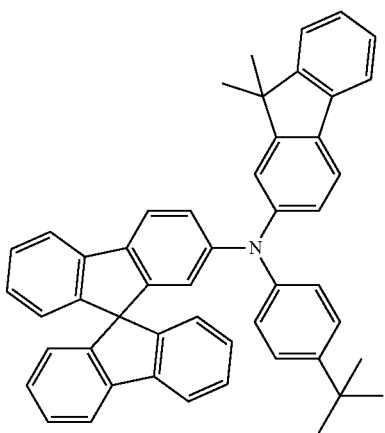
D37
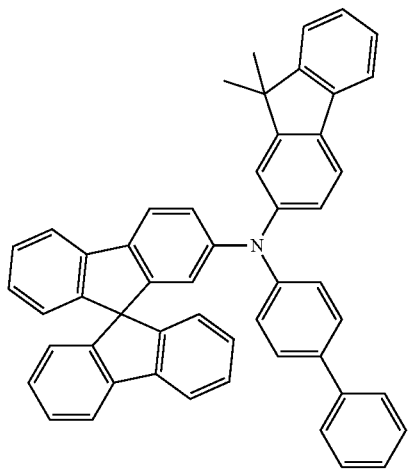
D38
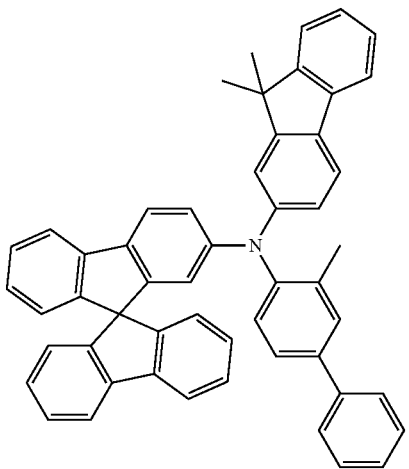
D39
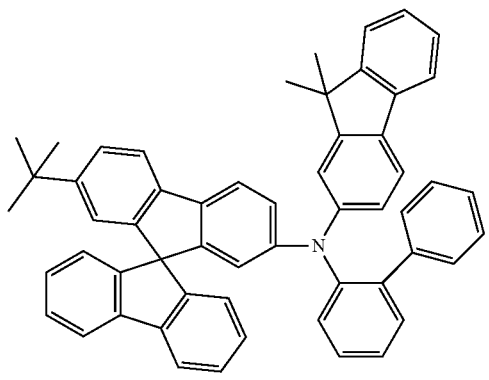
D40
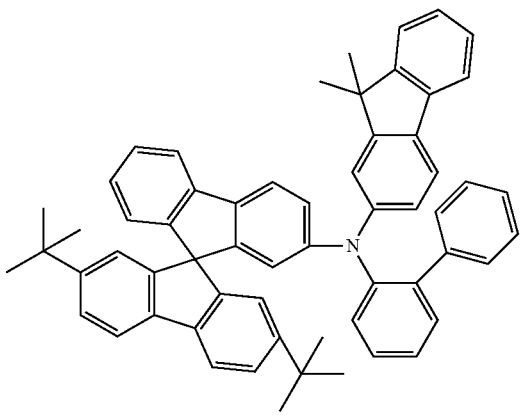

-continued
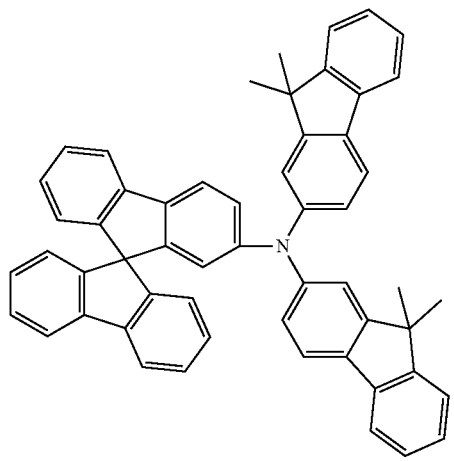
D41
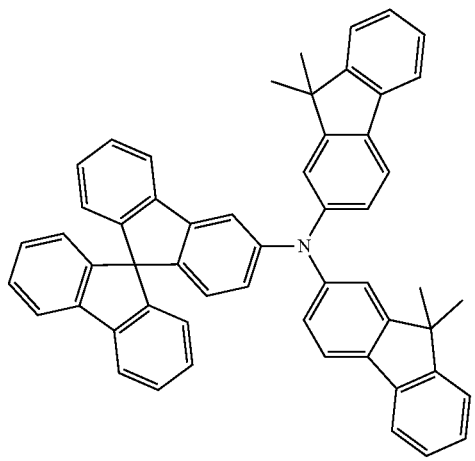
D42
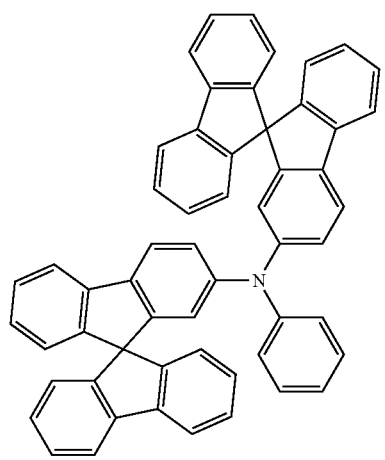
D43
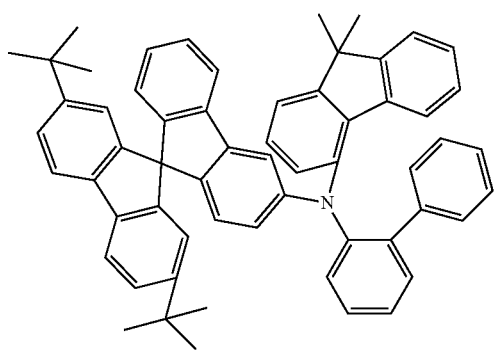
D44
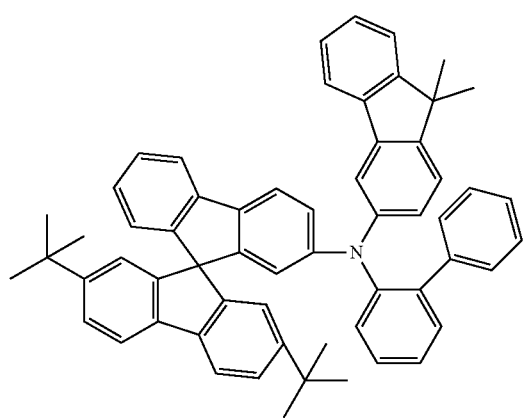
D45
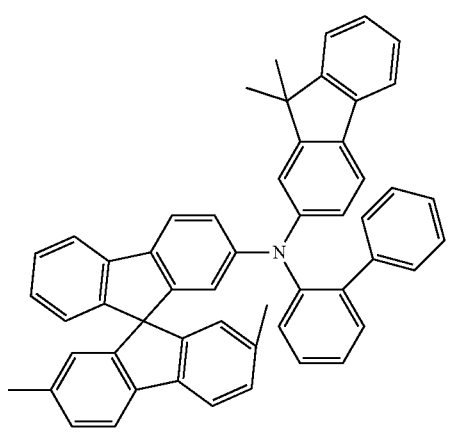
D46

-continued
D47 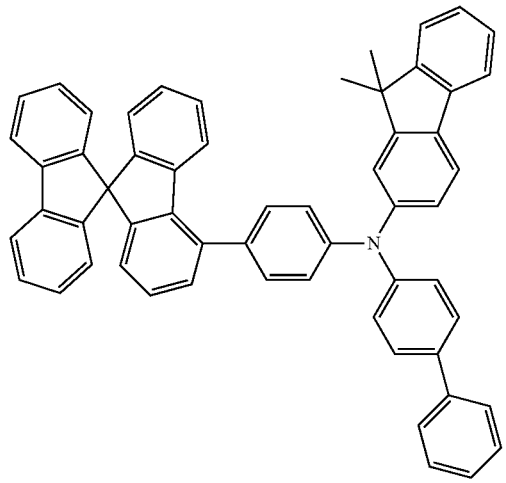
D48 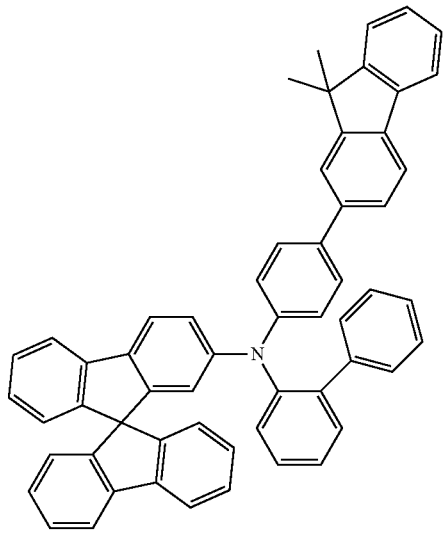
D49 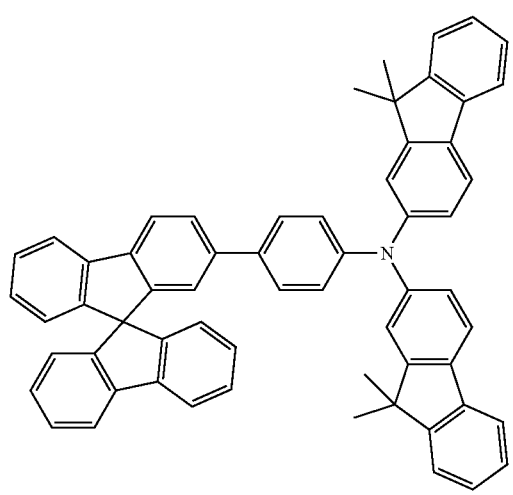
D50 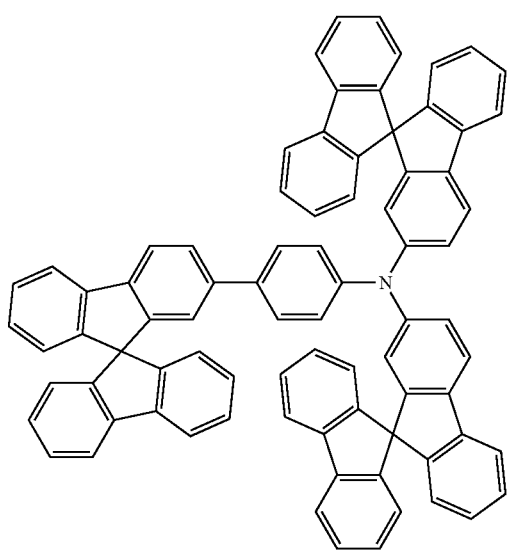
D51 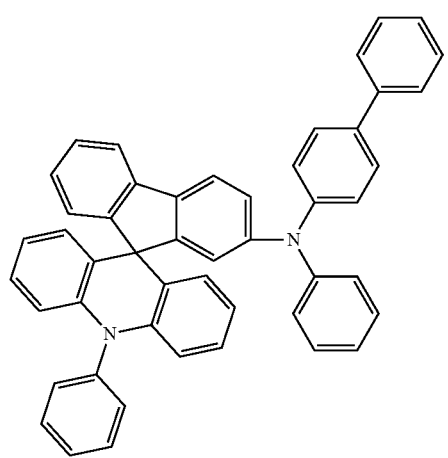
D52 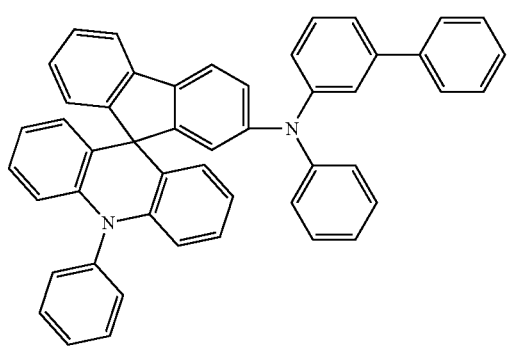

-continued
D53
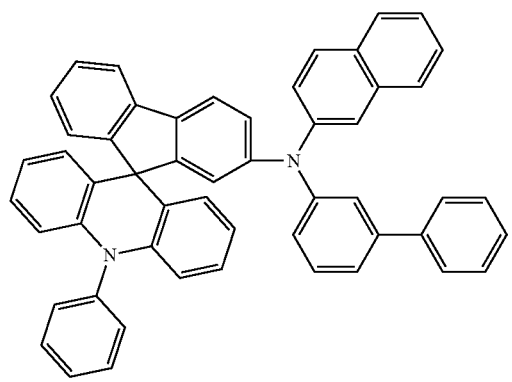
D54
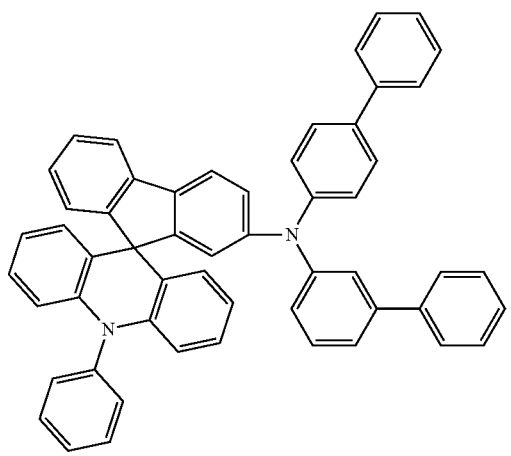
D55
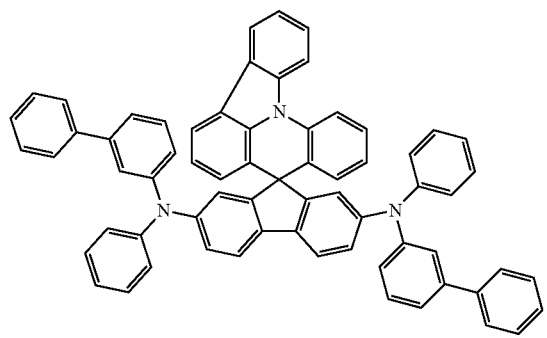
D56
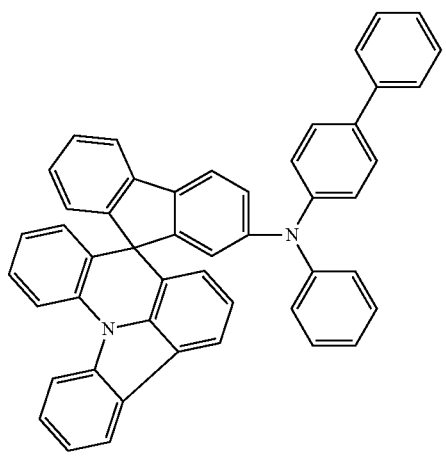
D57
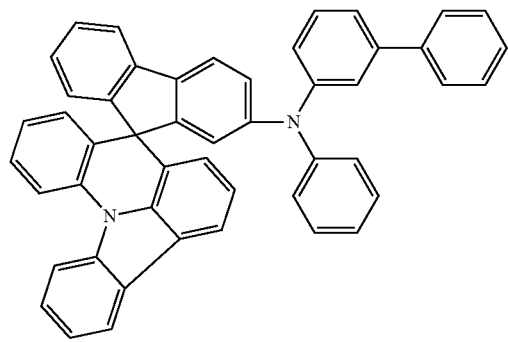
D58
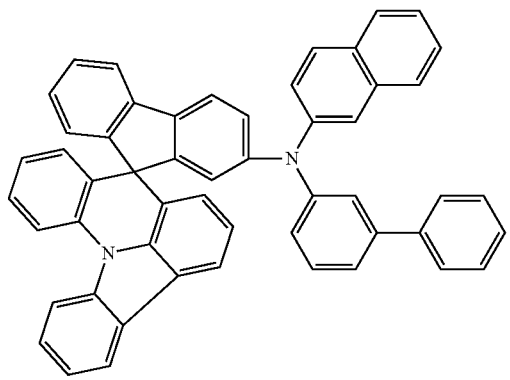

-continued
D59
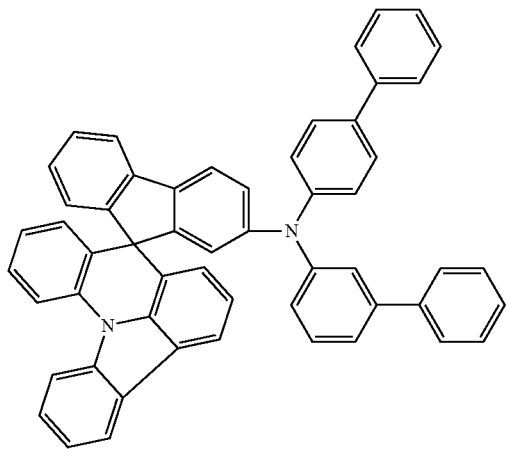
D60
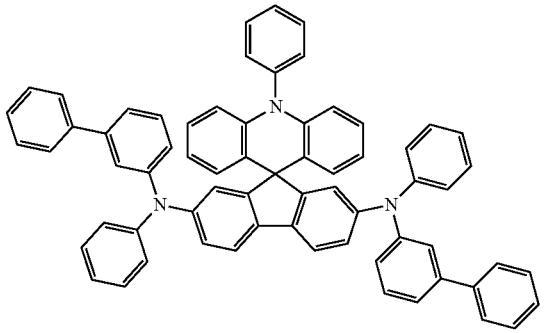
D61
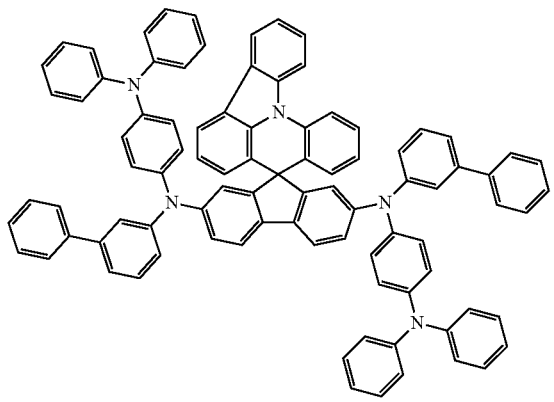
D62
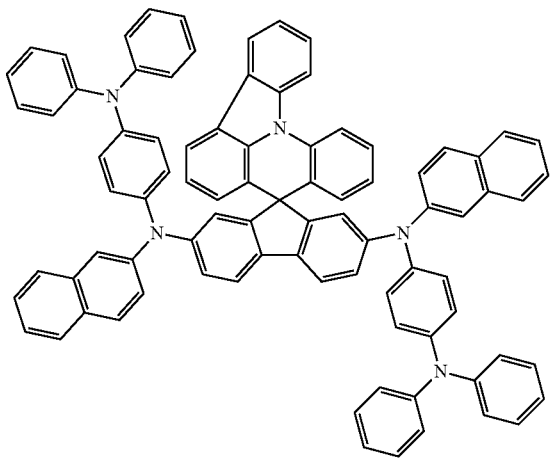
D63
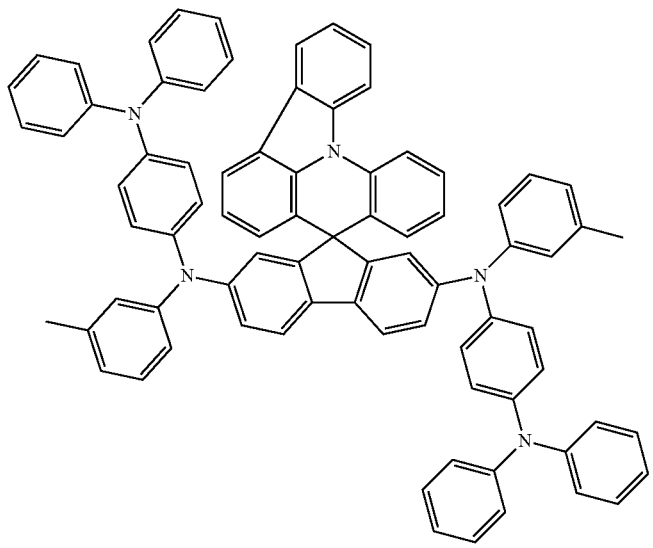

-continued
D64
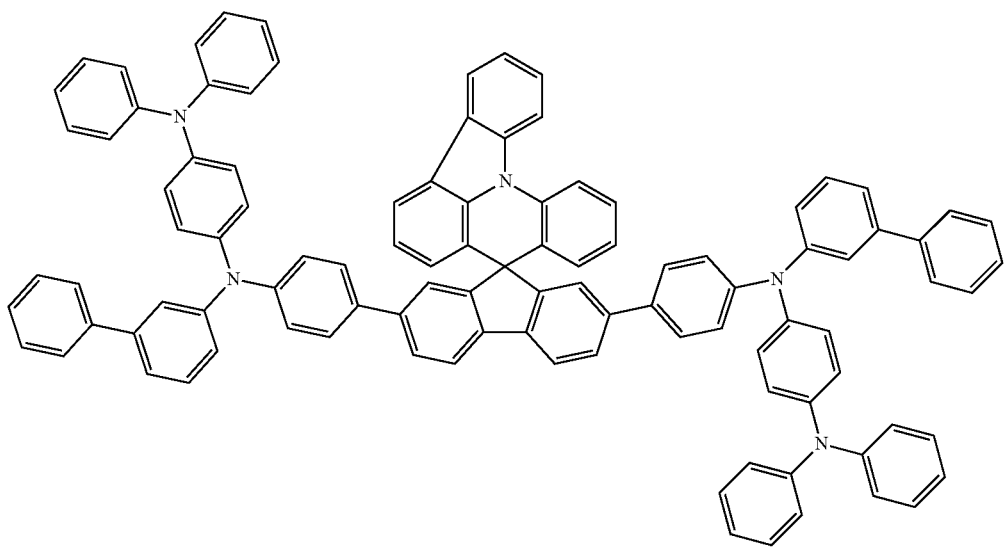
D65
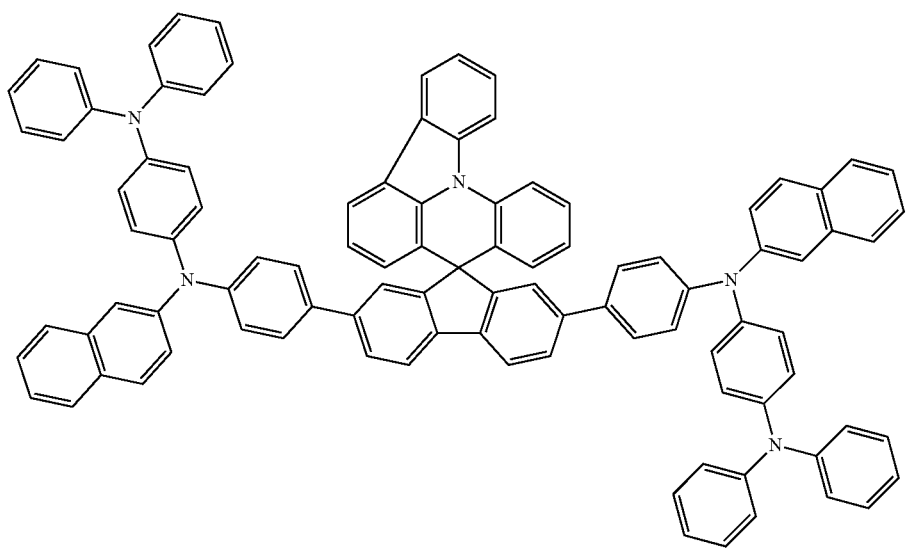
D66
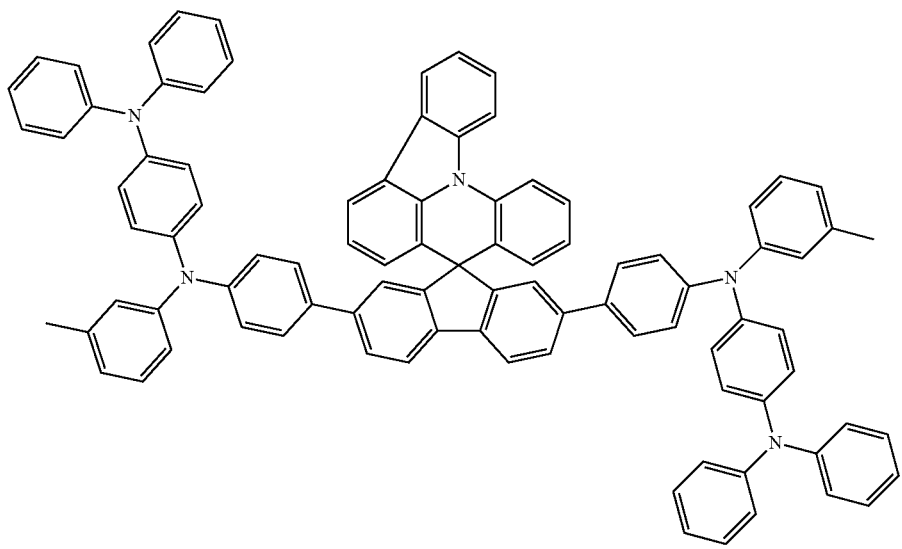

When the first layer 322a includes the second compound represented by one or more of the above chemical compound, the organic electric device 320 satisfies one or more of the general formulas 1 to 3 so that it may have a high efficiency or long life.

The second compound is represented by the following chemical formula 8.

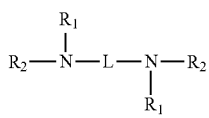

[chemical formula 8]

Hereinafter, chemical formula 8 will be described.

$R_1$ and $R_2$, which may be the same or different, are each independently one selected from the group consisting of a $C_6$-$C_{60}$ aryl group; a fluorenyl group; a $C_2$-$C_{60}$ hetero ring group containing at least one hetero atom from O, N, S, Si and P; a fused ring group of a $C_3$-$C_{60}$ aliphatic ring and a $C_6$-$C_{60}$ aromatic ring; a $C_1$-$C_{60}$ alkyl group.

When $R_1$ and $R_2$ are the aryl group, they may be each independently the $C_6$-$C_{60}$ aryl group, the $C_6$-$C_{30}$ aryl group or the $C_6$-$C_{12}$ aryl group.

L is one selected from the group consisting of a $C_6$-$C_{60}$ arylene group; a fluorylene group; a $C_2$-$C_{60}$ divalent hetero ring group containing at least one heteroatom from O, N, S, Si and P; a divalent fused ring group of a $C_3$-$C_{60}$ aliphatic ring and a $C_6$-$C_{60}$ aromatic ring.

When L is the aryl group, it may be each independently the $C_6$-$C_{60}$ aryl group, the $C_6$-$C_{30}$ aryl group or the $C_6$-$C_{12}$ aryl group.

In $R_1$, $R_2$, and L of the chemical formula 8, the aryl group, the fluorenyl group, the hetero ring group, the fused ring group, the arylene group, the fluorylene group, the $C_2$-$C_{60}$ divalent hetero ring group and a divalent fused ring group may each be further substituted with at least one substituent selected from the group consisting of a deuterium; a nitro group; a cyano group; a halogen; an amino group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{20}$ aryl group; a $C_6$-$C_{20}$ aryl group substituted with the deuterium; a fluorenyl group; a $C_2$-$C_{20}$ hetero ring group; a $C_3$-$C_{60}$ alkylsilyl group; a $C_{18}$-$C_{60}$ arylsilyl group; and a $C_8$-$C_{60}$ alkylarylsilyl group.

Since the organic electric device 320 includes the first layer 322b comprising the first chemical compound and the second chemical compound, the organic electric device 320 satisfies one or more of the general formulas 1 to 3 so that it may have a high efficiency or long life.

The second chemical compound is represented by one or more of the following chemical formula 9.

A-B-A    [chemical formula 9]

Hereafter the chemical formula 9 will be described.
A is the above formula 9-A,

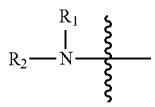

[chemical formula 9-A]

B is one of the following.

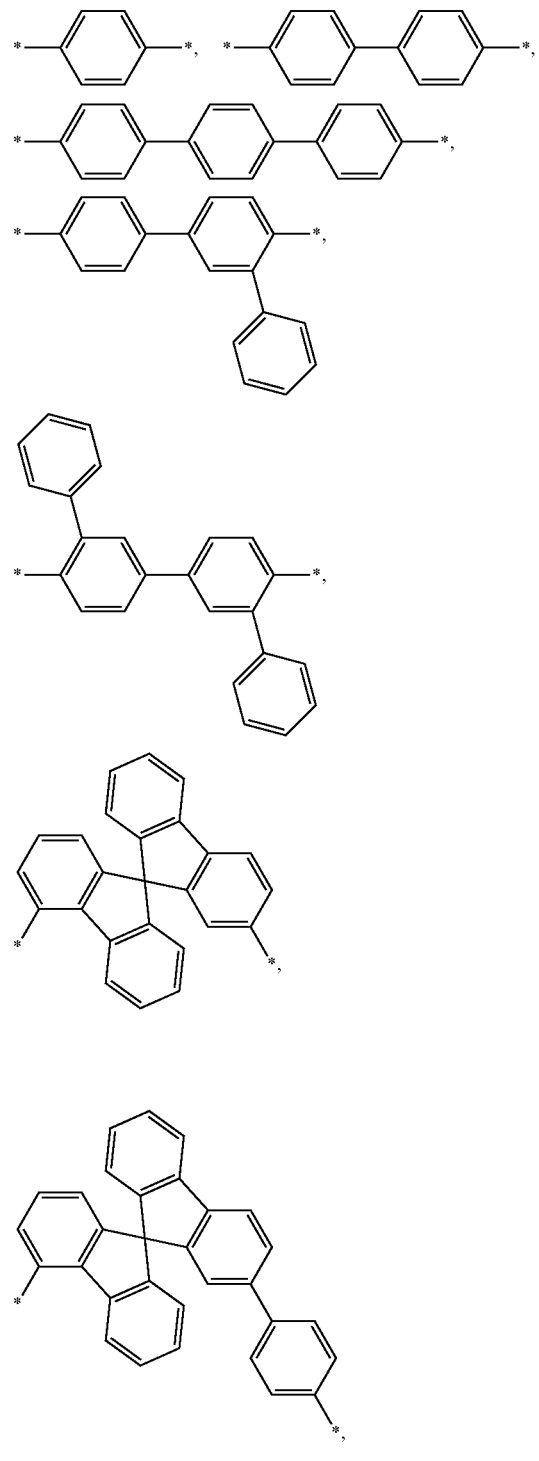

-continued

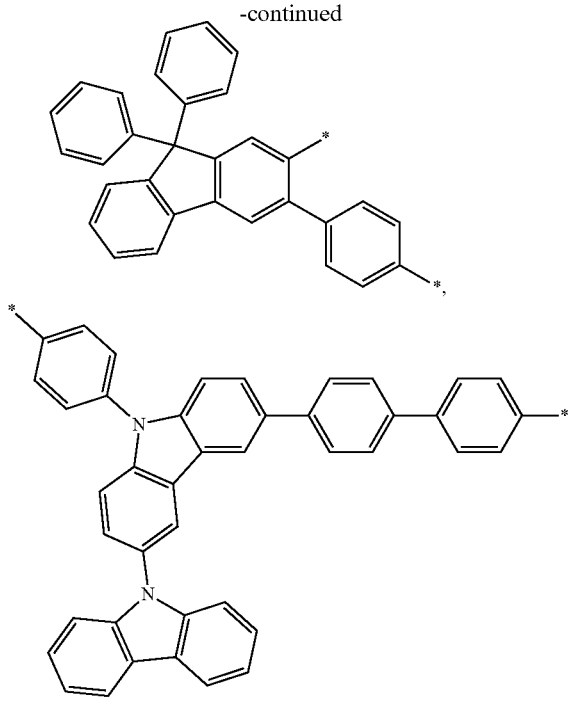

In B, * is a position where A is bonded.

In the chemical 9-A, $R_1$ and $R_2$, which are same or different, are each independently one selected from the group consisting of a $C_6$-$C_{60}$ aryl group; a fluorenyl group; a $C_2$-$C_{60}$ hetero ring group containing at least one hetero atom from O, N, S, Si and P; a fused ring group of a $C_3$-$C_{60}$ aliphatic ring and a $C_6$-$C_{60}$ aromatic ring; and a $C_1$-$C_{50}$ alkyl group.

In $R_1$ and $R_2$ of the chemical formula 9-A, the aryl group, the hetero ring group, the fused ring group, and the alkyl group, may each be further substituted with at least one substituent selected from the group consisting of a deuterium; a nitro group; a cyano group; a halogen; an amino group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{20}$ aryl group; a $C_6$-$C_{20}$ aryl group substituted with the deuterium; a fluorenyl group; a $C_2$-$C_{20}$ hetero ring group; a $C_3$-$C_{60}$ alkylsilyl group; a $C_{18}$-$C_{60}$ arylsilyl group; and a $C_8$-$C_{60}$ alkylarylsilyl group.

When the first layer 322a includes the second chemical compound represented by one or more of the above chemical formula 9, the organic electric device 320 satisfies one or more of the general formulas 1 to 3 so that it may have a high efficiency or long life.

The second chemical compound may be one or more of the following chemical compounds.

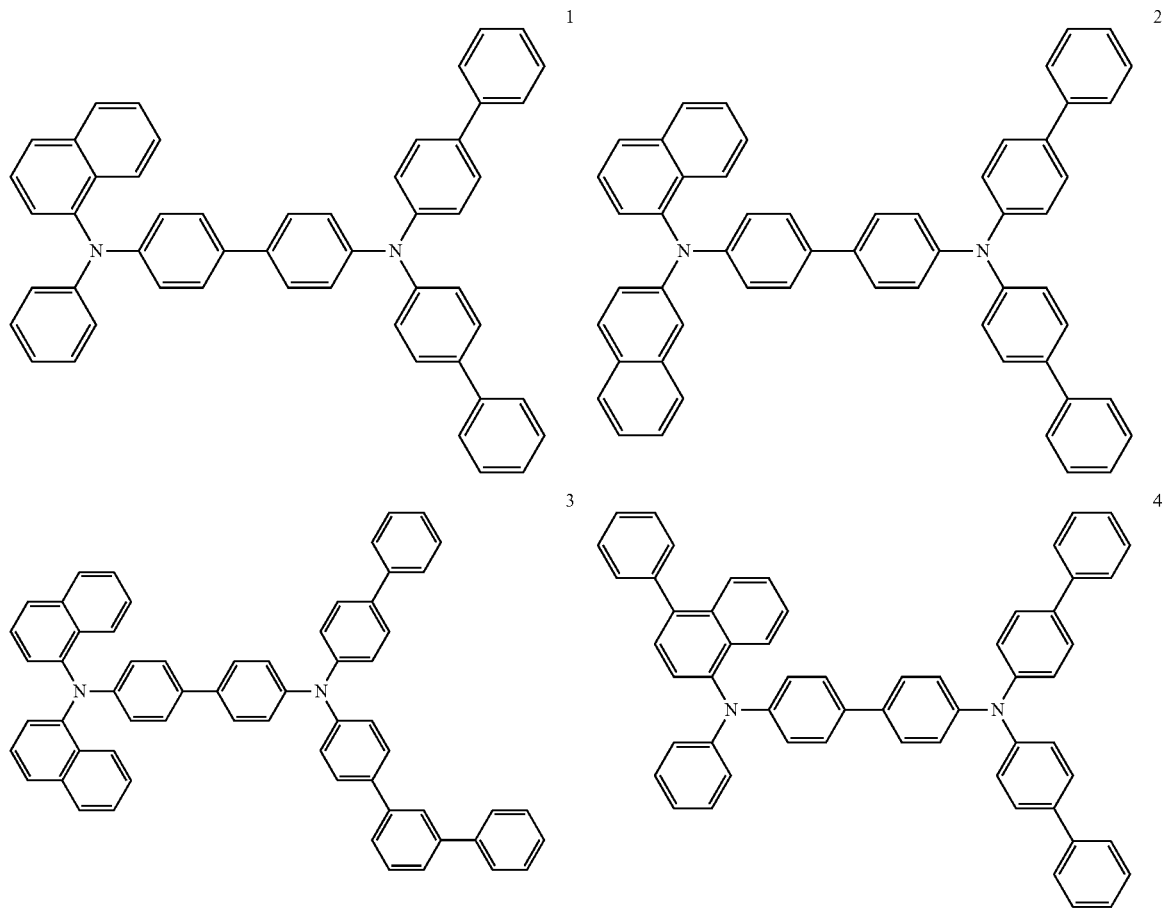

-continued
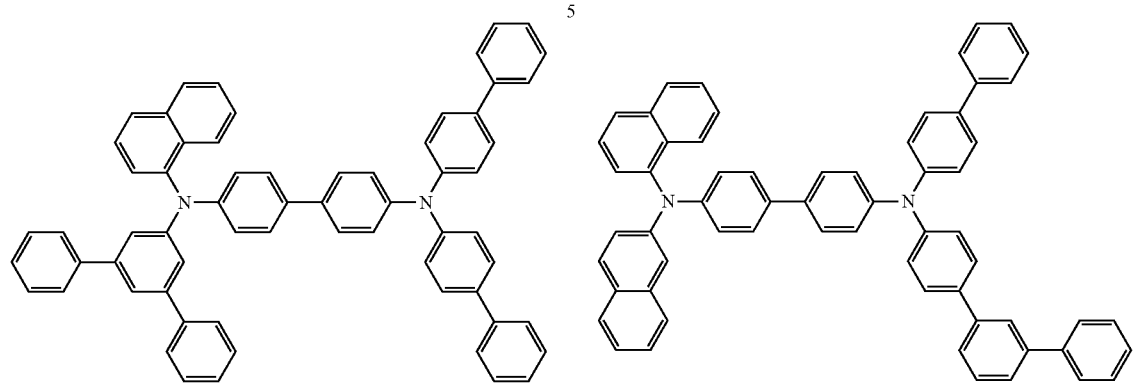
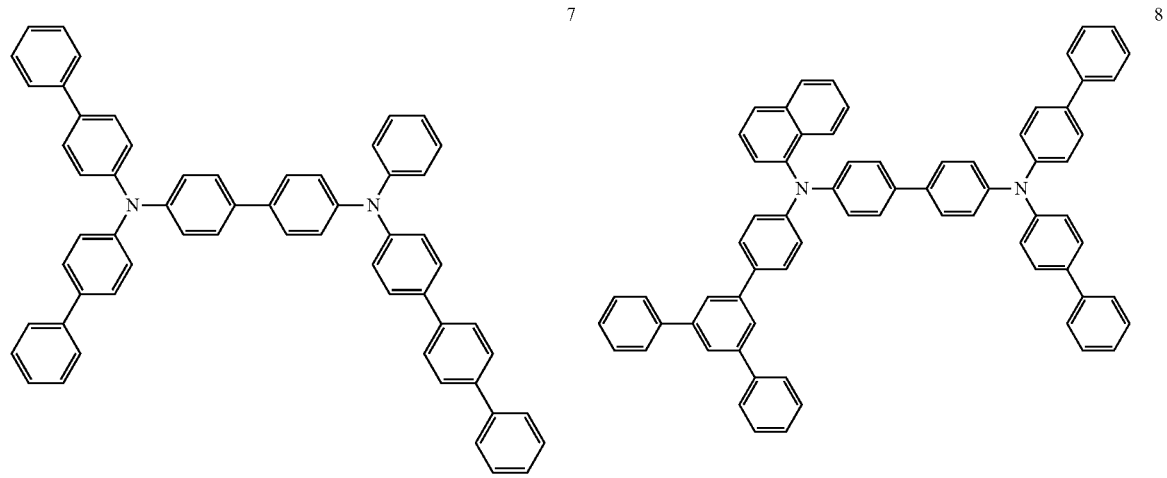
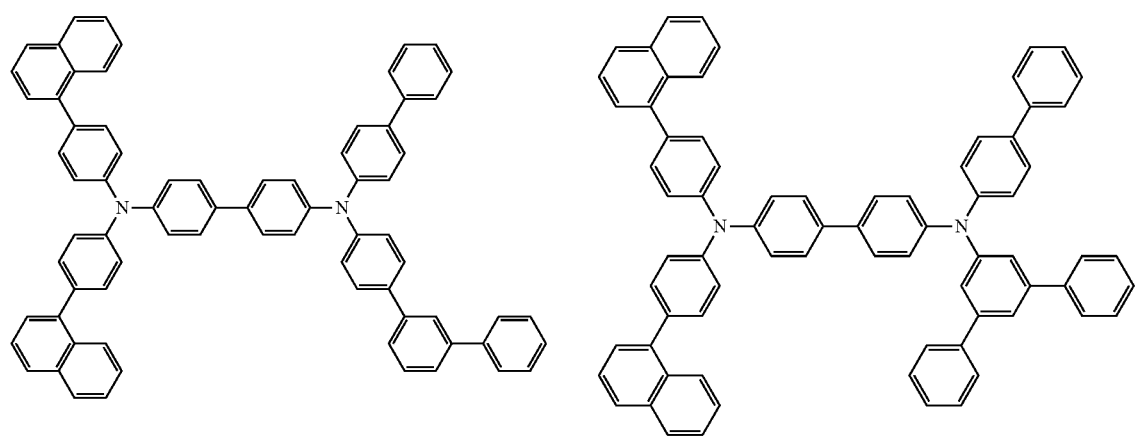

-continued
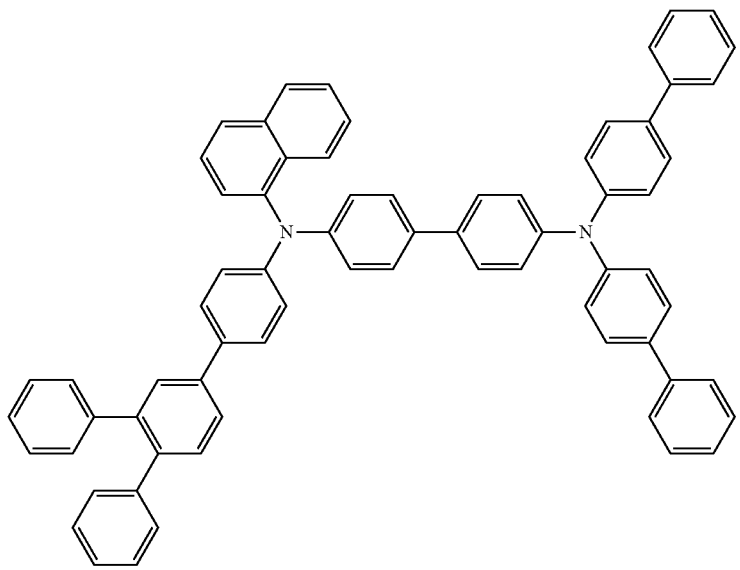
11
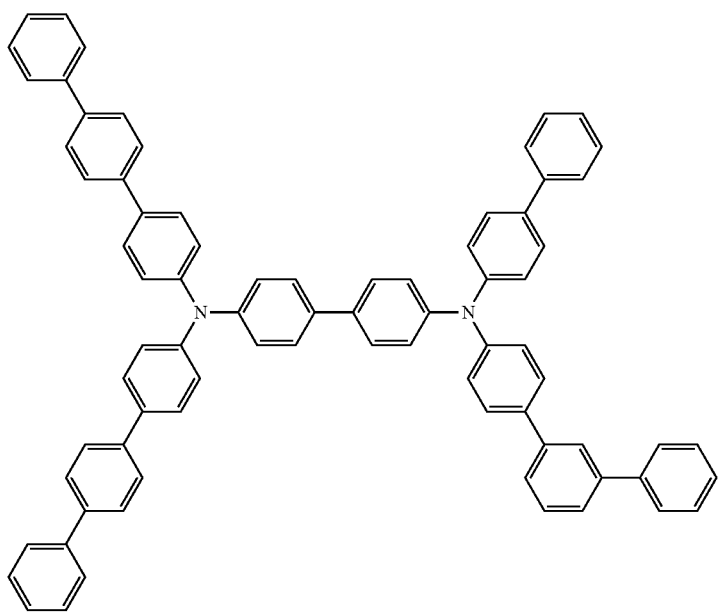
12

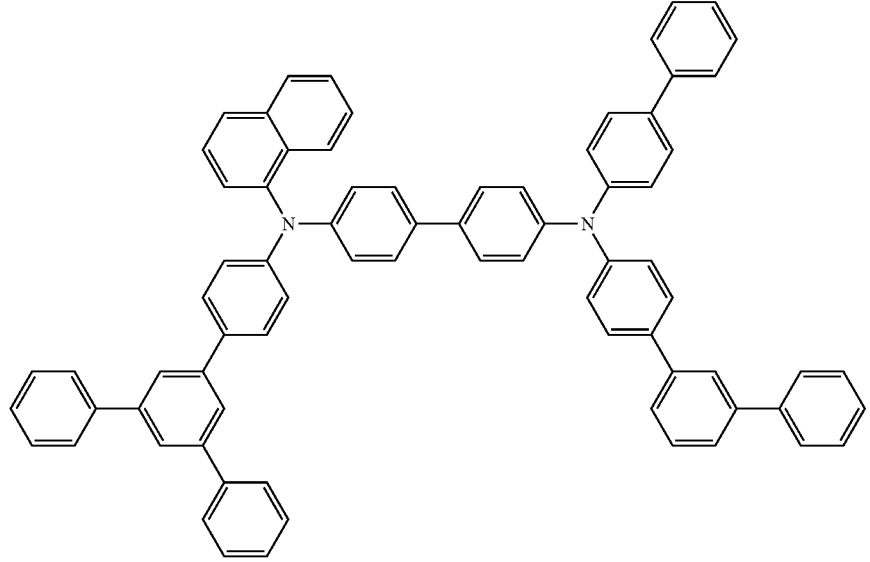
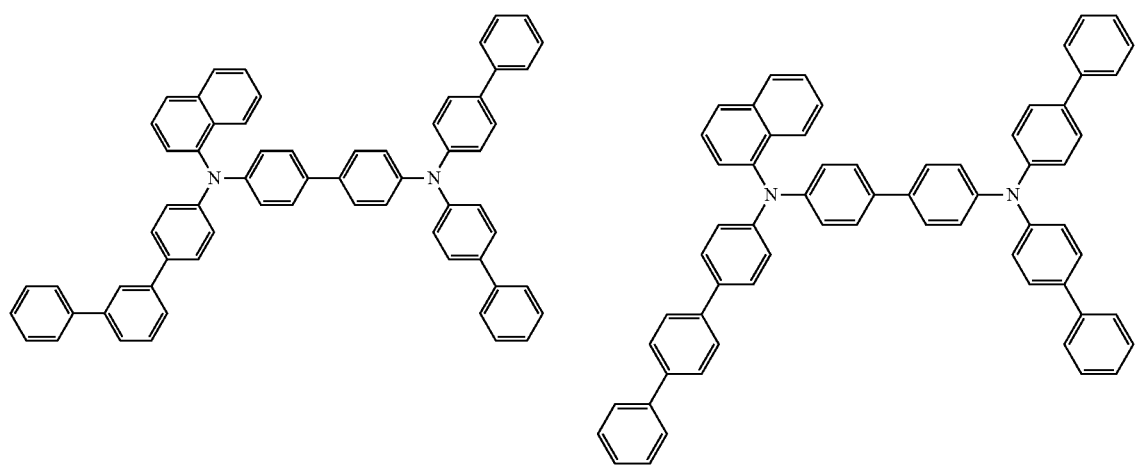
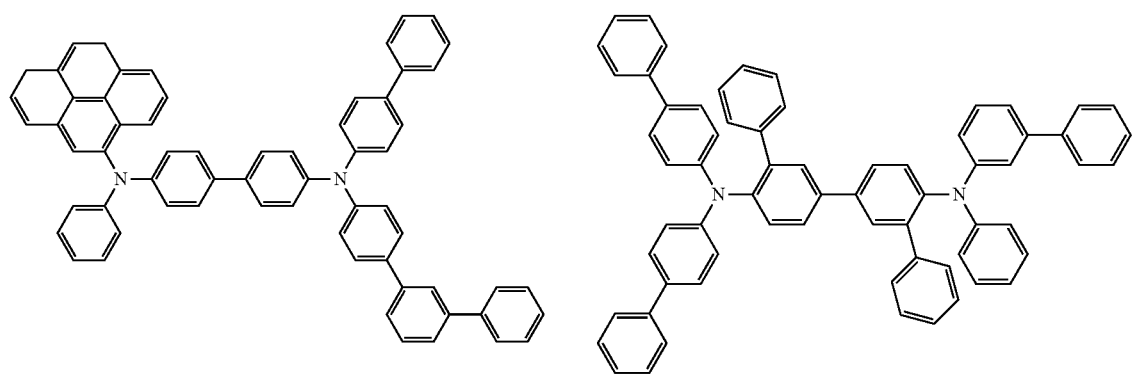

18
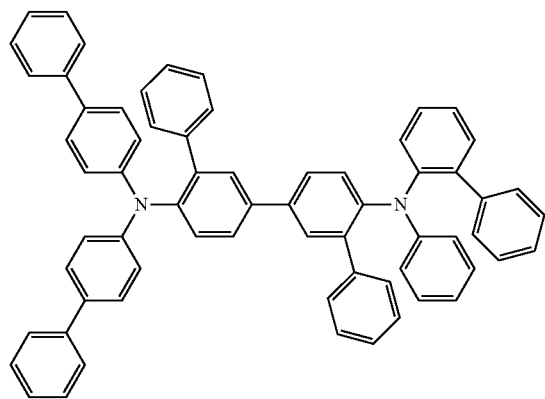
19
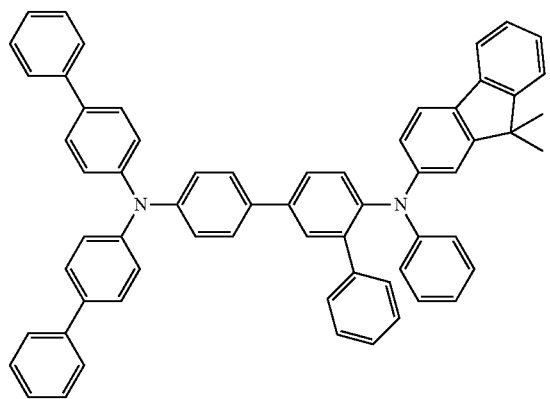
20
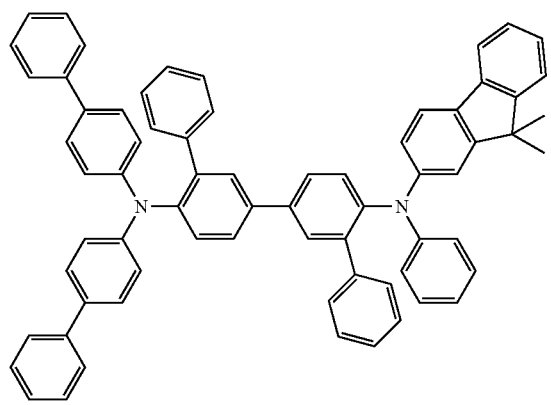
21
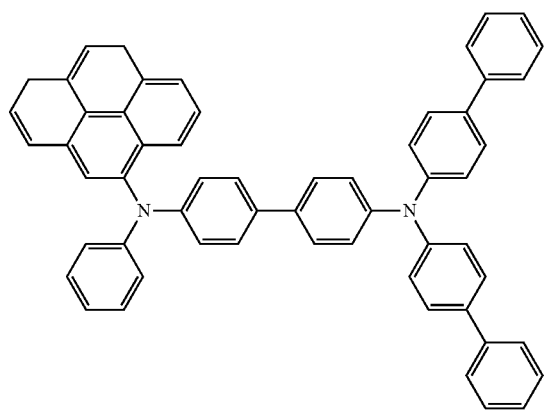
22
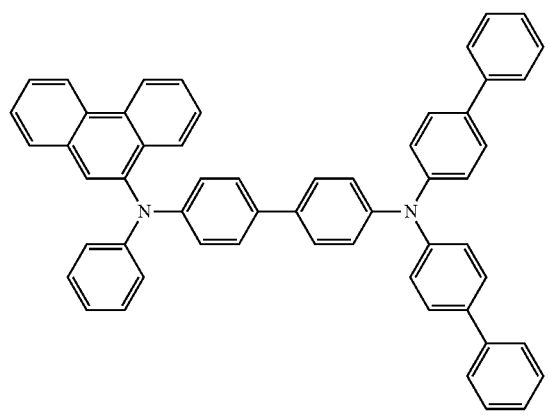
23
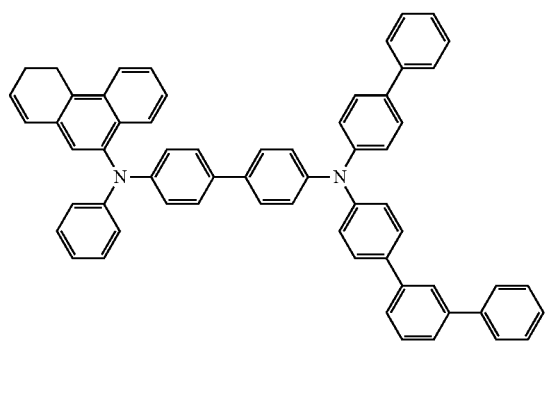

-continued
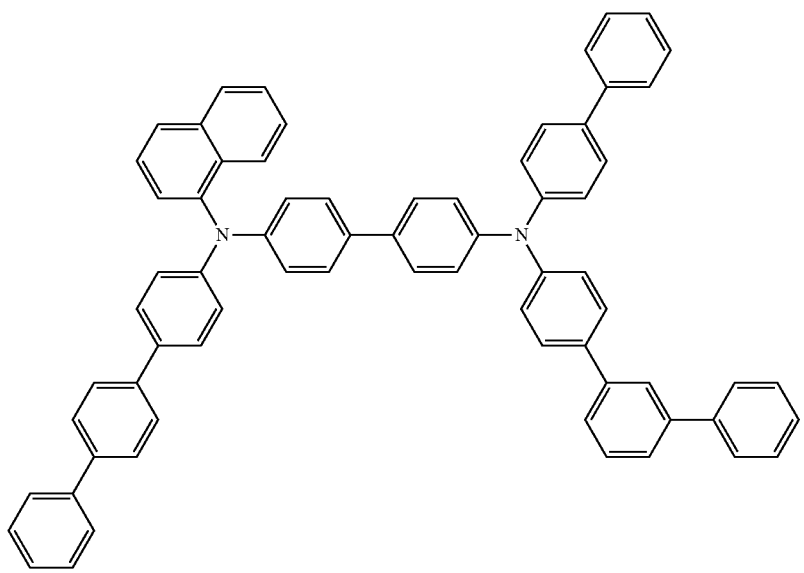
24
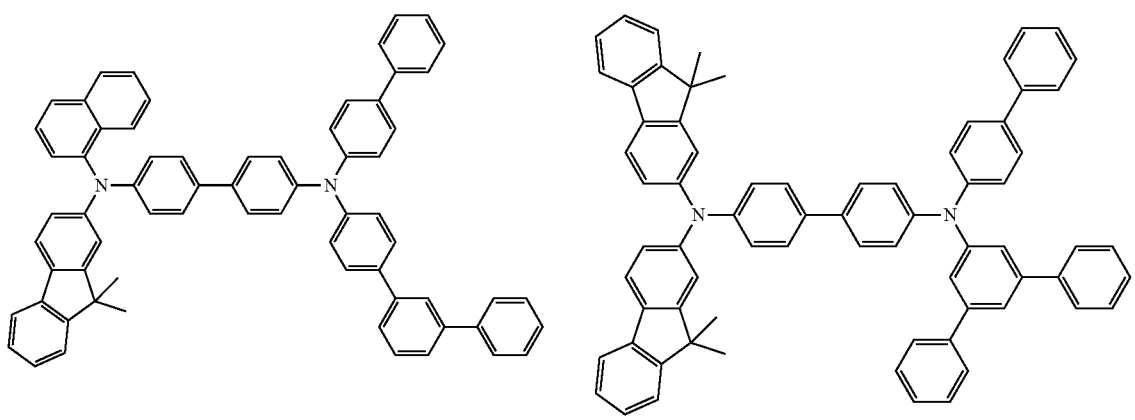
25
26
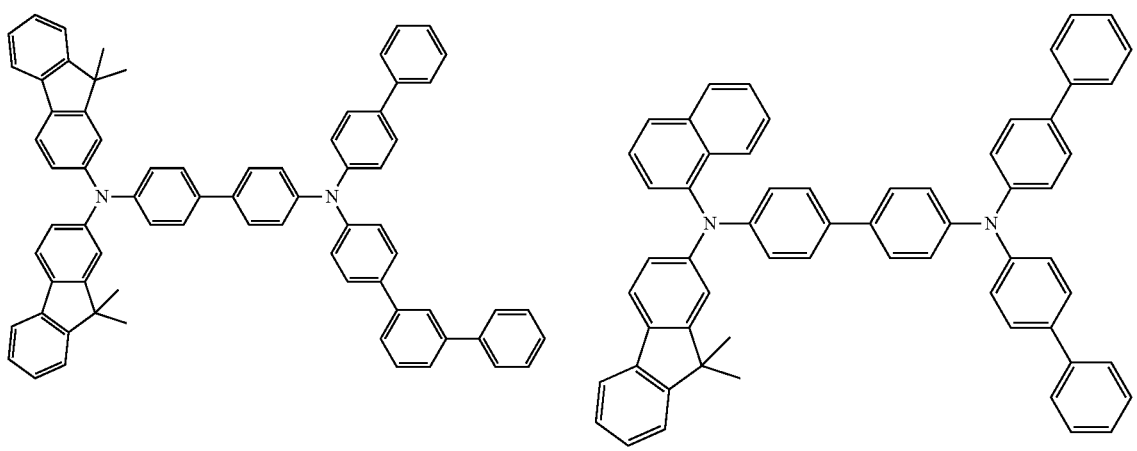
27
28

-continued
29
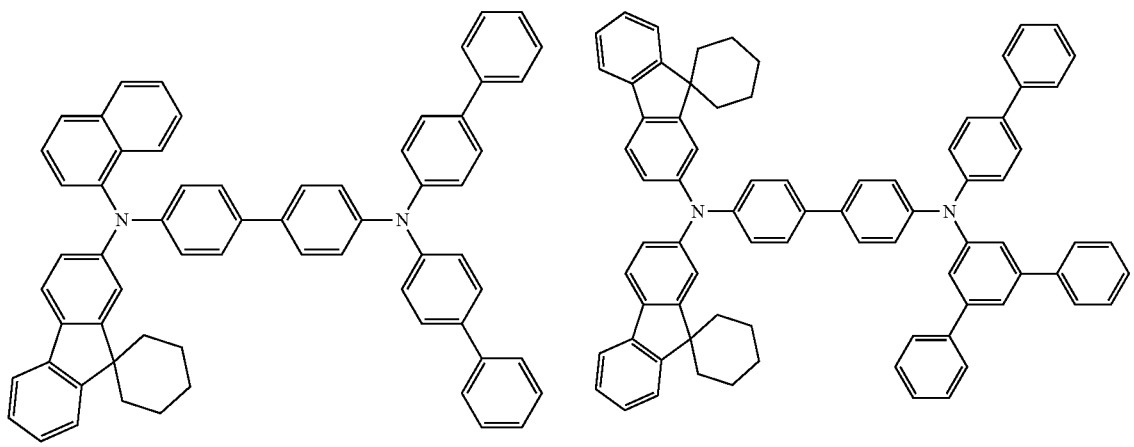
30
31
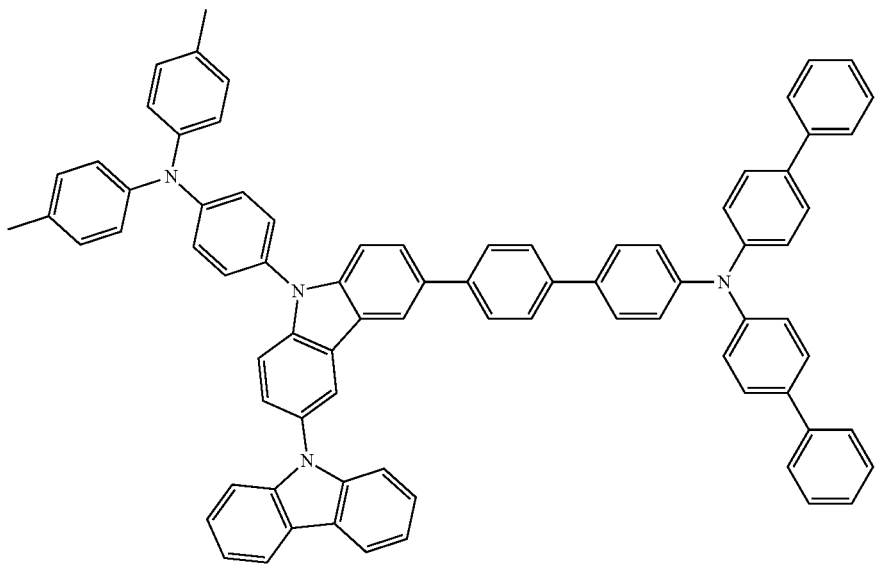
32
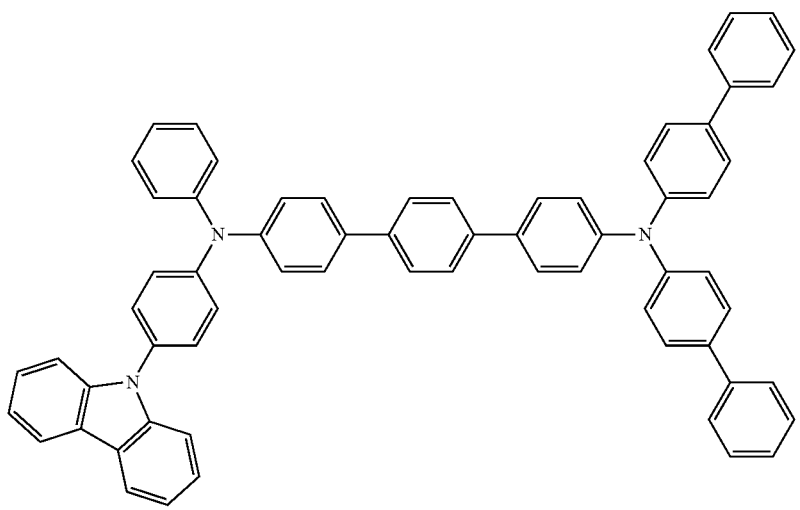

-continued
33
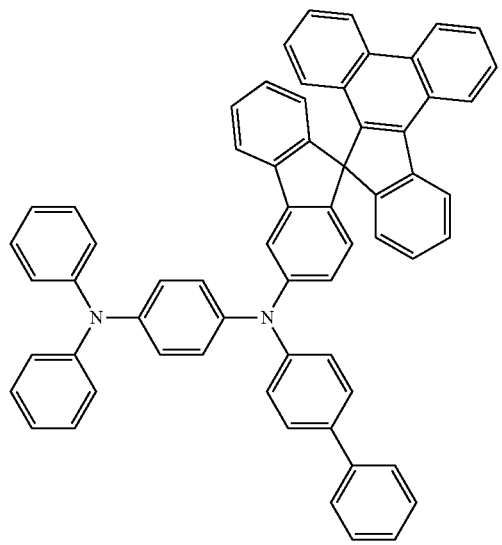
34
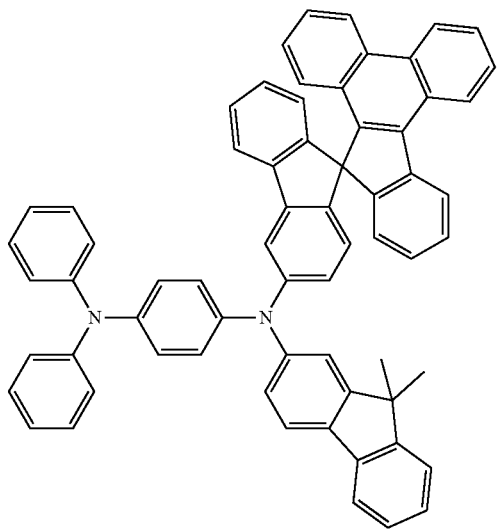
35
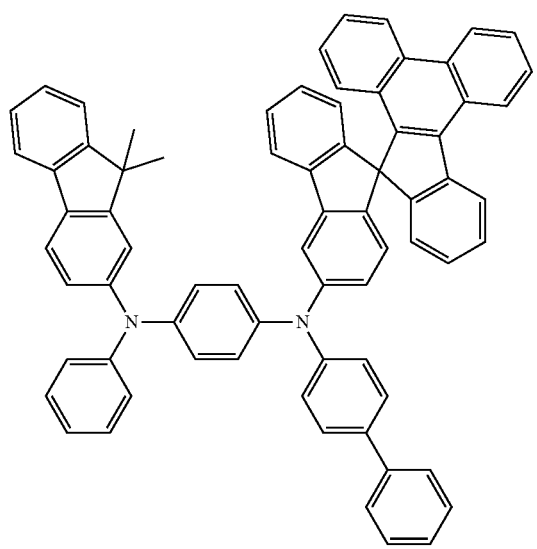
36
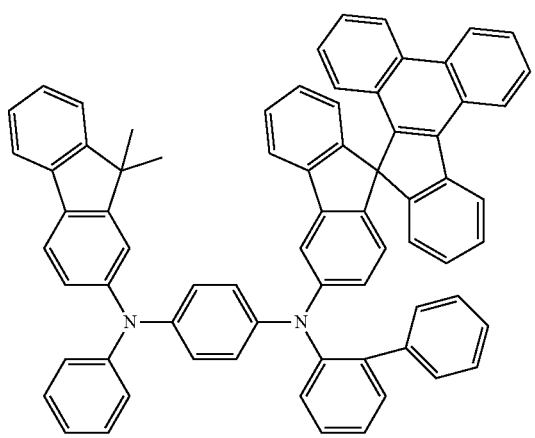
37
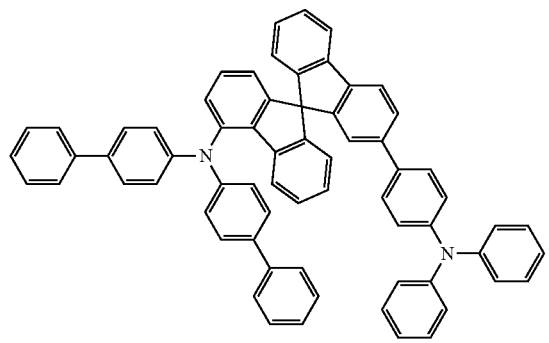
38
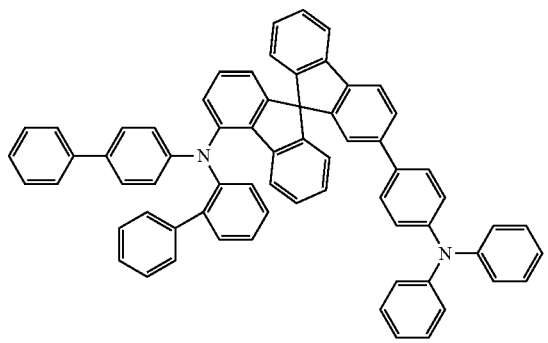

-continued
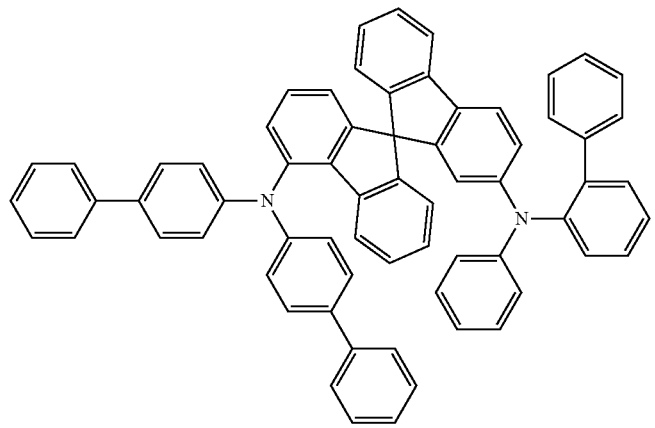
39
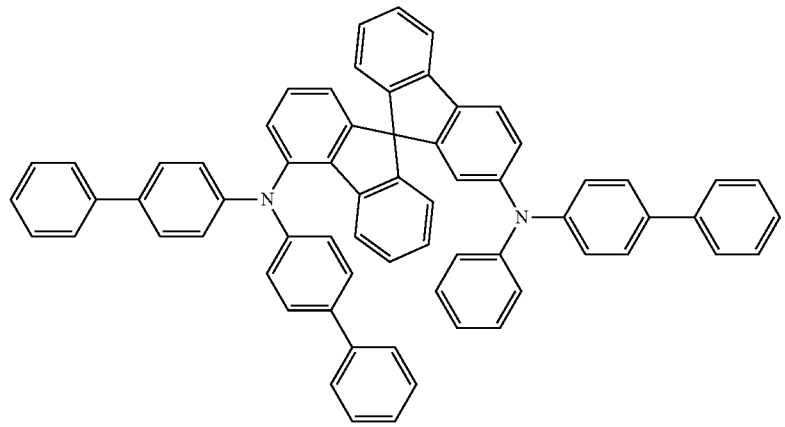
40
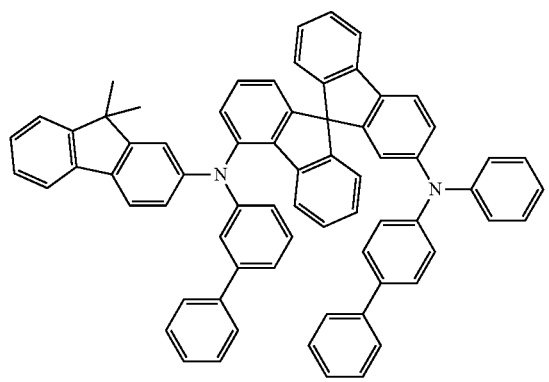
41
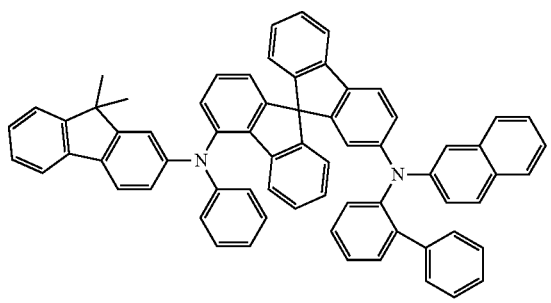
42
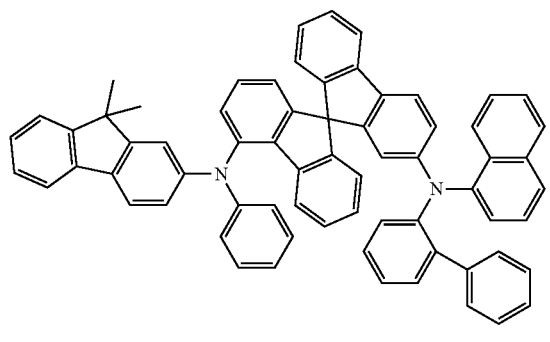
43
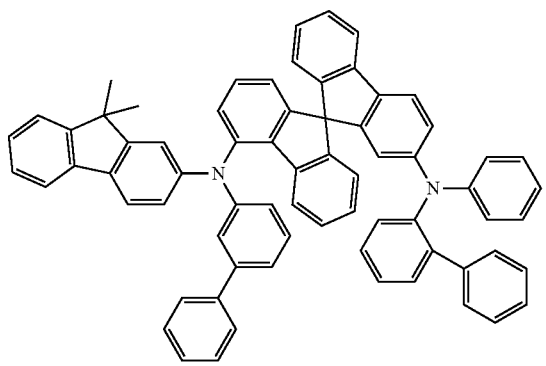
44

-continued
45
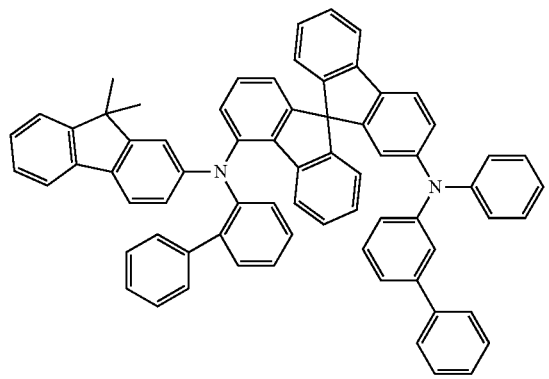
46
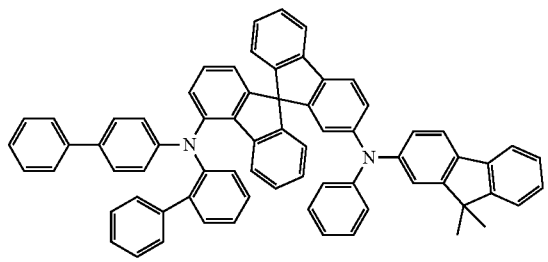
47
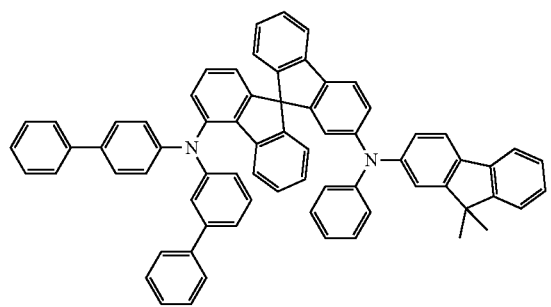
48
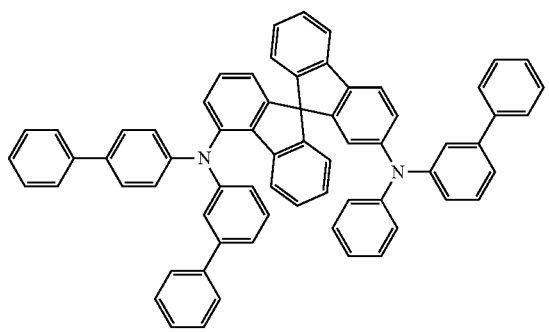
49
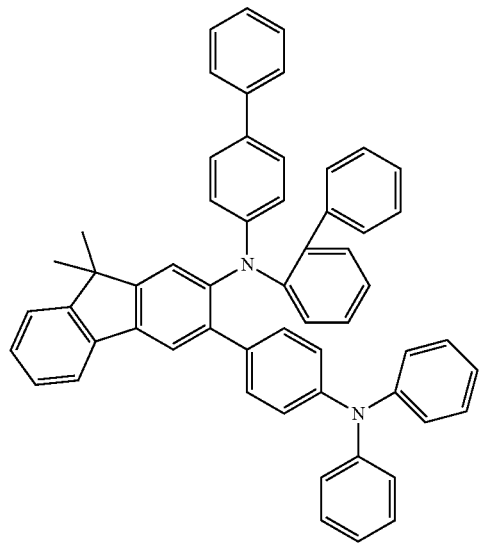
50
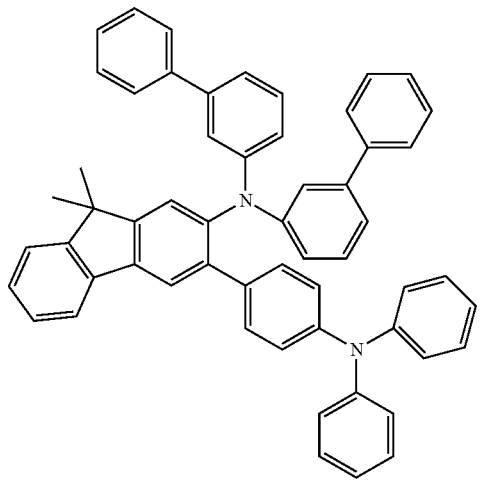

-continued
51
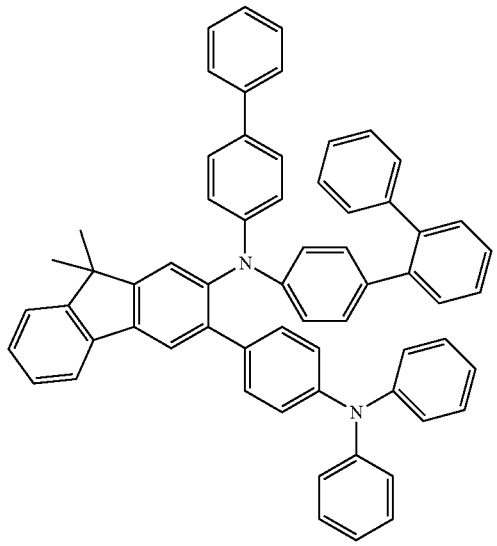
52
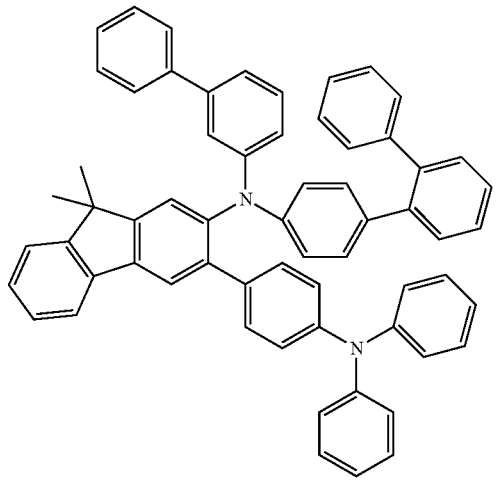
53
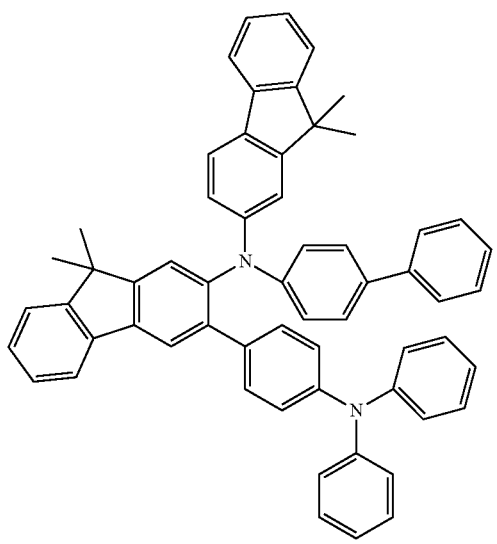
54
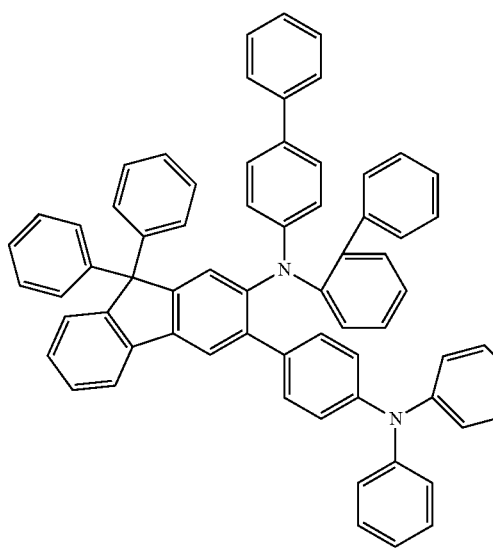
55
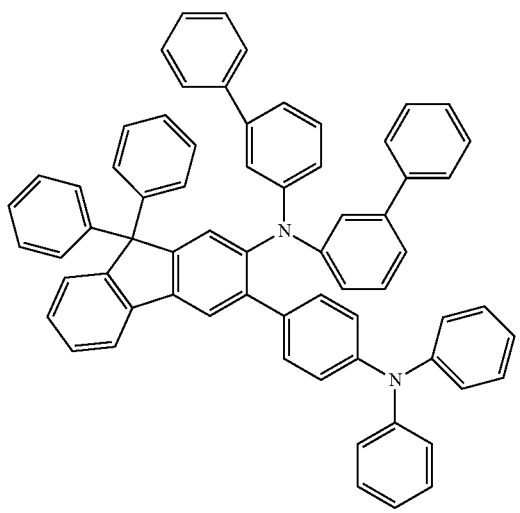
56
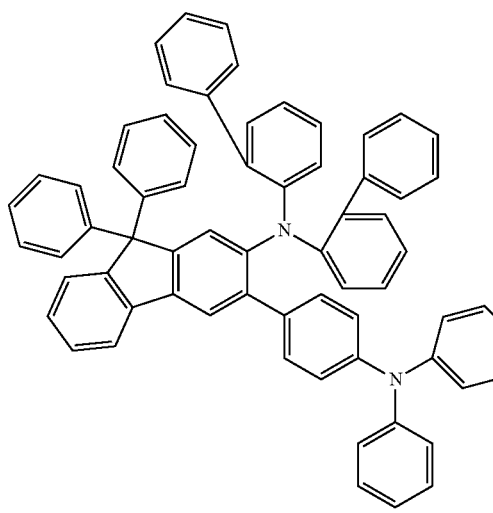

-continued
57
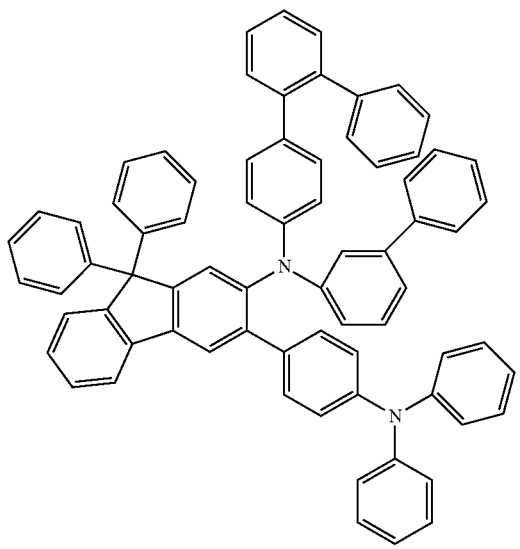
58
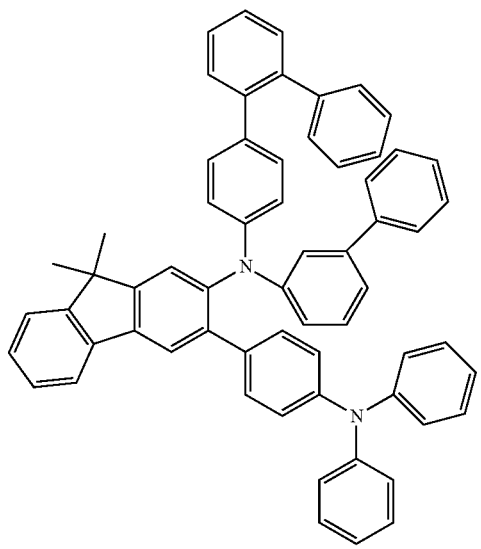
59
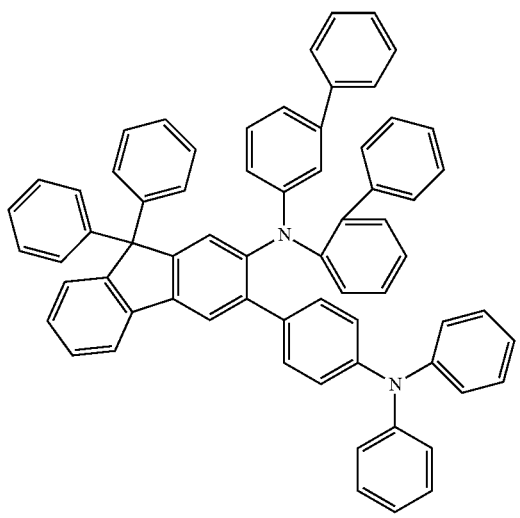
60
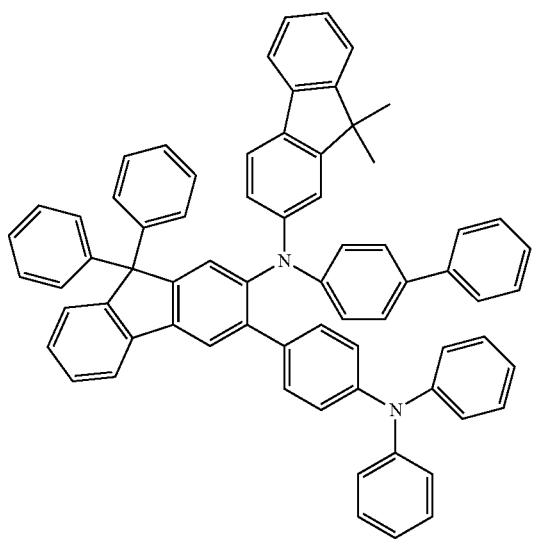
61
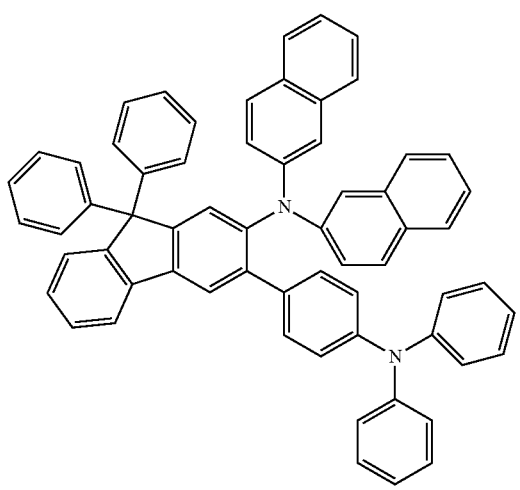
62
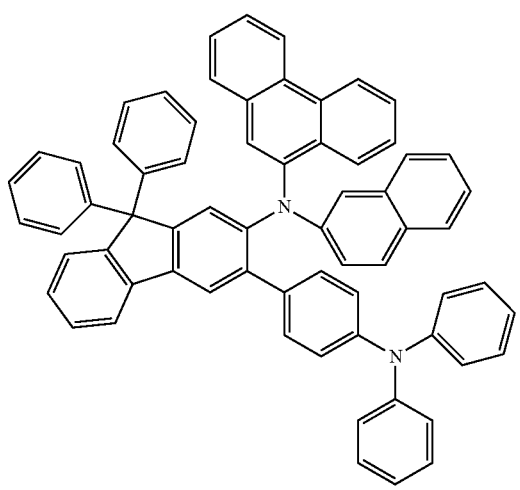

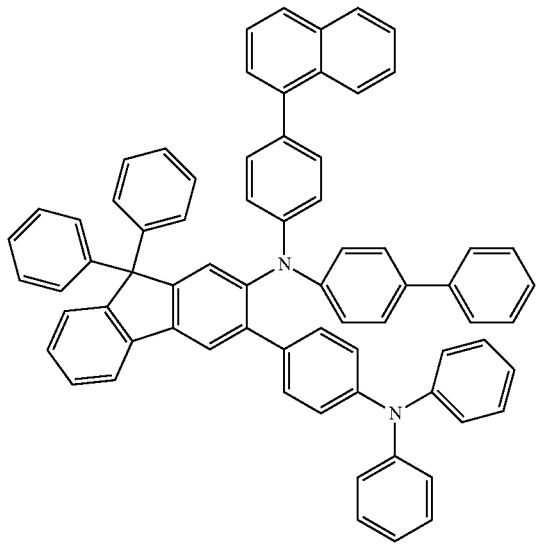

63

When the first layer 322a includes the second compound represented by one or more of the above chemical compound, the organic electric device 320 satisfies one or more of the general formulas 1 to 3 so that it may have a high efficiency or long life.

The second compound is represented by the following chemical formula 10.

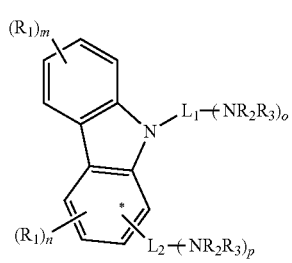

[chemical formula 10]

Hereinafter, chemical formula 10 will be described.

m is an integer from 0 to 4.

n is an integer from 0 to 3.

O and p are each independently 0 or 1, o+p is 1 or more.

$R_1$ is each independently one selected from the group consisting of a deuterium; a tritium; a halogen; a cyano group; a nitro group; a $C_6$-$C_{60}$ aryl group; a fluorenyl group; a $C_2$-$C_{60}$ hetero ring group containing at least one hetero atom from O, N, S, Si and P; a fused ring group of a $C_3$-$C_{60}$ aliphatic ring and a $C_6$-$C_{60}$ aromatic ring; a $C_1$-$C_{50}$ alkyl group; a $C_2$-$C_{20}$ alkenyl group; a $C_2$-$C_{20}$ alkynyl group; a $C_1$-$C_{30}$ alkoxy group; a $C_6$-$C_{30}$ aryloxy group; a $C_3$-$C_{60}$ alkylsilyl group; a $C_{18}$-$C_{60}$ arylsilyl group; and a $C_8$-$C_{60}$ alkylarylsilyl group.

When $R_1$ is the aryl group, it may be each independently the $C_6$-$C_{60}$ aryl group, the $C_6$-$C_{30}$ aryl group or the $C_6$-$C_{12}$ aryl group.

$R_2$ and $R_3$, which may be the same or different, are each independently one selected from the group consisting of a $C_6$-$C_{60}$ aryl group; a fluorenyl group; a $C_2$-$C_{60}$ hetero ring group containing at least one hetero atom from O, N, S, Si and P; a fused ring group of a $C_3$-$C_{60}$ aliphatic ring and a $C_6$-$C_{60}$ aromatic ring; a $C_1$-$C_{50}$ alkyl group.

When $R_2$ and $R_3$ are the aryl groups, they may be each independently the $C_6$-$C_{60}$ aryl group, the $C_6$-$C_{30}$ aryl group or the $C_6$-$C_{30}$ aryl group.

$L_1$ is, i) when p is 1, one selected from the group consisting of a $C_6$-$C_{60}$ arylene group; a fluorylene group; a $C_2$-$C_{60}$ divalent hetero ring group containing at least one heteroatom from O, N, S, Si and P; a divalent fused ring group of a $C_3$-$C_{60}$ aliphatic ring and a $C_6$-$C_{60}$ aromatic ring; a $C_1$-$C_{50}$ alkylene group; a $C_2$-$C_{20}$ alkenylene group; and a $C_2$-$C_{20}$ alkynylene group; ii) when p is 0, one selected from the group consisting of a $C_6$-$C_{60}$ aryl group; a fluorenyl group; a $C_2$-$C_{60}$ hetero ring group containing at least one hetero atom from O, N, S, Si and P; a fused ring group of a $C_3$-$C_{60}$ aliphatic ring and a $C_6$-$C_{60}$ aromatic ring.

When $L_1$ is the aryl group, it may be each independently the $C_6$-$C_{60}$ aryl group, the $C_6$-$C_{30}$ aryl group or the $C_6$-$C_{12}$ aryl group.

When $L_1$ is the arylene group, it may be each independently the $C_6$-$C_{60}$ arylene group, the $C_6$-$C_{30}$ arylene group or the $C_6$-$C_{12}$ arylene group.

$L_2$ is i) when p is 1, one selected from the group consisting of a $C_6$-$C_{60}$ arylene group; a fluorylene group; a $C_2$-$C_{60}$ divalent hetero ring group containing at least one heteroatom from O, N, S, Si and P; a divalent fused ring group of a $C_3$-$C_{60}$ aliphatic ring and a $C_6$-$C_{60}$ aromatic ring; a $C_1$-$C_{50}$ alkylene group; a $C_2$-$C_{20}$ alkenylene group; and a $C_2$-$C_{20}$ alkynylene group; and ii) when p is 0; one selected from the group consisting of a hydrogen; a deuterium; a tritium; a halogen; a cyano group; a nitro group; a $C_6$-$C_{60}$ aryl group; a fluorenyl group; a $C_2$-$C_{60}$ hetero ring group containing at least one hetero atom from O, N, S, Si and P; a fused ring group of a $C_3$-$C_{60}$ aliphatic ring and a $C_6$-$C_{60}$ aromatic ring; a $C_1$-$C_{50}$ alkyl group; a $C_2$-$C_{20}$ alkenyl group; a $C_2$-$C_{20}$ alkynyl group; a $C_1$-$C_{30}$ alkoxy group; a $C_6$-$C_{30}$ aryloxy group; a $C_3$-$C_{60}$ alkylsilyl group; a $C_{18}$-$C_{60}$ arylsilyl group; and a $C_8$-$C_{60}$ alkylarylsilyl group.

When $L_2$ is the aryl group, it may be each independently the $C_6$-$C_{60}$ aryl group, the $C_6$-$C_{30}$ aryl group or the $C_6$-$C_{12}$ aryl group.

When $L_2$ is the arylene group, it may be each independently the $C_6$-$C_{60}$ arylene group, the $C_6$-$C_{30}$ arylene group or the $C_6$-$C_{12}$ arylene group.

in $R_1$ to $R_3$, $L_1$ and $L_2$ of the chemical formula 10, the aryl group, the fluorenyl group, the hetero ring group, the fused ring group, the alkyl group, the alkenyl group, the alkynyl group, the alkoxy group, the aryloxy group, the alkylsilyl group, the arylsilyl group, the alkylarylsilyl group, the arylene group, the fluorylene group, the alkylene group, the alkenylene group and the alkynylene group may each be further substituted with at least one substituent selected from the group consisting of a deuterium; a nitro group; a cyano group; a halogen; an amino group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{20}$ aryl group; a $C_6$-$C_{20}$ aryl group substituted with the deuterium; a fluorenyl group; a $C_2$-$C_{20}$ hetero ring group; a $C_3$-$C_{60}$ alkylsilyl group; a $C_{18}$-$C_{60}$ arylsilyl group; and a $C_8$-$C_{60}$ alkylarylsilyl group.

Since the organic electric element 320 includes the first layer 322a including the above-described first and second compounds, it satisfies one or more of the general formulas 1 to 3 so that it may have a high efficiency or long life.

The second chemical compound is represented by one or more of the following chemical formula 11 and formula 12.

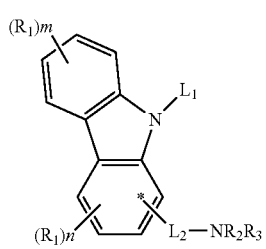

[chemical formula 11]

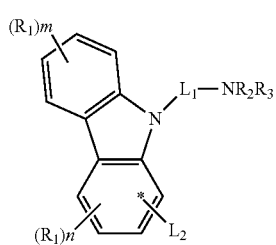

[chemical formula 12]

Hereafter the chemical formula 11 and the chemical formula 12 will be described.

m is an integer from 0 to 4.

n is an integer from 0 to 3.

$R_1$ is each independently one selected from the group consisting of a deuterium; a tritium; a halogen; a cyano group; a nitro group; a $C_6$-$C_{60}$ aryl group; a fluorenyl group; a $C_2$-$C_{60}$ hetero ring group containing at least one hetero atom from O, N, S, Si and P; a fused ring group of a $C_3$-$C_{60}$ aliphatic ring and a $C_6$-$C_{60}$ aromatic ring; a $C_1$-$C_{50}$ alkyl group; a $C_2$-$C_{20}$ alkenyl group; a $C_2$-$C_{20}$ alkynyl group; a $C_1$-$C_{30}$ alkoxy group; a $C_6$-$C_{30}$ aryloxy group; a $C_3$-$C_{60}$ alkylsilyl group; a $C_{18}$-$C_{60}$ arylsilyl group; and a $C_8$-$C_{60}$ alkylarylsilyl group.

When $R_1$ is the aryl group, it may be each independently the $C_6$-$C_{60}$ aryl group, the $C_6$-$C_{30}$ aryl group or the $C_6$-$C_{12}$ aryl group.

$R_2$ and $R_3$, which may be the same or different, are each independently one selected from the group consisting of a $C_6$-$C_{60}$ aryl group; a fluorenyl group; a $C_2$-$C_{60}$ hetero ring group containing at least one hetero atom from O, N, S, Si and P; a fused ring group of a $C_3$-$C_{60}$ aliphatic ring and a $C_6$-$C_{60}$ aromatic ring; a $C_1$-$C_{50}$ alkyl group.

When $R_2$ and $R_3$ are the aryl groups, they may be each independently the $C_6$-$C_{60}$ aryl group, the $C_6$-$C_{30}$ aryl group or the $C_6$-$C_{30}$ aryl group.

In the chemical formula 11, $L_1$ is one selected from the group consisting of a $C_6$-$C_{60}$ aryl group; a fluorenyl group; a $C_2$-$C_{60}$ hetero ring group containing at least one hetero atom from O, N, S, Si and P; a fused ring group of a $C_3$-$C_{60}$ aliphatic ring and a $C_6$-$C_{60}$ aromatic ring.

When $L_1$ is the aryl group, it may be each independently the $C_6$-$C_{60}$ aryl group, the $C_6$-$C_{30}$ aryl group or the $C_6$-$C_{12}$ aryl group.

In the chemical formula 11, $L_2$ is one selected from the group consisting of a $C_6$-$C_{60}$ arylene group; a fluorylene group; a $C_2$-$C_{60}$ divalent hetero ring group containing at least one heteroatom from O, N, S, Si and P; a divalent fused ring group of a $C_3$-$C_{60}$ aliphatic ring and a $C_6$-$C_{60}$ aromatic ring; a $C_1$-$C_{50}$ alkylene group; a $C_2$-$C_{20}$ alkenylene group; and a $C_2$-$C_{20}$ alkynylene group.

When $L_2$ is the arylene group, it may be each independently the $C_6$-$C_{60}$ arylene group, the $C_6$-$C_{30}$ arylene group or the $C_6$-$C_{12}$ arylene group.

In the chemical formula 12, $L_1$ is one selected from the group consisting of a $C_6$-$C_{60}$ arylene group; a fluorylene group; a $C_2$-$C_{60}$ divalent hetero ring group containing at least one heteroatom from O, N, S, Si and P; a divalent fused ring group of a $C_3$-$C_{60}$ aliphatic ring and a $C_6$-$C_{60}$ aromatic ring; a $C_1$-$C_{50}$ alkylene group; a $C_2$-$C_{20}$ alkenylene group; and a $C_2$-$C_{20}$ alkynylene group.

When $L_1$ is the aryl group, it may be each independently the $C_6$-$C_{60}$ aryl group, the $C_6$-$C_{30}$ aryl group or the $C_6$-$C_{12}$ aryl group.

In the chemical formula 12, $L_2$ is one selected from the group consisting of a $C_6$-$C_{60}$ aryl group; a fluorenyl group; a $C_2$-$C_{60}$ hetero ring group containing at least one hetero atom from O, N, S, Si and P; a fused ring group of a $C_3$-$C_{60}$ aliphatic ring and a $C_6$-$C_{60}$ aromatic ring.

When $L_2$ is the aryl group, it may be each independently the $C_6$-$C_{60}$ aryl group, the $C_6$-$C_{30}$ aryl group or the $C_6$-$C_{12}$ aryl group.

In $R_1$ to $R_3$, $L_1$ and $L_2$ of the chemical formula 11 and the chemical formula 12, the aryl group, the fluorenyl group, the hetero ring group, the fused ring group, the alkyl group, the alkenyl group, the alkynyl group, the alkoxy group, the aryloxy group, the alkylsilyl group, the arylsilyl group, the alkylarylsilyl group, the arylene group, the fluorylene group, the divalent fused ring group, the divalent fused ring group may each be further substituted with at least one substituent selected from the group consisting of a deuterium; a nitro group; a cyano group; a halogen; an amino group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{20}$ aryl group; a $C_6$-$C_{20}$ aryl group substituted with the deuterium; a fluorenyl group; a $C_2$-$C_{20}$ hetero ring group; a $C_3$-$C_{60}$ alkylsilyl group; a $C_{18}$-$C_{60}$ arylsilyl group; and a $C_8$-$C_{60}$ alkylarylsilyl group.

When the second compound is represented by one or more of the chemical formula 11 and the chemical formula 12, for example, the first layer includes one compound (G) represented by chemical formula 11 and one compound (H) represented by chemical formula 12, it means that all the two compounds (G, H) are included in the first compound.

Since the organic electric element 320 includes the first layer 322a including the second compound represented by one or more of the chemical formulas 11 and 12, it satisfies one or more of the general formulas 1 to 3 so that it may have a high efficiency or long life.
The second chemical compound may be one or more of the following chemical compounds.
4-1
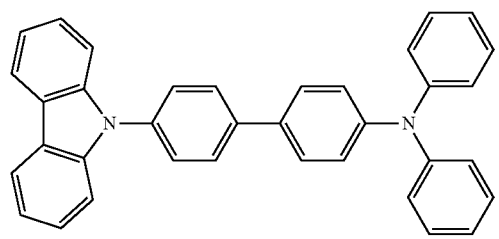
4-2
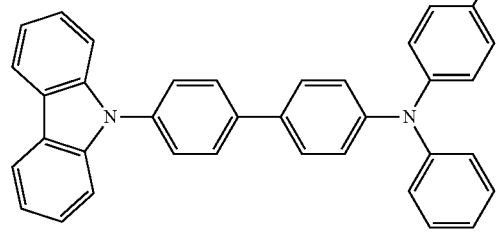
4-3
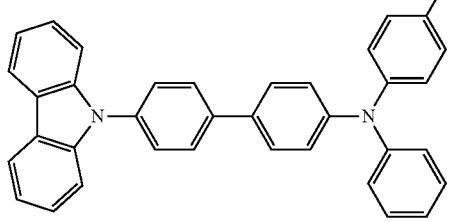
4-4
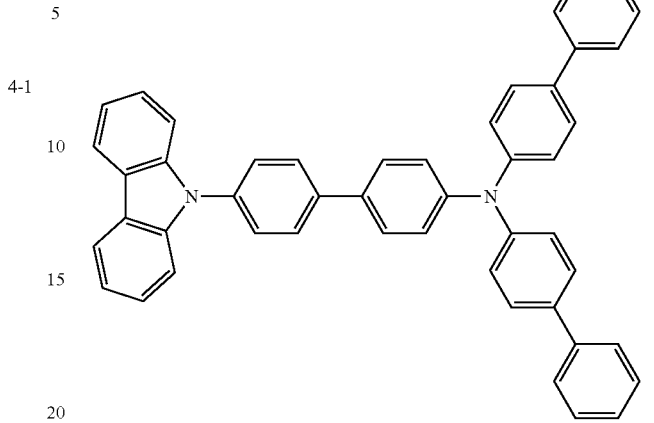
4-5
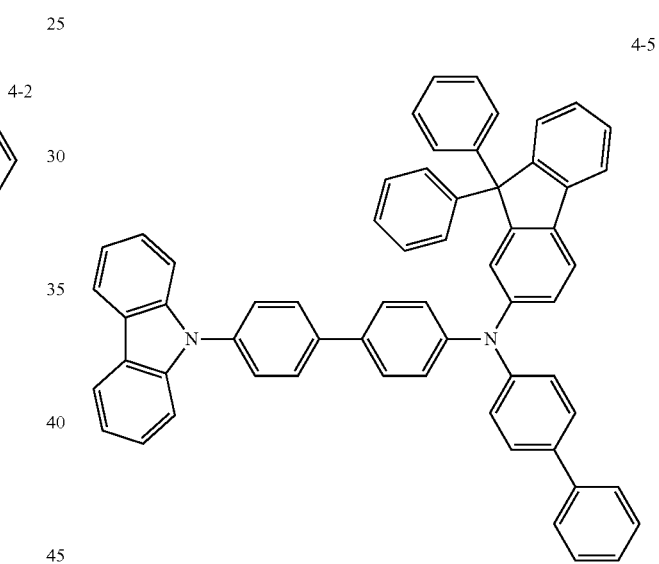
4-6
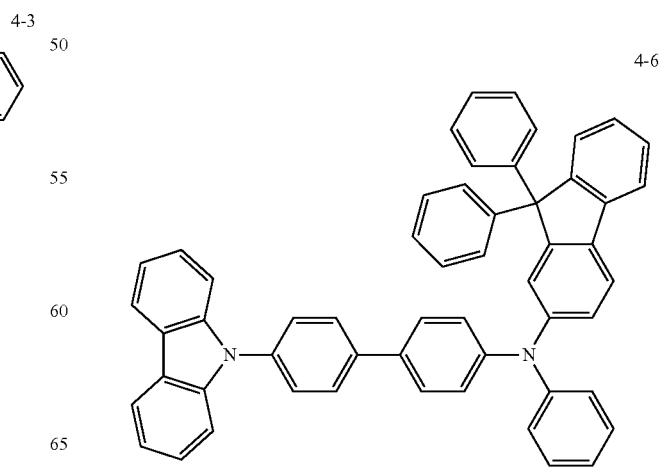

4-7
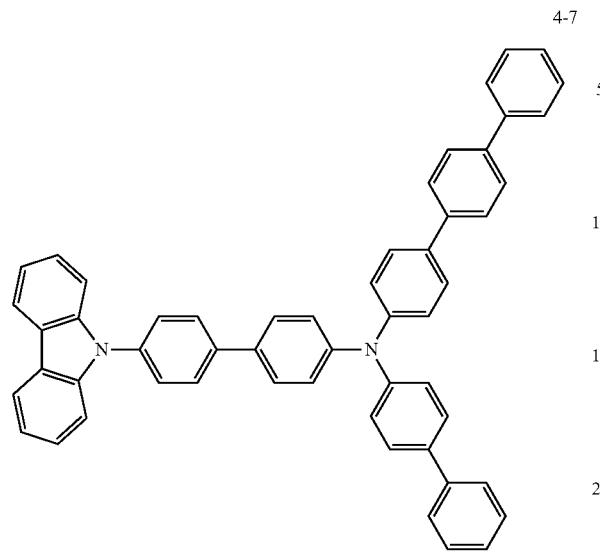
4-8
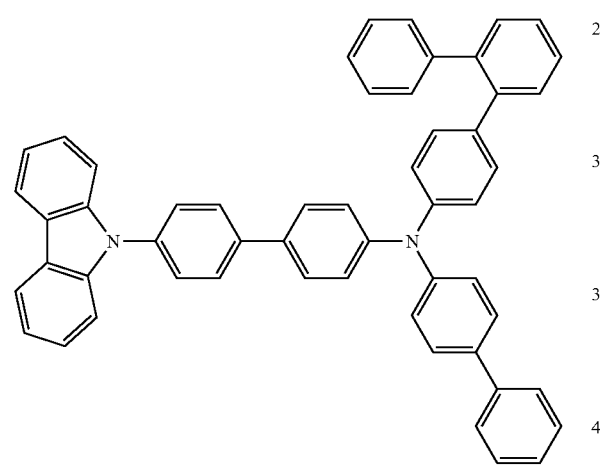
4-9
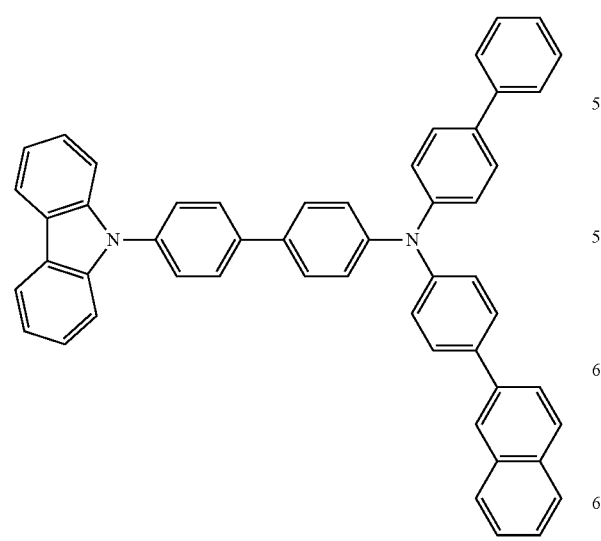
4-10
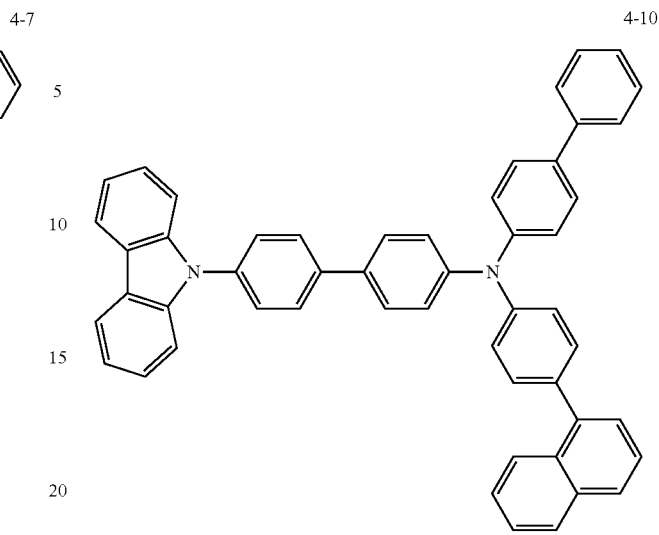
4-11
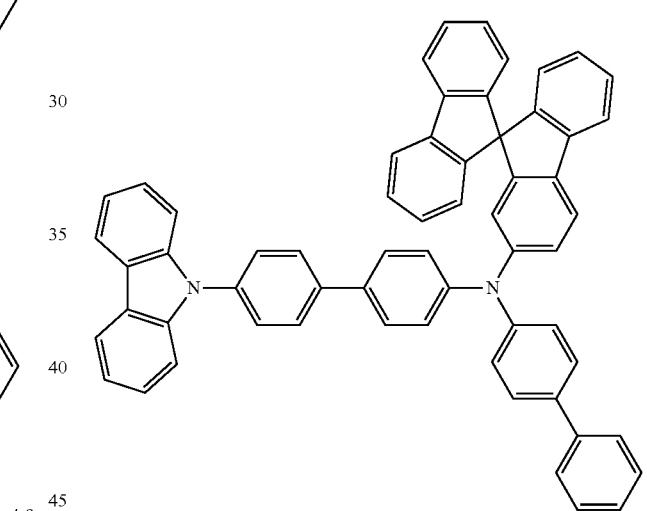
4-12
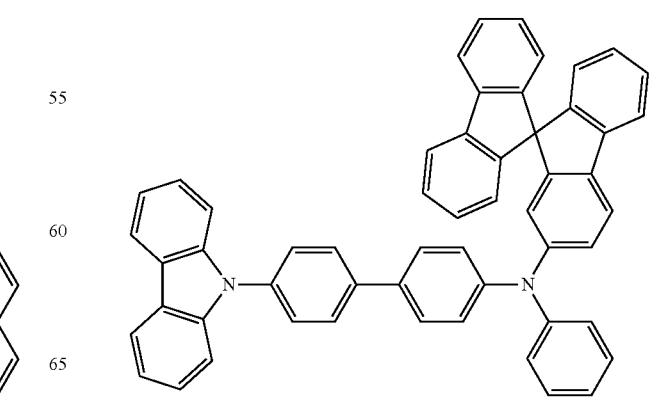

4-13
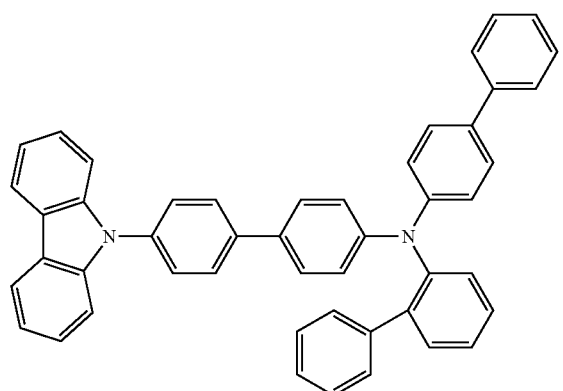
4-16
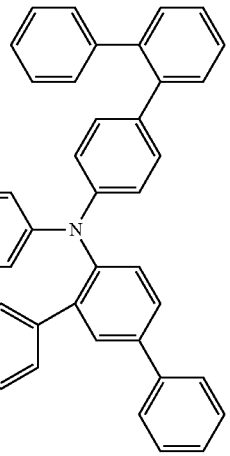
4-14
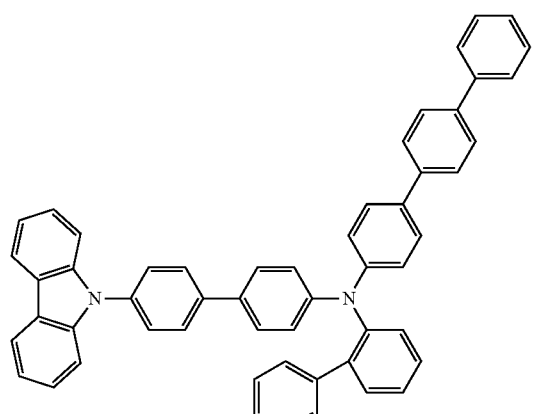
4-17
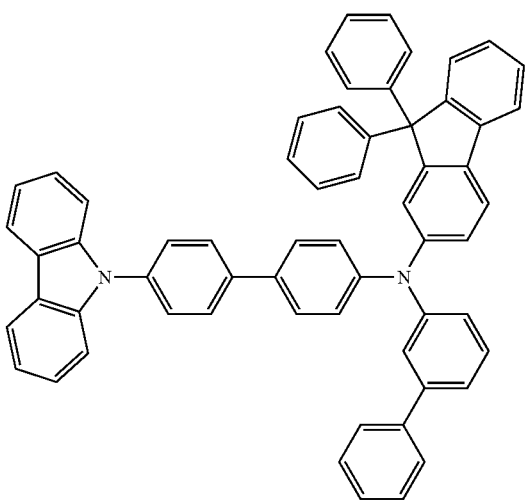
4-15
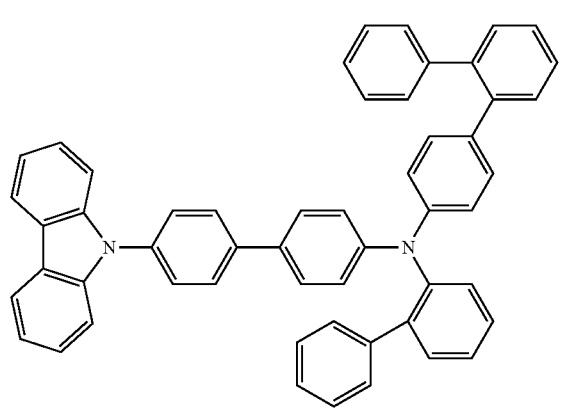
4-18
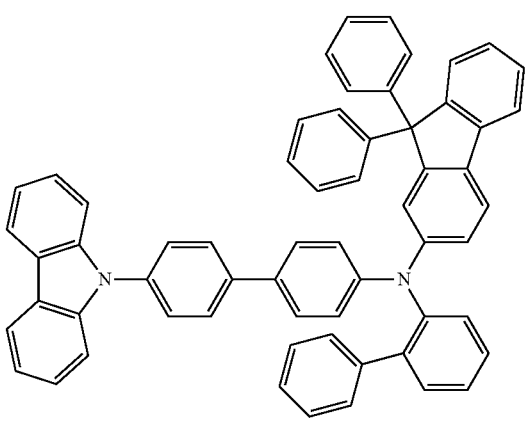

4-19
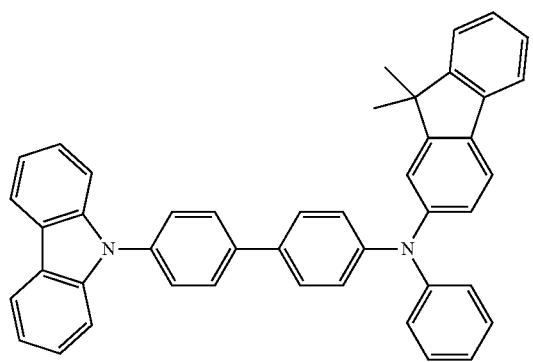
4-20
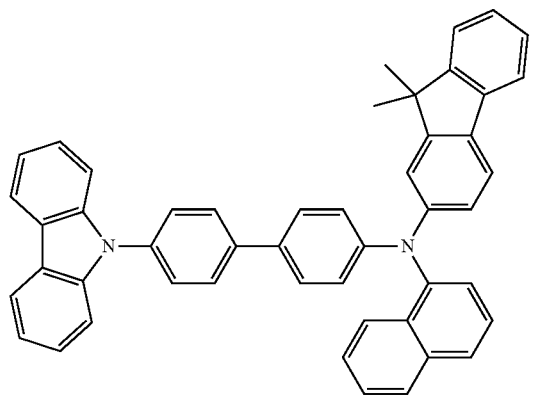
4-21
4-22
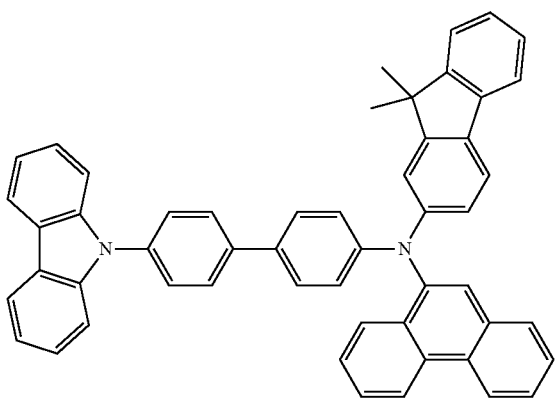
4-23
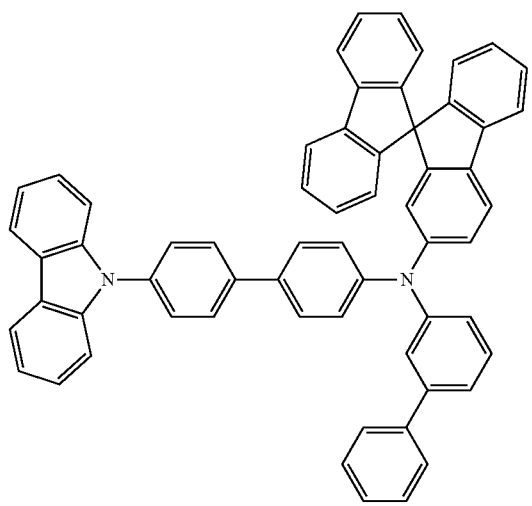
4-24
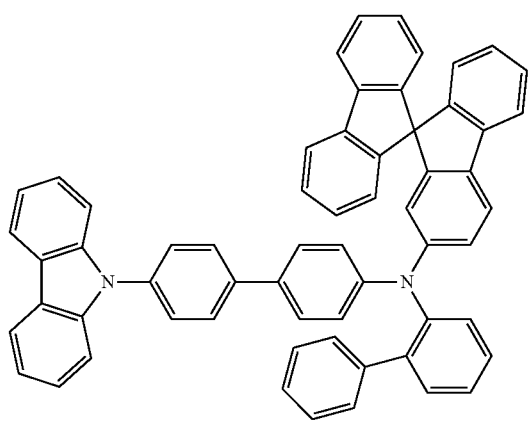

-continued
4-25
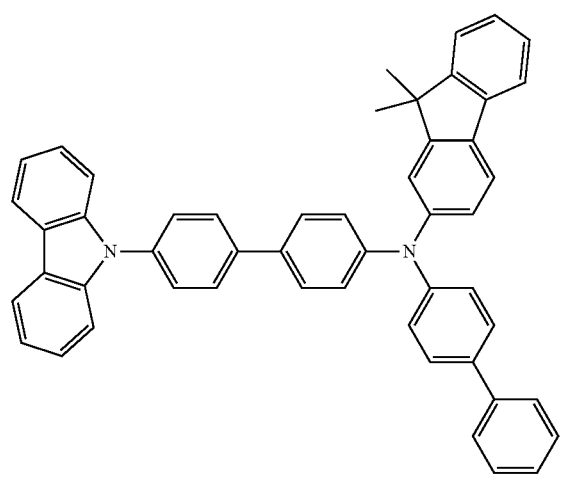
4-26
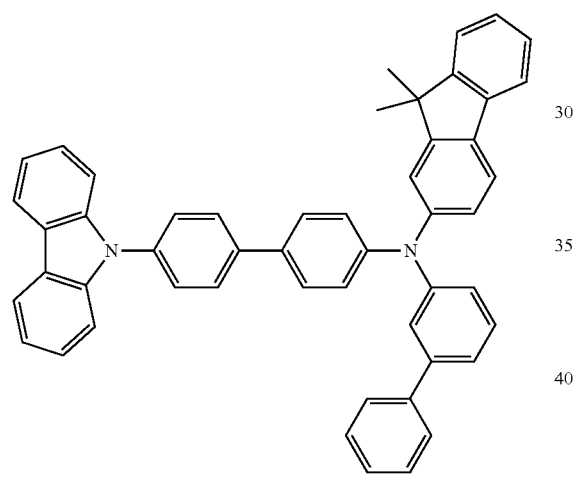
4-27
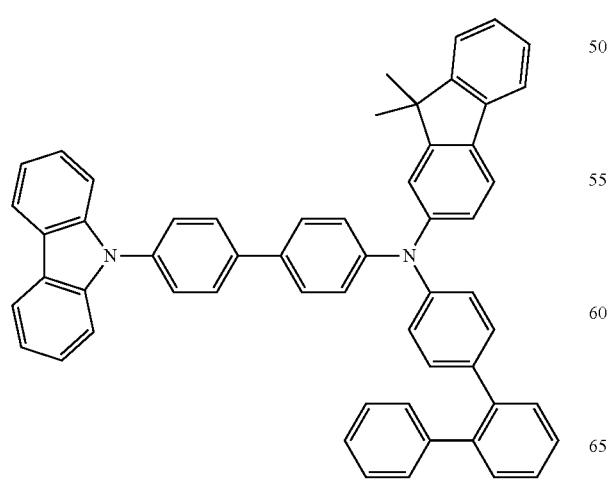
4-28
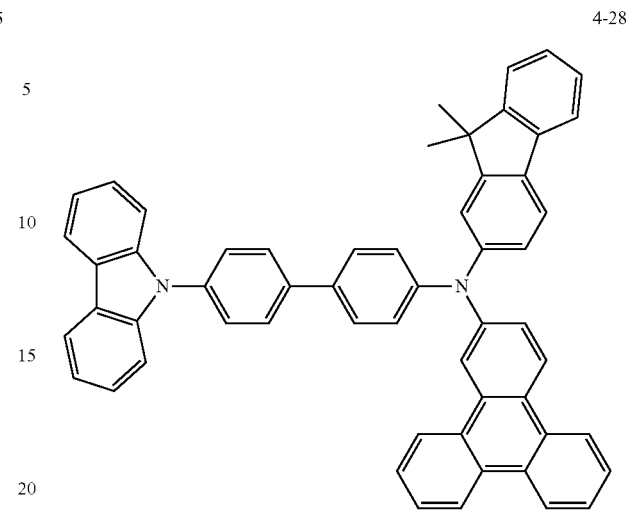
4-29
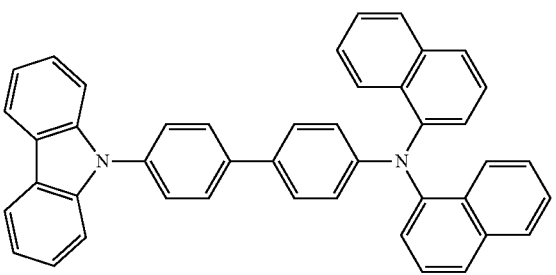
4-30
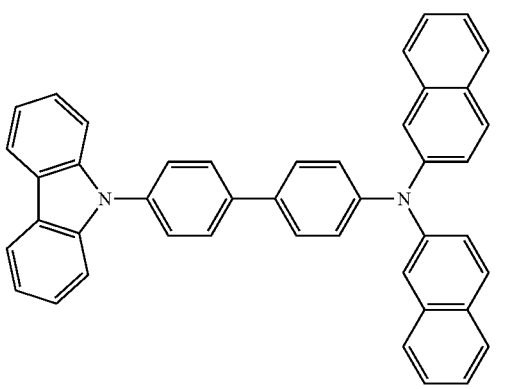

5-1
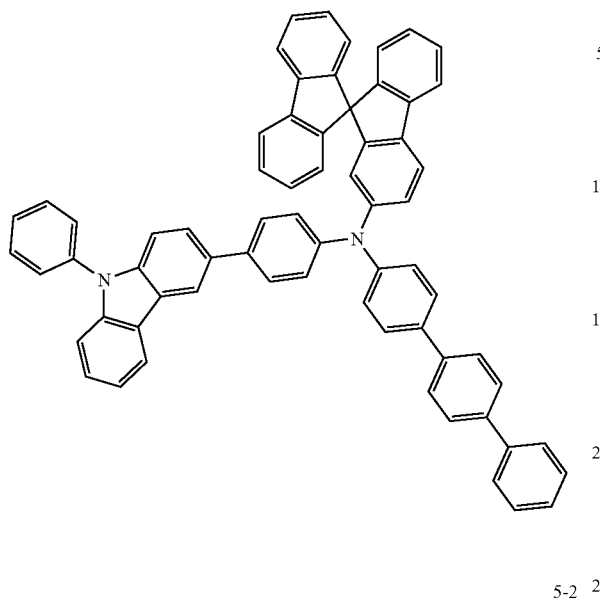
5-4
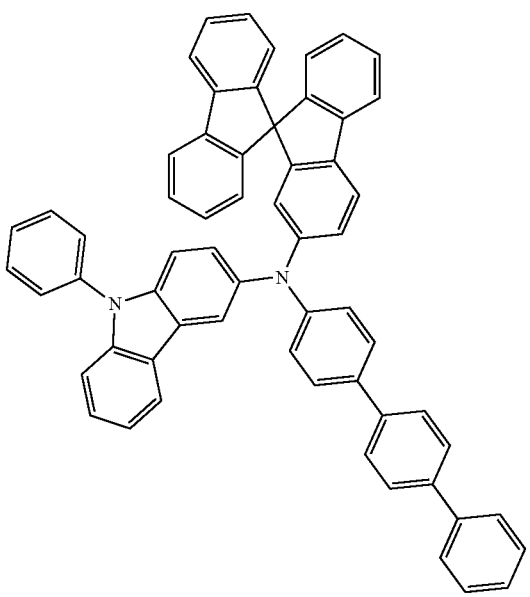
5-2
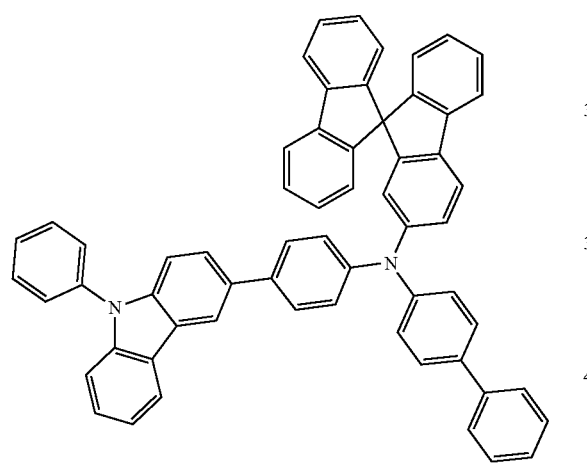
5-3
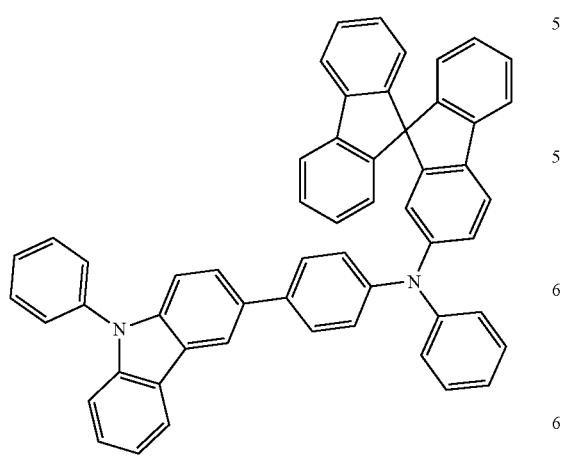
5-5
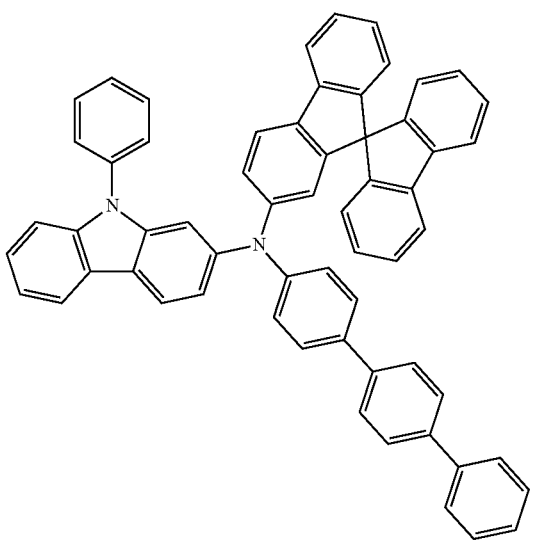

5-6
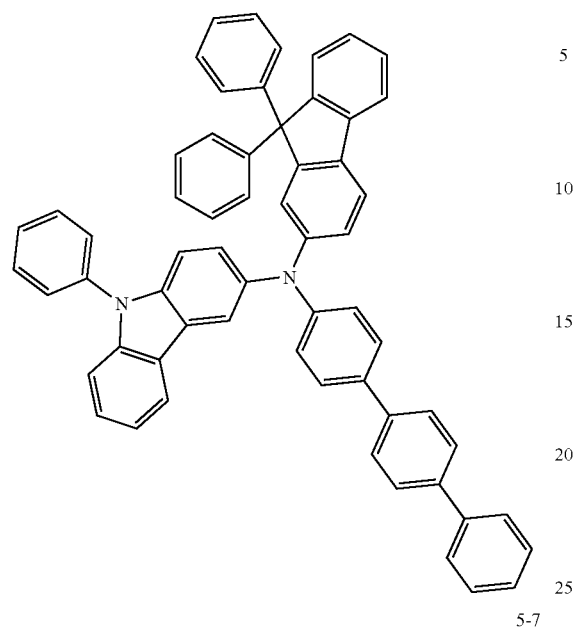
5-7
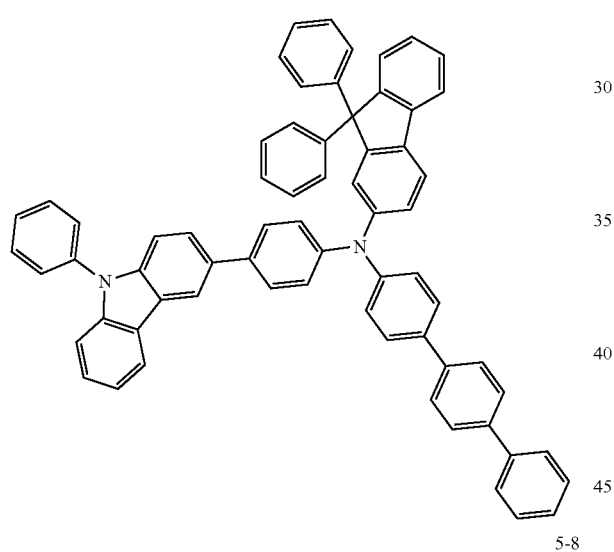
5-8
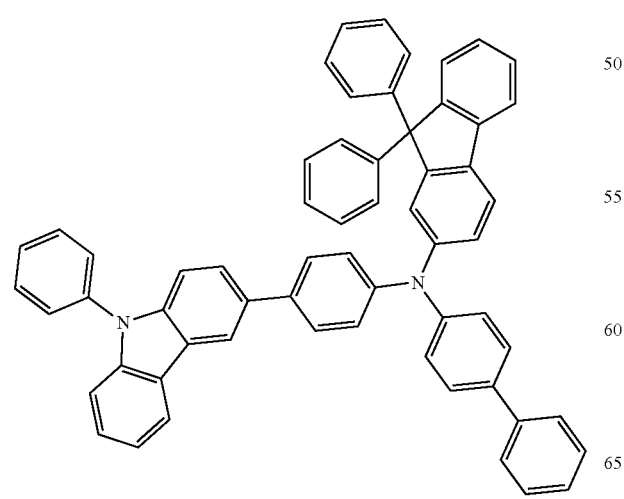
5-9
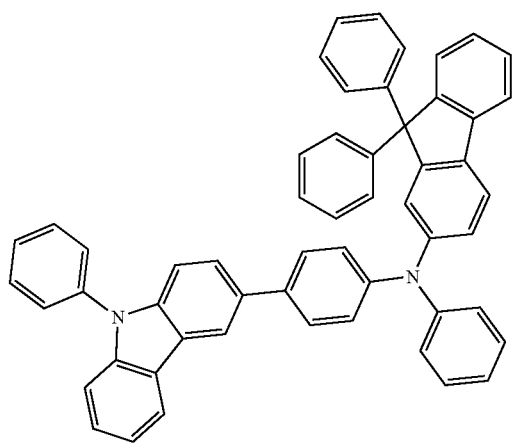
5-10
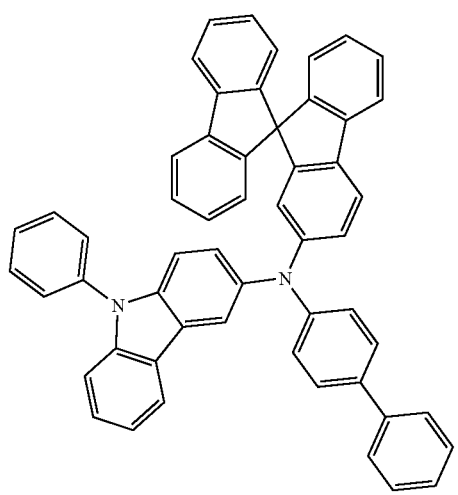
5-11
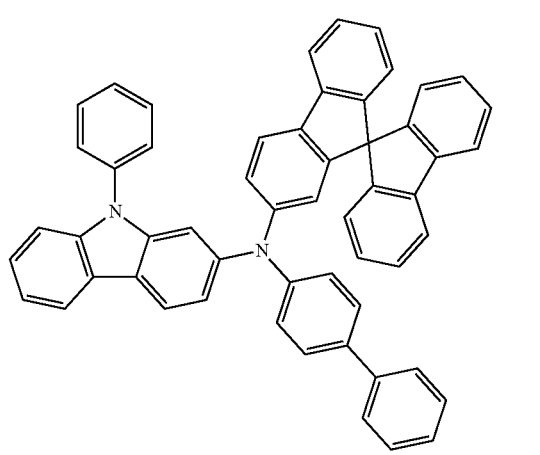

5-12
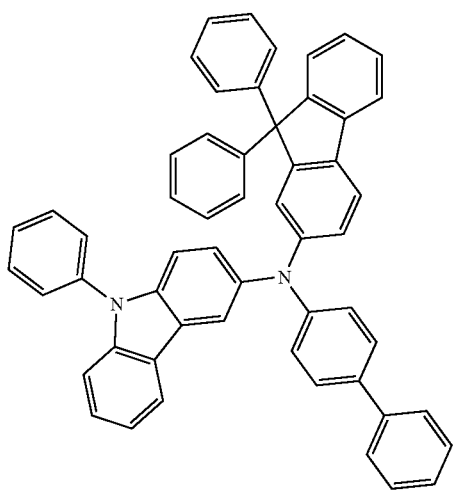
5-13
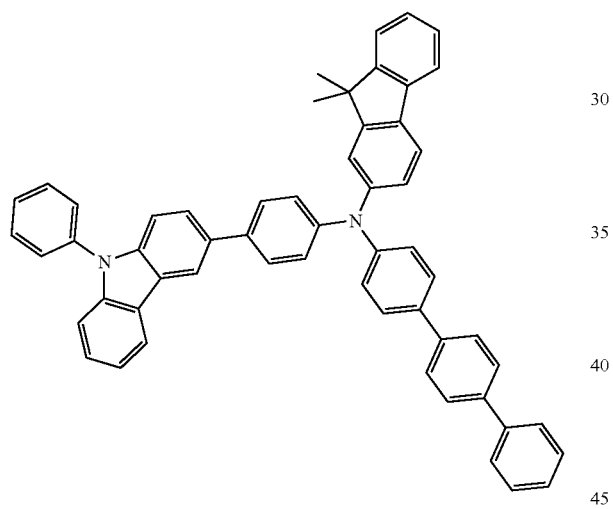
5-14
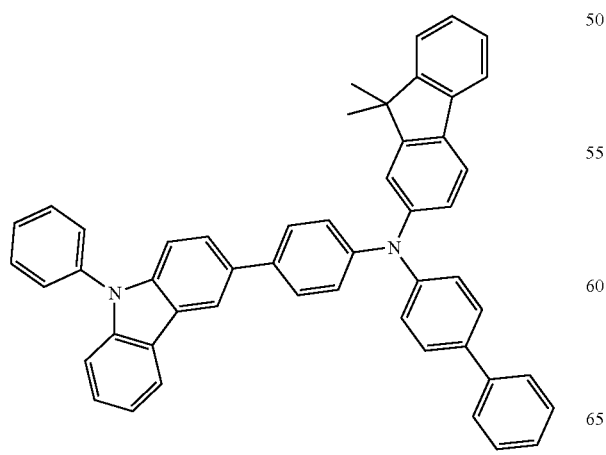
5-15
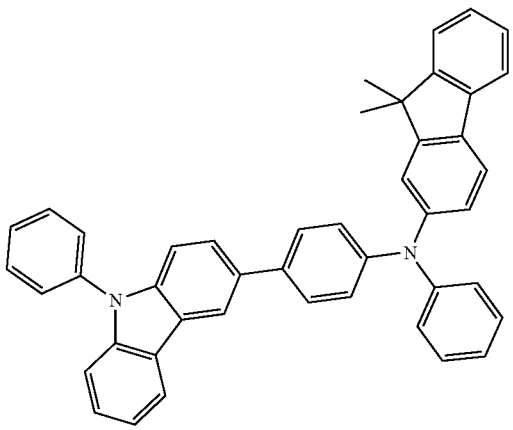
5-16
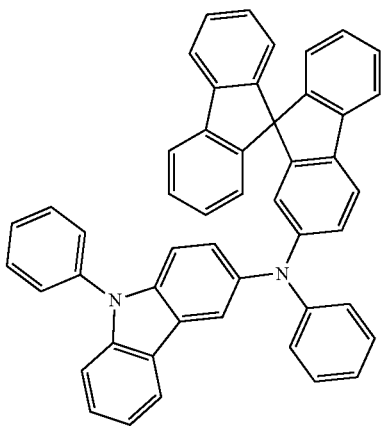
5-17
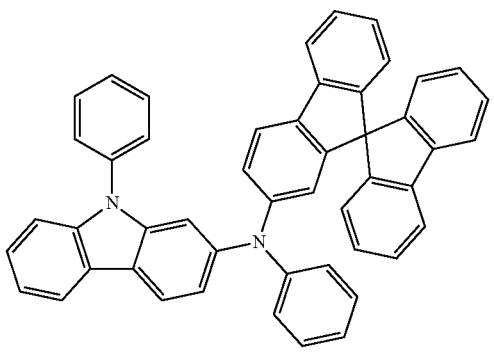

-continued
5-18
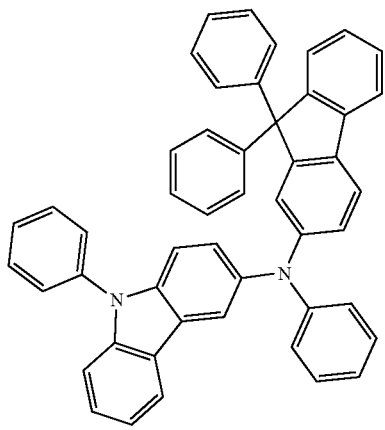
5-21
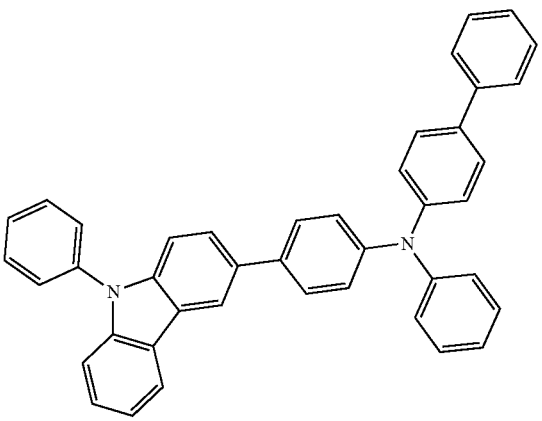
5-19
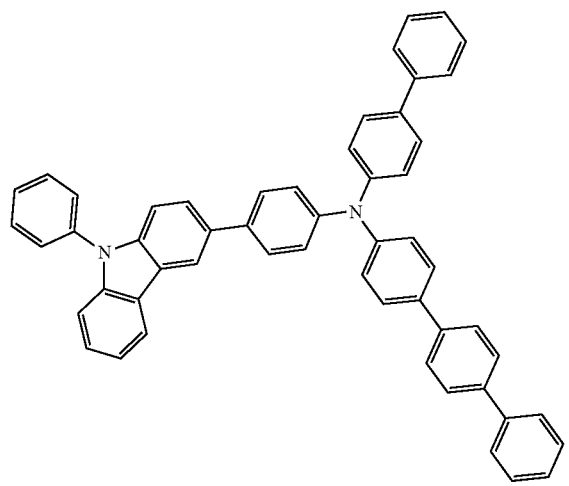
5-22
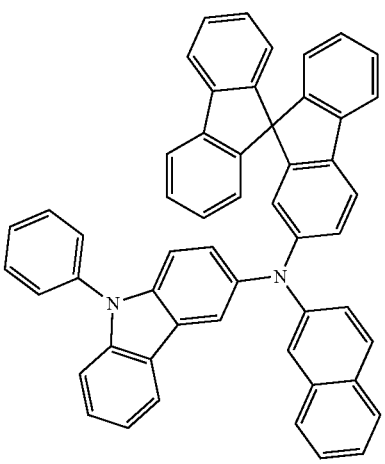
5-20
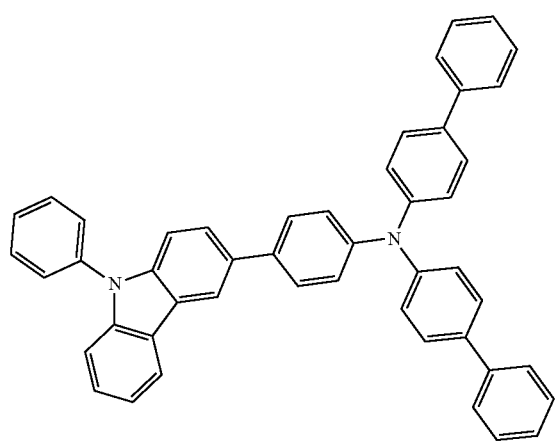
5-23
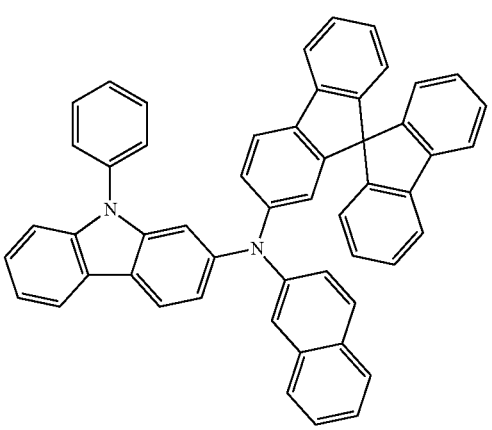

-continued 5-24

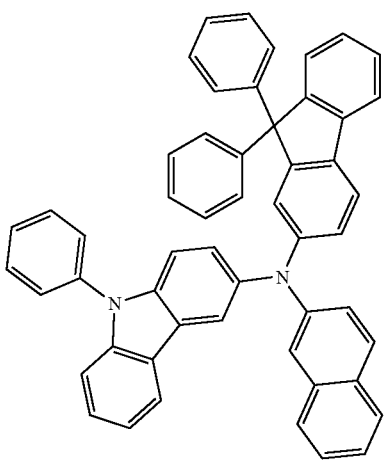

When the first layer 322a includes the second compound represented by one or more of the above chemical compound, the organic electric element 320 satisfies one or more of the general formulas 1 to 3 so that it may have a high efficiency or long life.

Figure 5:
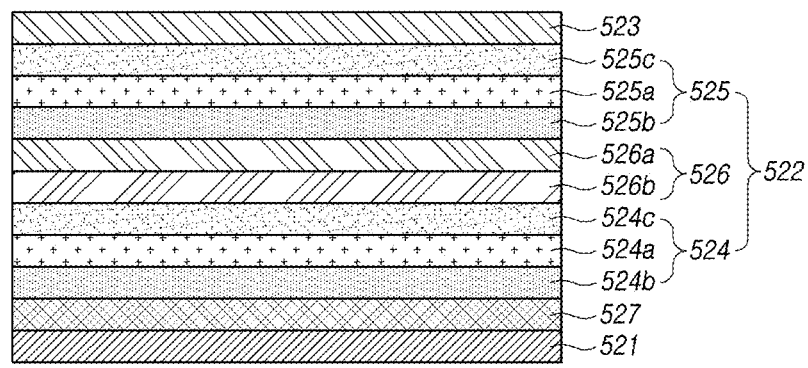
FIG. 5 is a schematic cross-sectional view of an organic electric element according to embodiments.
Figure 6:
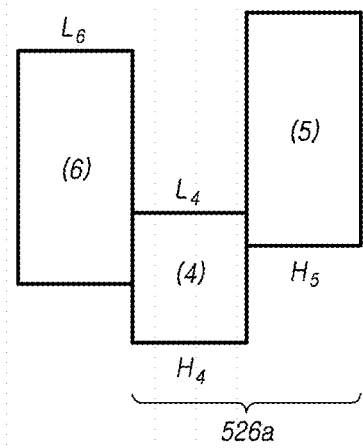
FIG. 6 is a view for explaining the energy level of the layers included in the organic layer of the organic electric element according to embodiments.

FIG. 5 is a schematic cross-sectional view of an organic electric element according to embodiments.

Referring to FIG. 5, an organic electric element 520 according to the embodiments includes a first electrode 521 and a second electrode 523, an organic layer 522 positioned therebetween.

The first electrode 521 may be an anode and the second electrode 523 may be a cathode. In the case of an inverted type, the first electrode 521 may be a cathode and the second electrode 523 may be an anode.

For example, the first electrode 521 may be a transparent electrode, and the second electrode 523 may be a reflective electrode. In another example, the first electrode 521 may be a reflective electrode, and the second electrode 523 may be a transparent electrode.

The organic layer 522 may include a plurality of layers which is located between the first electrode 521 and the second electrode 523 and includes an organic material.

The organic layer 522 includes a first stack 524, a second stack 525, and a charge generating layer 526 positioned between the first stack 524 and the second stack 525.

The organic electric element 520 may be a tandem organic electric element including a plurality of stacks each including a light emitting layer. The plurality of light emitting layers may be made of the same material as each other, or may be made of different materials from each other.

The first stack 524 includes a first emitting layer 524a. The first emitting layer 524a may include, for example, a host material and a dopant.

The first stack 524 may further include a first hole transport layer 524b and a first electron transport layer 524b.

The first hole transport layer 524b may be positioned between the first light emitting layer 524a and one of the first electrode 321 and the second electrode 523 as an anode electrode. The first electron transport layer 524c may be positioned between the first light emitting layer 524a and one of the first electrode 321 and the second electrode 523 as a cathode electrode. For example, when the first electrode 321 is the anode electrode and the second electrode 523 is the cathode electrode, the first hole transport layer 524b may be positioned on the first electrode 521, the first light emitting layer 524a may be positioned on the first hole transport layer 524b, and the first electron transport layer 324c may be positioned on the first light emitting layer 524a.

The second stack 525 includes a second emitting layer 525a. The second emitting layer 325a may include, for example, a host material and a dopant.

The second stack 525 may further include a second hole transport layer 525b and a second electron transport layer 524b.

The second hole transport layer 525b may be positioned between the second light emitting layer 525a and one of the first electrode 521 and the second electrode 523 as an anode electrode. The second electron transport layer 525c may be positioned between the second light emitting layer 524a and one of the first electrode 521 and the second electrode 523 as a cathode electrode. For example, when the first electrode 521 is the anode electrode and the second electrode 523 is the cathode electrode, the second hole transport layer 525b may be positioned on the second electrode 521, the second light emitting layer 525a may be positioned on the second hole transport layer 525b, and the second electron transport layer 524c may be positioned on the second light emitting layer 525a.

Since the first stack 524 and the second stack 525 are configured as described above, holes and electrons transmitted from the first electrode 521 and the second electrode 523 are recombined with each other in the first and second light emitting layers 524a and 232 so that tight may be emitted from by recombination the first and second light emitting layers 524a and 232.

The charge generating layer 526 is formed between a plurality of light emitting layers to smoothly distribute charges so that it may increase the current efficiency of the light emitting layer. Accordingly, the charge generating layer 526 is positioned between the first stack 524 including the first light emitting layer 524a and the second stack 525 including the second light emitting layer 525a.

The charge generating layer 526 may include a p-type charge generating layer and an n-type charge generating layer in order to smoothly distribute charges. For example, the second layer 526a may be a p-type charge generating layer and the third layer 526b may be an n-type charge generating layer. When the first electrode 521 is the anode electrode and the second electrode 523 is the cathode electrode, the p-type charge generating layer may be located on the cathode electrode side and the n-type charge generating layer may be located on the anode side. For example, the second layer 526a may be positioned between the second layer 526b and the second electrode 523 which is a cathode electrode.

Although FIG. 5 shows the tandem organic electric element including two stacks, the embodiment is not limited to the tandem organic electric element including two stacks, and includes tandem organic electric element including two or more stacks. When the organic electrical element 520 further includes a stack, a charge generating layer may be additionally positioned between the additionally included stack and one of the adjacent first stack 524 and the second stack 525.

The organic electric element 520 may include a hole injection layer 527. The hole injection layer 527 may be positioned between the first electrode 521 as an anode electrode and the first light emitting layer 524a. For example, the hole injection layer 527 may be positioned between the first electrode 521 as an anode electrode and the first hole transport layer 524b.

Although not illustrated in FIG. 5, the organic electric element 520 may further include an electron injection layer. For example, the electron injection layer may be positioned between the second electrode 523 as a cathode electrode, and the second electron transport layer 525c.

In another example, each of the first stack 524 and the second stack 525 may further include one or more of a hole injection layer and an electron injection layer. Within each stack, the hole injection layer may be located between the light emitting layer and the anode electrode, and an electron injection layer may be located between the light emitting layer and the cathode electrode.

The second layer 526a includes a fourth compound and a fifth compound. The second layer 526a may be one layer including the fourth compound and the fifth compound, or may be composed of a plurality of layers each containing one or more of the fourth compound and the fifth compound. For example, the second layer 526a may include a fourth compound layer including the fourth compound and a fifth compound layer including the fifth compound. In FIG. 5, the second layer 526a is illustrated as one layer, but the second layer 526a of the embodiments is not limited to a single layer structure.

For example, the fourth compound may be a p-type dopant, and the fifth compound may be a p-type host. The first hole transport layer 524b may include the fourth compound, and the second hole transport layer 525b may also include the fourth compound. Further, the hole injection layer may also include the fourth compound.

The third layer 526b includes a sixth compound. For example, the sixth compound can be an n-type dopant or an n-type host.

The organic electric element 520 satisfies the following general formulas 4 to 6.

$L_6-L_4 \leq 2.1$ eV [general formula 4]

$L_6-H_5 \leq 2.8$ eV [general formula 5]

$0.32$ eV$\leq L_4-H_5 \leq 0.8$ eV [general formula 6]

In the general formulas 4 to 6, $L_6$ is the LUMO (Lowest Unoccupied Molecular Orbital) energy level of the sixth compound.

$L_4$ is the LUMO (Lowest Unoccupied Molecular Orbital) energy level of the fourth compound, and $H_5$ is the HOMO (Highest Occupied Molecular Orbital) energy level of the fifth compound.

embodiments may provide a display panel comprising a subpixel comprising the organic electric element.

According to another aspect, embodiments may provide a display device comprising the display panel and a driving circuit for driving the display panel.

The upper limit of $L_6-L_4$ defined in the general formula 4 may be 1.8 eV or less, or 1.4 eV or less.

The upper limit of $L_6-H_5$ defined in the general formula 5 may be 2.4 eV or less, or 2.0 eV or less.

The upper limit of $L_4-H_5$ defined in the general formula 6 may be o.6 eV or less, or 0.5 eV or less.

The organic electric device 320 satisfies one or more of the general formulas 4 to 6 so that it may have a high efficiency or long life.

Matters for the fourth chemical compound are the same as those described for the first chemical compound described above, unless otherwise specified. Therefore, the fourth compound may also be represented by the chemical formula 1 or the like. Further, the fourth chemical compound may be selected from among the chemical compounds listed above as being selected as the first chemical compound.

Matters for the fifth compound are the same as those described for the second compound described above, unless otherwise specified. Therefore, the fifth compound may also be represented by Chemical Formula 7 or the like. Further, the fifth compound may be selected from among the compounds listed above as being able to be selected as the second chemical compound.

The third layer includes a sixth compound. The sixth compound may be represented by the following chemical formula 13.

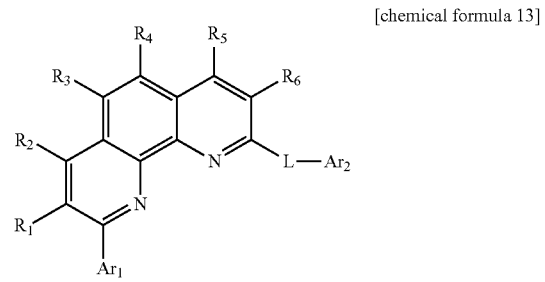

[chemical formula 13]

Hereinafter, the chemical formula 13 will be described.

$R_1$ to $R_6$, which are same or different, are each independently one selected from the group consisting of a hydrogen; a deuterium; a tritium; a halogen; a cyano group; a nitro group; a $C_6$-$C_{60}$ aryl group; a fluorenyl group; a $C_2$-$C_{60}$ hetero ring group containing at least one hetero atom from O, N, S, Si and P; a fused ring group of a $C_3$-$C_{60}$ aliphatic ring and a $C_6$-$C_{60}$ aromatic ring; a $C_1$-$C_{50}$ alkyl group; a $C_2$-$C_{20}$ alkenyl group; a $C_2$-$C_{20}$ alkynyl group; a $C_1$-$C_{30}$ alkoxy group; a $C_6$-$C_{30}$ aryloxy group; a $C_3$-$C_{60}$ alkylsilyl group; a $C_{18}$-$C_{60}$ arylsilyl group; and a $C_8$-$C_{60}$ alkylarylsilyl group, and one or more of $R_1$ to $R_6$ is the cyano group.

When $R_1$ to $R_6$ are the aryl groups, they may be each independently a $C_6$-$C_{60}$ aryl group, a $C_6$-$C_{30}$ aryl group or a $C_6$-$C_{12}$ aryl group.

When $R_1$ to $R_6$ are the hetero ring group containing at least one hetero atom from O, N, S, Si and P, they may be each independently the $C_6$-$C_{60}$ hetero ring group, the $C_6$-$C_{50}$ hetero ring group or the $C_6$-$C_{40}$ hetero ring group.

$Ar_1$ and $Ar_2$, which are same or different, are each independently one selected from the group consisting of a hydrogen; a deuterium; a tritium; a halogen; a cyano group; a nitro group; a $C_6$-$C_{60}$ aryl group; a fluorenyl group; a $C_2$-$C_{60}$ hetero ring group containing at least one hetero atom from O, N, S, Si and P; a fused ring group of a $C_3$-$C_{60}$ aliphatic ring and a $C_6$-$C_{60}$ aromatic ring; a $C_1$-$C_{50}$ alkyl group; a $C_2$-$C_{20}$ alkenyl group; a $C_2$-$C_{20}$ alkynyl group; a $C_1$-$C_{30}$ alkoxy group; a $C_6$-$C_{30}$ aryloxy group; a $C_3$-$C_{60}$ alkylsilyl group; a $C_{18}$-$C_{60}$ arylsilyl group; and a $C_8$-$C_{60}$ alkylarylsilyl group, and one or more of $R_1$ to $R_6$ is the cyano group.

When $Ar_1$ to $Ar_6$ are the aryl groups, they may be each independently a $C_6$-$C_{60}$ aryl group, a $C_6$-$C_{50}$ aryl group or a $C_6$-$C_{40}$ aryl group.

When $Ar_1$ to $Ar_6$ are the hetero ring group containing at least one hetero atom from O, N, S, Si and P, they may be each independently the $C_6$-$C_{60}$ hetero ring group, the $C_6$-$C_{50}$ hetero ring group or the $C_6$-$C_{40}$ hetero ring group.

L is one selected from the group consisting of a $C_6$-$C_{60}$ arylene group; a fluorylene group; a $C_2$-$C_{60}$ divalent hetero ring group containing at least one heteroatom from O, N, S, Si and P; a divalent fused ring group of a $C_3$-$C_{60}$ aliphatic ring and a $C_6$-$C_{60}$ aromatic ring.

In $R_1$ to $R_6$, $Ar_1$, $Ar_2$ and L of the chemical formula 13, the aryl group, the fluorenyl group, the hetero ring group, the fused ring group, the alkyl group, the alkenyl group, the alkynyl group, the alkoxy group, the aryloxy group, the alkylsilyl group, the arylsilyl group, the alkylarylsilyl group, the arylene group, the fluorylene group, the divalent fused ring group, the divalent fused ring group may each be further substituted with at least one substituent selected from the group consisting of a deuterium; a nitro group; a cyano group; a halogen; an amino group; a $C_1$-$C_{20}$ alkoxyl group; a $C_1$-$C_{20}$ alkyl group; a $C_2$-$C_{20}$ alkenyl group; a $C_2$-$C_{20}$ alkynyl group; a $C_6$-$C_{20}$ aryl group; a $C_6$-$C_{20}$ aryl group substituted with the deuterium; a fluorenyl group; a $C_2$-$C_{20}$ hetero ring group; a $C_3$-$C_{60}$ alkylsilyl group; a $C_{10}$-$C_{60}$ arylsilyl group; and a $C_8$-$C_{60}$ alkylarylsilyl group.

Since the organic electric element 520 includes the second layer 526a including the fourth compound and the fifth compound and the third layer 326b including the sixth compound, it satisfies one or more of the general formulas 4 to 6 so that it may have a high efficiency or long life.

The sixth chemical compound is one or more of the following chemical compounds.

E01

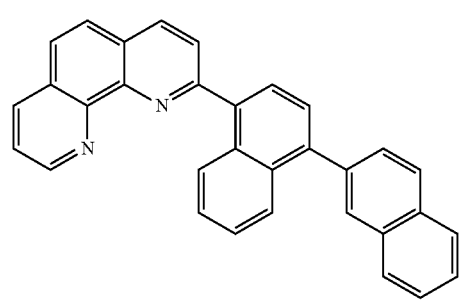

E02

E03

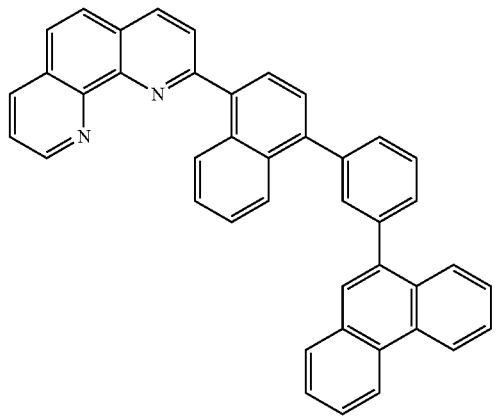

E04

E05

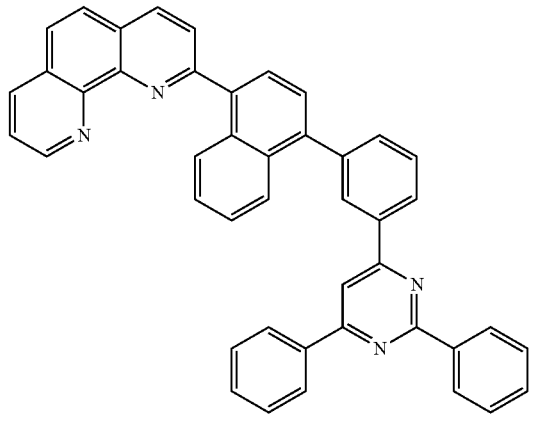

E06

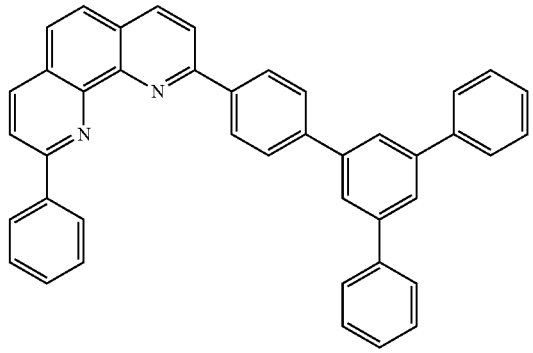

E07

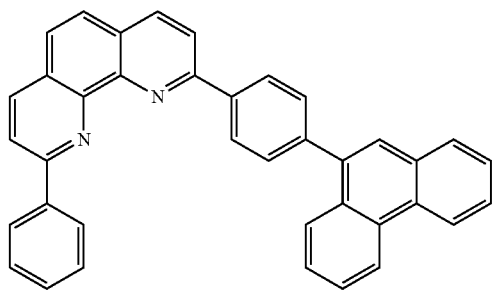

E08
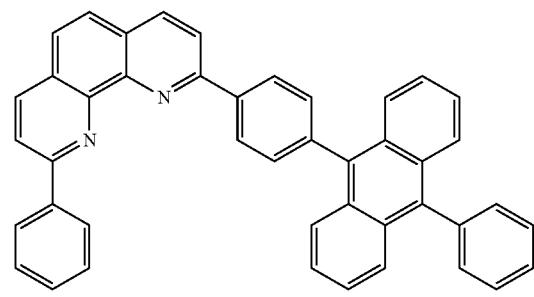
E09
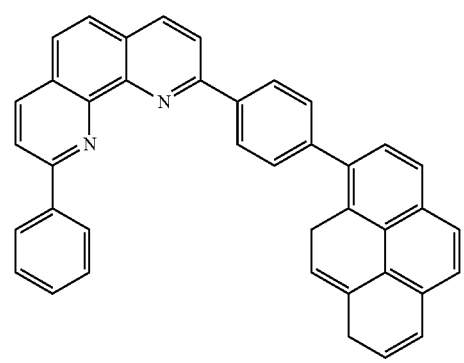
E10
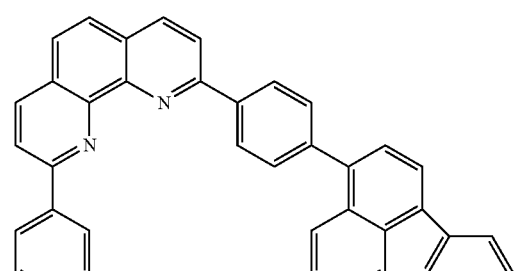
E11
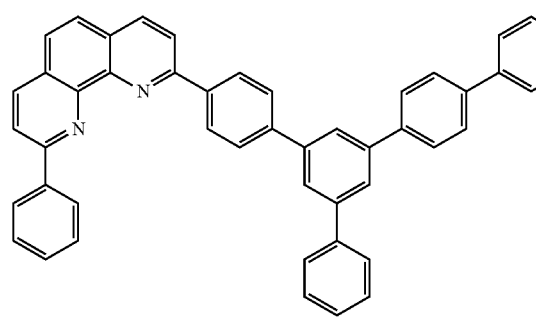
E12
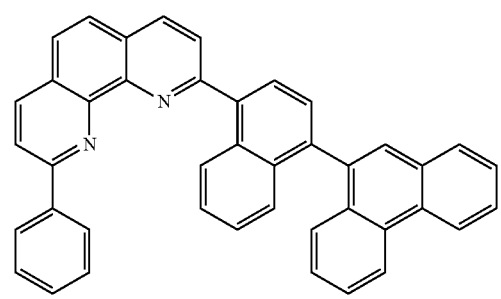
E13
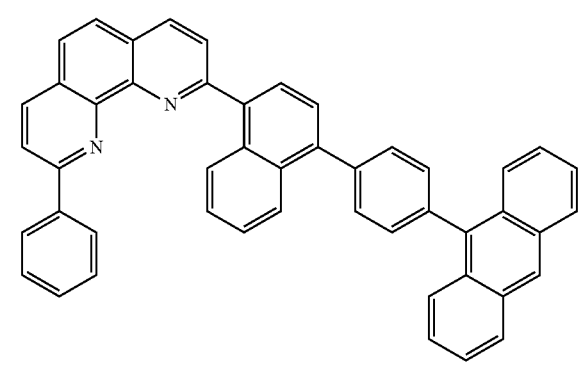
E14
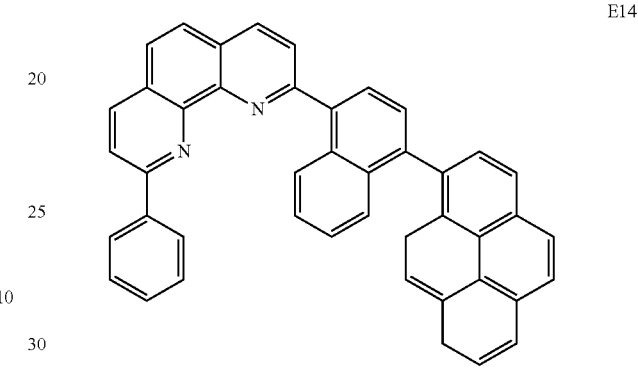
E15
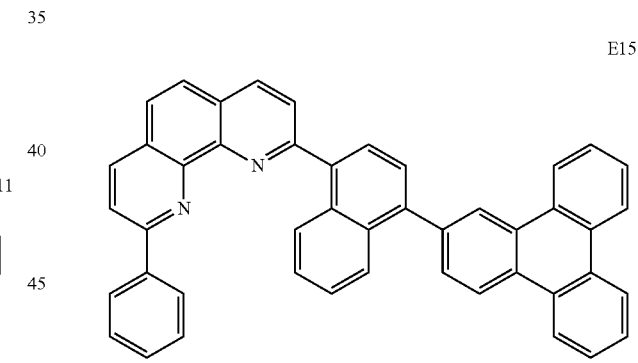
E16
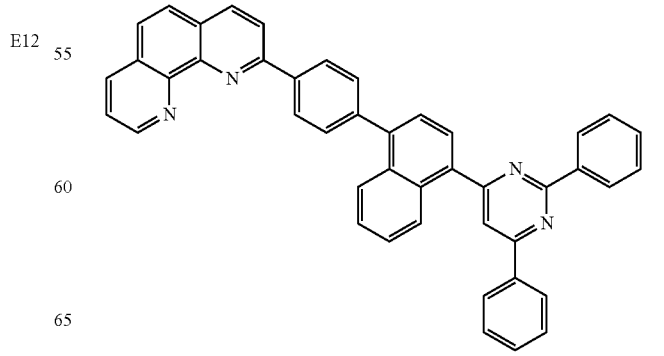

E17
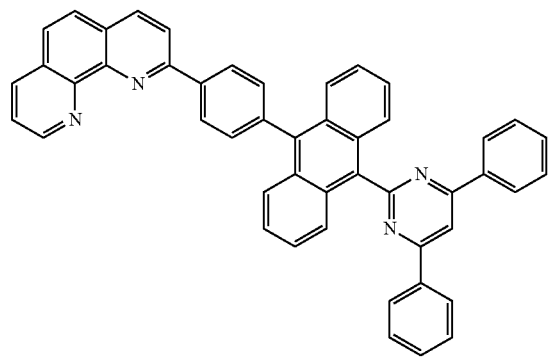
E18
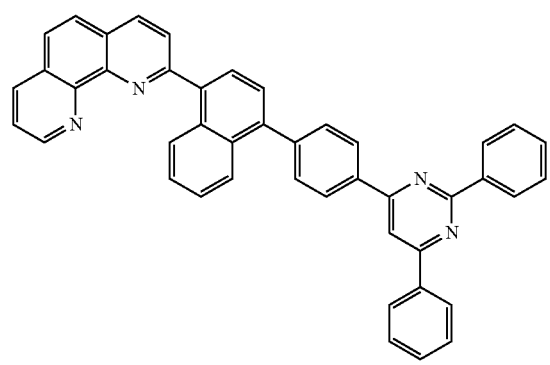
E19
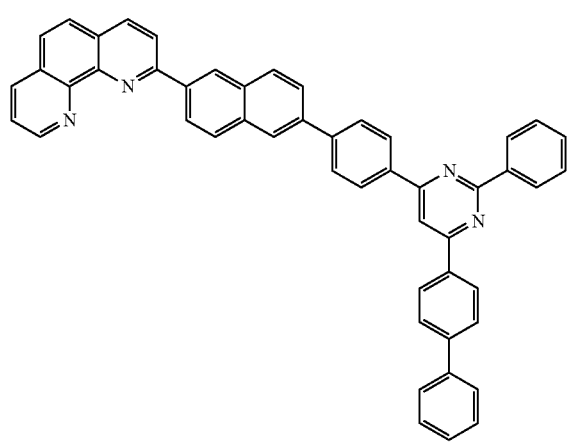
E20
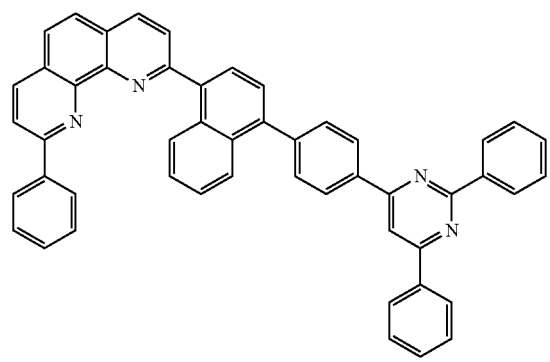
E21
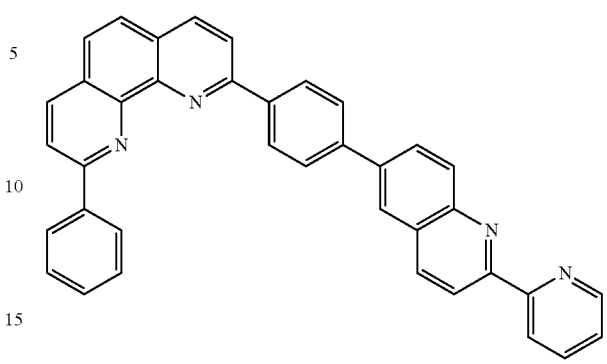
E22
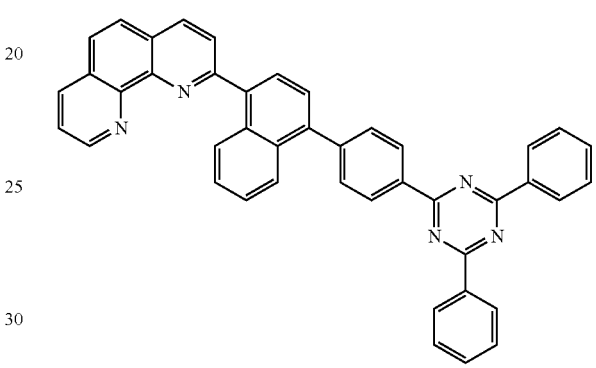
E23
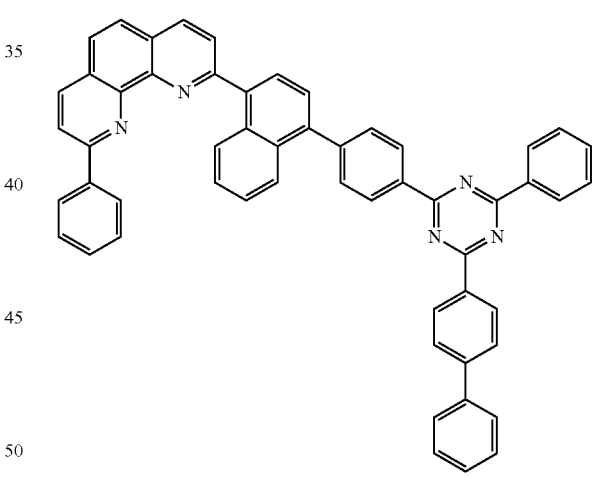
E24
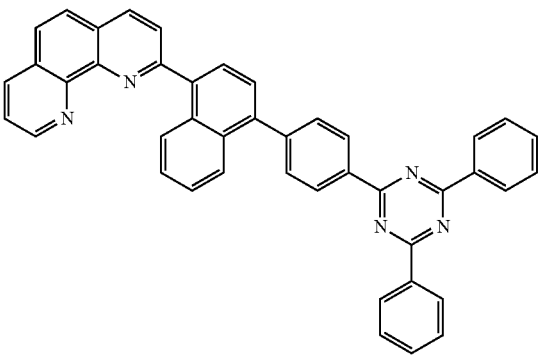

E25
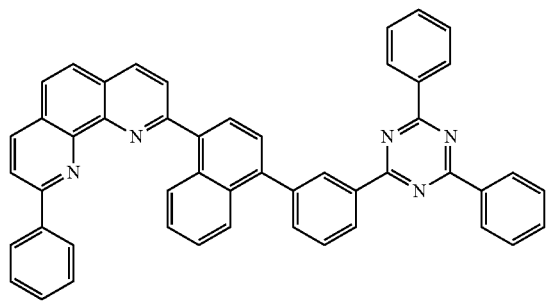
E26
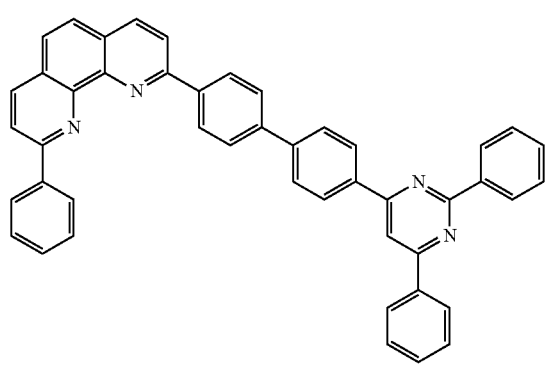
E27
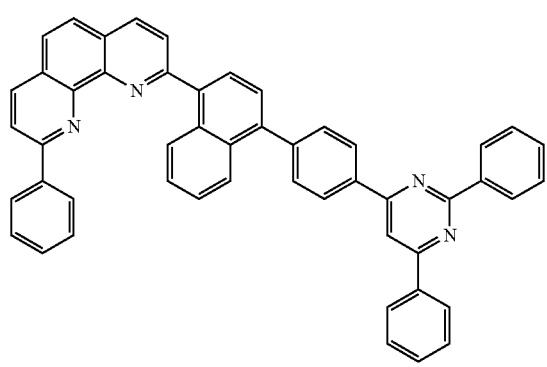
E28
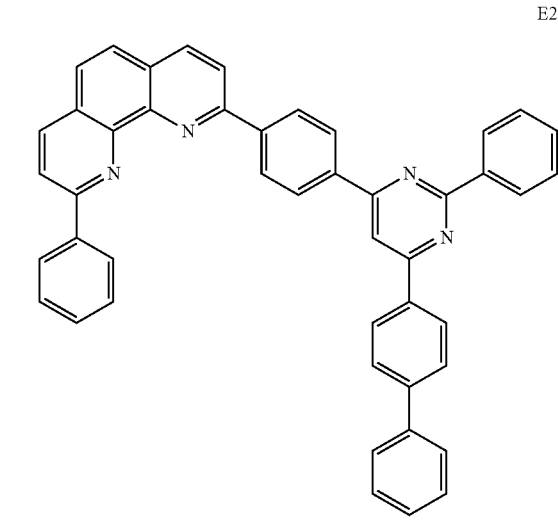
E29
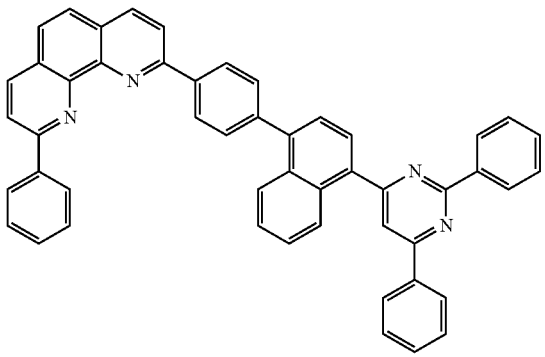
E30
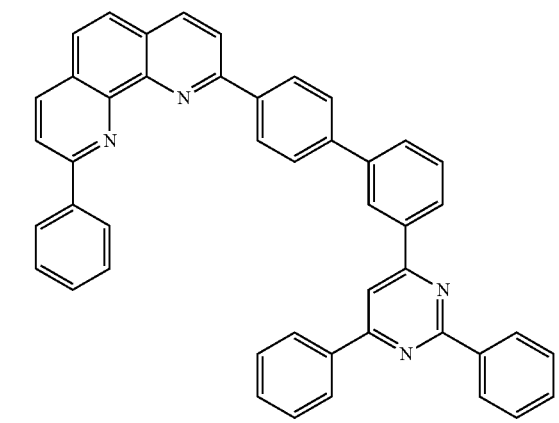
E31
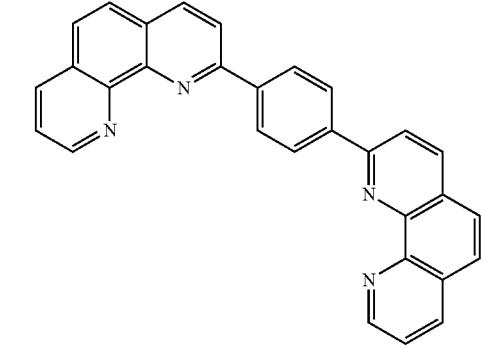
E32
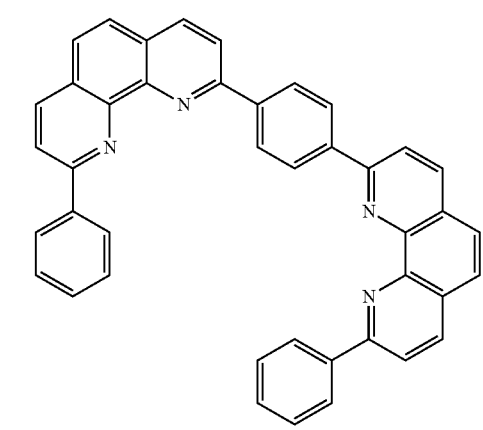

E33
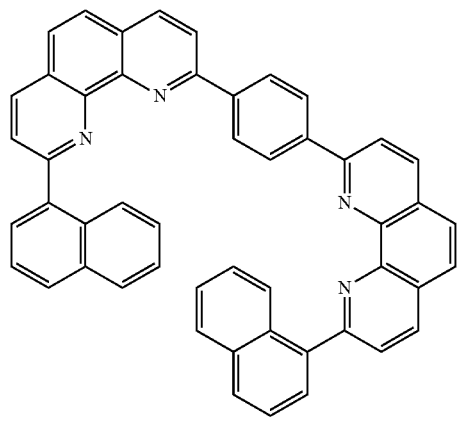
E34
E35
E36
E37
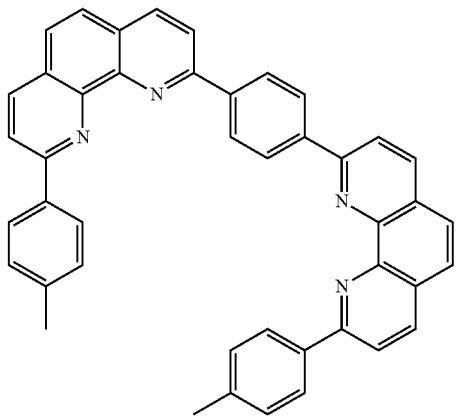
E38
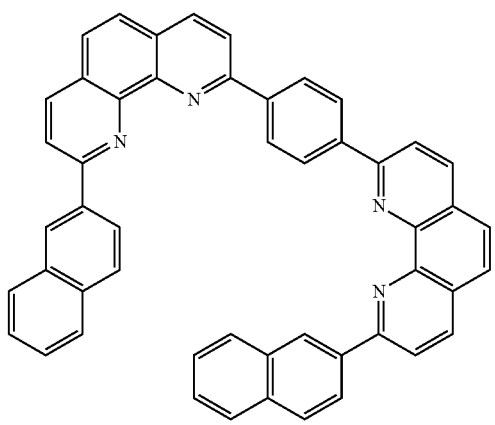
E39
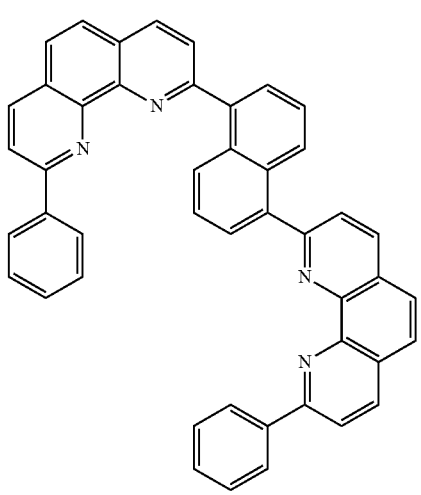

E40

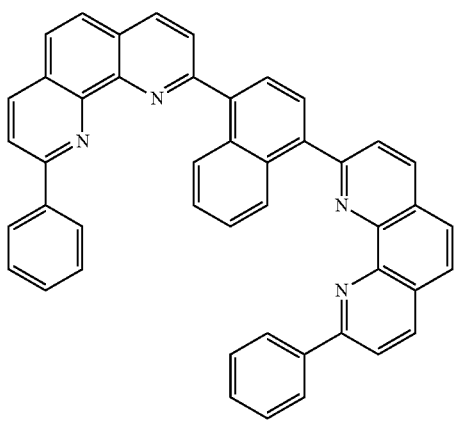

When the first layer 326a includes the sixth compound represented by one or more of the above chemical compound, the organic electric element 520 satisfies one or more of the general formulas 4 to 6 so that it may have a high efficiency or long life.

The hole injection layer 527 may include a seventh compound and an eighth compound.

Details of the seventh compound are the same as those described for the fourth compound described above, unless otherwise specified. Accordingly, the seventh compound may be represented by the chemical formula 1 and the like.

However, the specific seventh compound included in the organic electric element 520 according to the embodiments may be different from the fourth compound, or may be the same as each other.

Details of the eighth compound are the same as those described for the second compound described above, unless otherwise specified. Therefore, the eighth compound may be represented by the chemical formula 3 and the like.

However, the specific eighth compound included in the organic electric element 520 according to embodiments may be different from the fifth compound, or may be the same as each other.

Since the organic electric element 520 includes a hole injection layer 527 including the seventh compound and the eighth compound, it may have high efficiency or long life.

In addition, the seventh compound included in the hole injection layer 327 may be a dopant, and the eighth compound may be a host compound. The hole injection layer 327 includes the above-described fourth compound as the dopant, and the fifth compound as the host, so that the hole injection layer 527 has excellent hole injection characteristics so that the organic electric element may have excellent efficiency and lifespan.

The seventh compound may be doped at a ratio of 10% to 50% by weight into the hole injection layer 527. When the fourth compound is doped to satisfy the above ratio, the hole injection layer 527 has excellent hole injection characteristics, so that the organic electric element may have excellent efficiency and lifespan.

The thickness of the hole injection layer 527 is not particularly limited, but may be, for example, 50 Å to 500 Å.

Other embodiments of the present invention may provide a display panel 110.

The display panel 110 includes a sub-pixel 111 including the above-described organic electric element 220.

In the display panel 110 according to the present embodiment, since the organic electrical element 220 is the same as the organic electrical element 220 according to the above-described embodiments, a description thereof will be omitted.

In addition, since the display panel 110 and the sub-pixel 111 according to the embodiments have been described above, a description thereof will be omitted.

Other embodiments of the present invention may provide a display device 100.

The display device 100 includes the above-described display panel 110 and a driving circuit for driving the above-described display panel 110.

In the display device 100 according to the present embodiments, the display panel 110 is the same as the display panel 110 according to the above-described embodiments, so a description thereof will be omitted.

In addition, since the driving circuit for driving the display panel according to embodiments has been described above, a description thereof will be omitted.

Hereinafter, examples of the synthesis of the compound represented by the chemical formula 1 and the compound represented by the chemical formula 2 and examples of manufacturing an organic electric element according to the embodiments will be specifically described with reference to the embodiment, but the embodiments are not limited to the following examples.

Manufacturing Evaluation of Organic Electric Element

Comparative Example 1

After washing a glass substrate coated with ITO (indium tin oxide) to a thickness of 1,000 Å, the substrate is washed with a solvent such as isopropyl alcohol, acetone or methanol and dried. On this prepared ITO transparent electrode, NPD(N, N'-Di(1-naphthyl)-N,N'-diphenyl-(1,1'-biphenyl)-4,4'-diamine) is used as the second compound, F4-TCNQ (2,3,5,6-tetrafluoro-tetracyanoquinodimethane) was doped with 10% as the first compound and thermally vacuum-deposited to form a hole injection layer of 10 nm. A first hole transport layer (HTL1) was formed by thermal vacuum deposition of a hole transport material (NPD) of 100 nm.

Subsequently, a second hole transport layer (HTL2) was formed by thermal vacuum deposition of a hole transport material (TCTA, Tris(4-carbazoyl-9-ylphenyl) amine) to a thickness of 100 nm. After that, ADN(9,10-di(naphtha-2-yl) anthracene) and 1,6-Bis (diphenylamine)pyrene were used as host and dopant materials, respectively, doped with 3%, and thermally vacuum-deposited to a thickness of 20 nm to form a first light emitting layer.

Subsequently, a electron transport layer was formed by thermal vacuum deposition of an electron transport material (TmPyPB, 1,3,5-Tri (m-pyridin-3-ylphenyl) benzene) to a thickness of 10 nm, and Bphen(Bathophenanthroline) as an electron injection material was used, and Li was doped with 2% to form the electron injection layer by thermal vacuum deposition to a thickness of 20 nm.

Embodiments 1 to 45 and Comparative Examples 1 to 15

The organic electric element was manufactured in the same manner as in the Comparative Example 1, except that the first to the third compounds were used in the types and ratios shown in Table 1 below. Table 2 shows the performances of the manufactured organic electric elements.

TABLE 1

| | first chemical compound | second chemical compound | fourth chemical compound | L₁-H₂ (eV) | L₁-H₃ (eV) | H₂-H₃ (eV) |
|---|---|---|---|---|---|---|
| Comparative Example 1 | F4-TCNQ (10%) | NPD | ADN | 0.3 | 0.6 | 0.3 |
| Comparative Example 2 | F4-TCNQ (10%) | D01 | ADN | −0.04 | 0.6 | 0.64 |
| Comparative Example 3 | F4-TCNQ (10%) | D16 | ADN | −0.06 | 0.6 | 0.66 |
| Comparative Example 4 | F4-TCNQ (10%) | D19 | ADN | −0.1 | 0.6 | 0.7 |
| Comparative Example 5 | F4-TCNQ (10%) | D22 | ADN | −0.02 | 0.6 | 0.62 |
| Comparative Example 6 | F4-TCNQ (10%) | D28 | ADN | −0.03 | 0.6 | 0.63 |
| Comparative Example 7 | F4-TCNQ (10%) | D52 | ADN | 0.05 | 0.6 | 0.55 |
| Comparative Example 8 | F4-TCNQ (10%) | 25 | ADN | 0.03 | 0.6 | 0.57 |
| Comparative Example 9 | F4-TCNQ (10%) | 34 | ADN | −0.01 | 0.6 | 0.61 |
| Comparative Example 10 | F4-TCNQ (10%) | 60 | ADN | 0 | 0.6 | 0.6 |
| Comparative Example 11 | F4-TCNQ (10%) | 4-4 | ADN | 0.01 | 0.6 | 0.59 |
| Comparative Example 12 | F4-TCNQ (10%) | 4-9 | ADN | 0.02 | 0.6 | 0.58 |
| Comparative Example 13 | F4-TCNQ (10%) | 4-11 | ADN | −0.01 | 0.6 | 0.61 |
| Comparative Example 14 | F4-TCNQ (10%) | 5-2 | ADN | 0 | 0.6 | 0.6 |
| Comparative Example 15 | F4-TCNQ (10%) | 5-8 | ADN | 0 | 0.6 | 0.6 |
| Embodiment 1 | A04 (10%) | NPD | ADN | 0.75 | 1.05 | 0.3 |
| Embodiment 2 | A15 (10%) | D16 | ADN | 0.4 | 1.06 | 0.66 |
| Embodiment 3 | A15 (10%) | D19 | ADN | 0.36 | 1.06 | 0.7 |
| Embodiment 4 | A15 (10%) | D22 | ADN | 0.44 | 1.06 | 0.62 |
| Embodiment 5 | A15 (10%) | D28 | ADN | 0.45 | 1.06 | 0.63 |
| Embodiment 6 | A15 (10%) | D52 | ADN | 0.51 | 1.06 | 0.55 |
| Embodiment 7 | A38 (10%) | NPD | ADN | 0.7 | 1 | 0.3 |
| Embodiment 8 | A38 (10%) | D01 | ADN | 0.36 | 1 | 0.64 |
| Embodiment 9 | A38 (10%) | D16 | ADN | 0.34 | 1 | 0.66 |
| Embodiment 10 | A38 (10%) | D19 | ADN | 0.3 | 1 | 0.7 |
| Embodiment 11 | A38 (10%) | D22 | ADN | 0.38 | 1 | 0.62 |
| Embodiment 12 | A04 (10%) | D01 | ADN | 0.41 | 1.05 | 0.64 |
| Embodiment 13 | A38 (10%) | D28 | ADN | 0.39 | 1 | 0.63 |
| Embodiment 14 | A38 (10%) | D52 | ADN | 0.45 | 1 | 0.55 |
| Embodiment 15 | A04 (10%) | D16 | ADN | 0.39 | 1.05 | 0.66 |
| Embodiment 16 | A04 (10%) | D19 | ADN | 0.35 | 1.05 | 0.7 |
| Embodiment 17 | A04 (10%) | D22 | ADN | 0.43 | 1.05 | 0.62 |
| Embodiment 18 | A04 (10%) | D28 | ADN | 0.44 | 1.05 | 0.63 |
| Embodiment 19 | A04 (10%) | D52 | ADN | 0.5 | 1.05 | 0.55 |
| Embodiment 20 | A15 (10%) | NPD | ADN | 0.76 | 1.06 | 0.3 |
| Embodiment 21 | A15 (10%) | D01 | ADN | 0.42 | 1.06 | 0.64 |
| Embodiment 22 | A04 (10%) | NPD | ADN | 0.75 | 1.05 | 0.3 |
| Embodiment 23 | A38 (10%) | 25 | ADN | 0.43 | 1 | 0.57 |
| Embodiment 24 | A38 (10%) | 34 | ADN | 0.39 | 1 | 0.61 |
| Embodiment 25 | A38 (10%) | 60 | ADN | 0.4 | 1 | 0.6 |
| Embodiment 26 | A04 (10%) | 25 | ADN | 0.48 | 1.05 | 0.57 |
| Embodiment 27 | A04 (10%) | 34 | ADN | 0.44 | 1.05 | 0.61 |
| Embodiment 28 | A04 (10%) | 60 | ADN | 0.45 | 1.05 | 0.6 |
| Embodiment 29 | A15 (10%) | NPD | ADN | 0.76 | 1.06 | 0.3 |
| Embodiment 30 | A15 (10%) | 25 | ADN | 0.49 | 1.06 | 0.57 |
| Embodiment 31 | A15 (10%) | 34 | ADN | 0.45 | 1.06 | 0.61 |
| Embodiment 32 | A15 (10%) | 60 | ADN | 0.46 | 1.06 | 0.6 |
| Embodiment 33 | A38 (10%) | NPD | ADN | 0.7 | 1 | 0.3 |
| Embodiment 34 | A15 (10%) | NPD | ADN | 0.76 | 1.06 | 0.3 |
| Embodiment 35 | A38 (10%) | 4-11 | ADN | 0.39 | 1 | 0.61 |
| Embodiment 36 | A38 (10%) | 5-2 | ADN | 0.4 | 1 | 0.6 |
| Embodiment 37 | A38 (10%) | 5-8 | ADN | 0.4 | 1 | 0.6 |
| Embodiment 38 | A15 (10%) | 4-4 | ADN | 0.47 | 1.06 | 0.59 |
| Embodiment 39 | A15 (10%) | 4-9 | ADN | 0.48 | 1.06 | 0.58 |
| Embodiment 40 | A15 (10%) | 4-11 | ADN | 0.45 | 1.06 | 0.61 |
| Embodiment 41 | A15 (10%) | 5-2 | ADN | 0.46 | 1.06 | 0.6 |
| Embodiment 42 | A15 (10%) | 5-8 | ADN | 0.46 | 1.06 | 0.6 |
| Embodiment 43 | A38 (10%) | NPD | ADN | 0.7 | 1 | 0.3 |
| Embodiment 44 | A38 (10%) | 4-4 | ADN | 0.41 | 1 | 0.59 |
| Embodiment 45 | A38 (10%) | 4-9 | ADN | 0.42 | 1 | 0.58 |

TABLE 2

| | driving voltage (V) | efficiency (cd/A) | color coordinate (CIE x, y) | | lifespan (T95, hr) |
|---|---|---|---|---|---|
| Comparative Example 1 | 4.74 | 5.51 | 0.138 | 0.097 | 83 |
| Comparative Example 2 | 4.7 | 5.54 | 0.139 | 0.098 | 94 |
| Comparative Example 3 | 4.68 | 5.84 | 0.14 | 0.097 | 64 |
| Comparative Example 4 | 4.69 | 5.79 | 0.139 | 0.096 | 71 |
| Comparative Example 5 | 4.7 | 5.53 | 0.139 | 0.098 | 80 |
| Comparative Example 6 | 4.71 | 5.48 | 0.139 | 0.096 | 45 |
| Comparative Example 7 | 4.85 | 5.44 | 0.138 | 0.095 | 49 |
| Comparative Example 8 | 4.8 | 5.33 | 0.139 | 0.098 | 80 |
| Comparative Example 9 | 4.63 | 5.42 | 0.14 | 0.099 | 110 |
| Comparative Example 10 | 4.62 | 5.49 | 0.139 | 0.1 | 118 |
| Comparative Example 11 | 4.69 | 5.72 | 0.139 | 0.098 | 85 |
| Comparative Example 12 | 4.7 | 5.68 | 0.141 | 0.099 | 96 |
| Comparative Example 13 | 4.64 | 5.75 | 0.14 | 0.1 | 101 |
| Comparative Example 14 | 4.7 | 5.69 | 0.139 | 0.099 | 88 |
| Comparative Example 15 | 4.68 | 5.76 | 0.139 | 0.098 | 90 |
| Embodiment 1 | 4.5 | 5.93 | 0.14 | 0.097 | 105 |
| Embodiment 2 | 4.2 | 6.24 | 0.14 | 0.099 | 164 |
| Embodiment 3 | 4.28 | 6.19 | 0.14 | 0.098 | 142 |
| Embodiment 4 | 4.09 | 6.32 | 0.14 | 0.099 | 169 |
| Embodiment 5 | 4.24 | 6.3 | 0.141 | 0.098 | 103 |
| Embodiment 6 | 4.35 | 6.18 | 0.14 | 0.097 | 147 |
| Embodiment 7 | 4.33 | 6.14 | 0.14 | 0.099 | 105 |
| Embodiment 8 | 4.18 | 6.1 | 0.139 | 0.097 | 121 |
| Embodiment 9 | 4.05 | 6.32 | 0.141 | 0.1 | 161 |
| Embodiment 10 | 4.21 | 6.17 | 0.14 | 0.098 | 133 |
| Embodiment 11 | 4.1 | 6.25 | 0.14 | 0.099 | 182 |
| Embodiment 12 | 4.42 | 6.04 | 0.139 | 0.097 | 113 |
| Embodiment 13 | 4.2 | 6.28 | 0.14 | 0.098 | 126 |
| Embodiment 14 | 4.29 | 6.1 | 0.139 | 0.098 | 140 |
| Embodiment 15 | 4.38 | 6.24 | 0.14 | 0.098 | 135 |
| Embodiment 16 | 4.32 | 6.12 | 0.139 | 0.099 | 119 |
| Embodiment 17 | 4.17 | 6.3 | 0.141 | 0.1 | 150 |
| Embodiment 18 | 4.23 | 6.15 | 0.14 | 0.099 | 122 |
| Embodiment 19 | 4.45 | 6.09 | 0.139 | 0.098 | 130 |
| Embodiment 20 | 4.4 | 6.08 | 0.139 | 0.099 | 114 |
| Embodiment 21 | 4.29 | 6.16 | 0.14 | 0.099 | 125 |
| Embodiment 22 | 4.58 | 5.64 | 0.141 | 0.099 | 138 |
| Embodiment 23 | 4.34 | 5.61 | 0.14 | 0.099 | 148 |
| Embodiment 24 | 4.27 | 5.79 | 0.139 | 0.099 | 174 |
| Embodiment 25 | 4.25 | 5.82 | 0.141 | 0.1 | 191 |
| Embodiment 26 | 4.52 | 5.7 | 0.14 | 0.098 | 161 |
| Embodiment 27 | 4.46 | 5.69 | 0.139 | 0.098 | 180 |
| Embodiment 28 | 4.45 | 5.72 | 0.139 | 0.098 | 180 |
| Embodiment 29 | 4.5 | 5.65 | 0.14 | 0.099 | 126 |
| Embodiment 30 | 4.39 | 5.69 | 0.14 | 0.1 | 164 |
| Embodiment 31 | 4.4 | 5.76 | 0.139 | 0.099 | 168 |
| Embodiment 32 | 4.35 | 5.81 | 0.14 | 0.098 | 172 |
| Embodiment 33 | 4.38 | 5.58 | 0.139 | 0.099 | 147 |
| Embodiment 34 | 4.57 | 5.95 | 0.14 | 0.097 | 126 |
| Embodiment 35 | 4.2 | 6.27 | 0.139 | 0.099 | 227 |
| Embodiment 36 | 4.21 | 6.22 | 0.139 | 0.098 | 215 |
| Embodiment 37 | 4.19 | 6.5 | 0.14 | 0.099 | 239 |
| Embodiment 38 | 4.41 | 6 | 0.14 | 0.098 | 171 |
| Embodiment 39 | 4.3 | 6.45 | 0.139 | 0.099 | 188 |
| Embodiment 40 | 4.22 | 6.22 | 0.14 | 0.1 | 176 |
| Embodiment 41 | 4.2 | 6.18 | 0.139 | 0.097 | 160 |
| Embodiment 42 | 4.24 | 6.44 | 0.14 | 0.097 | 192 |
| Embodiment 43 | 4.36 | 5.97 | 0.139 | 0.098 | 161 |

TABLE 2-continued

|  | driving voltage (V) | efficiency (cd/A) | color coordinate (CIE x, y) | | lifespan (T95, hr) |
|---|---|---|---|---|---|
| Embodiment 44 | 4.27 | 6.02 | 0.141 | 0.099 | 218 |
| Embodiment 45 | 4.26 | 6.49 | 0.14 | 0.1 | 232 |

As can be seen from the result of the table 2, since the organic electric element according to the embodiments satisfies one or more of the general formula 1 to general formula 3, it may have excellent efficiency or lifespan compared to the organic electric element of the Comparative Example.

As can be seen from the result of the Table 2, the organic electric element according to the embodiments includes the charge generating layer including the first layer including the first compound and the second compound according to the embodiments so that it may have excellent efficiency or lifespan compared to the organic electric element of the Comparative Example.

In the case of Embodiments 1, 7, 20, 22, 29, 33, 34 and 43 including the first layer including the first compound represented by at least one of the chemical formula 1 and the chemical formula 2, its efficiency of lifespan is improved compared to the organic electric element of the Comparative Embodiment.

In addition, compared to the Embodiments 1, 7 and 20, it can be seen that the organic electric element of the Embodiments 2-6, 8-19 and 21 including the first layer further comprising the second compound represented by the chemical formula 7 has better efficiency and longer life than the organic electric elements of Embodiments 1, 7 and 20.

In addition, it can be seen that the organic electric element of the Embodiments 23-28 and 30-32 comprising the first layer containing the second compound represented by the chemical formula 8 has better efficiency and longer life than the organic electric elements of Embodiments 22 and 29.

In addition, it can be seen that the organic electric element of the embodiments 35-42 and 44-45 comprising the first layer further comprising the second compound represented by the chemical formula 10 has better efficiency and longer life than the organic electric elements of Embodiments 34 and 43.

Accordingly, when the first layer includes the first compound represented by one or more of the chemical formulas 1 and 2, efficiency or lifespan is improved, and additionally, when the second layer includes the second compound represented by the chemical formulas 7 to 9, the efficiency or lifetime is further improved.

Comparative Example 16: Manufacturing of Organic Electric Element

After washing a glass substrate coated with ITO (indium tin oxide) to a thickness of 1,000 Å, the substrate is washed with a solvent such as isopropyl alcohol, acetone or methanol and dried. On this prepared ITO transparent electrode, NPD(N, N'-Di(1-naphthyl)-N,N'-diphenyl-(1,1'-biphenyl)-4,4'-diamine) is used as the fifth compound, F4-TCNQ (2,3,5,6-tetrafluoro-tetracyanoquinodimethane) was doped with 10% as the fourth compound and thermally vacuum-deposited to form a hole injection layer of 10 nm. A first hole transport layer (HTL1) was formed by thermal vacuum deposition of a hole transport material (NPD) of 100 nm. Subsequently, ADN(9,10-di(naphtha-2-yl)anthracene) and 1,6-Bis (diphenylamine)pyrene were used as host and dopant materials, respectively, doped with 3%, and thermally vacuum-deposited to a thickness of 20 nm to form a first light emitting layer.

Subsequently, a first electron transport layer was formed by thermal vacuum deposition of an electron transport material (TmPyPB, 1,3,5-Tri (m-pyridin-3-ylphenyl) benzene) to a thickness of 10 nm, and Bphen(Bathophenanthroline) as the third compound was used, and Li was doped with 2% to form a second layer (n-type charge generation layer) by thermal vacuum deposition to a thickness of 20 nm.

Subsequently, NPD(N,N'-Di(1-naphthyl)-N,N'-diphenyl-(1,1'-biphenyl)-4,4'-diamine) is used as the second compound and F4-TCNQ(2,3,5,6-tetrafluoro-tetracyanoquinodimethane) was doped with 10% as the first compound and thermally vacuum-deposited to form a first layer (p-type charge generation layer) of 10 nm.

Subsequently, NPD(N,N'-Di(1-naphthyl)-N,N'-diphenyl-(1,1'-biphenyl)-4,4'-diamine) as a hole transport material was vacuum-deposited to a thickness of 20 nm and then CBP (4,4'-Bis (N-carbazolyl)-1,1'-biphenyl) is used as a host and Ir(ppy)3 (tris(2-phenylpyridine)Iridium (III) was doped with 10% as a dopant. Thermal vacuum deposition was performed to form a second light emitting layer of 20 nm.

Subsequently, a second electron transport layer was formed by thermal vacuum deposition using Alq$_3$ as an electron transport material, and then thermal vacuum deposition was performed using LiF as an electron injection material to form an electron injection layer. Subsequently, a cathode was formed by depositing Al to a thickness of 200 nm, thereby fabricating an organic electric element.

Embodiments 46 to 90 and Comparative Examples 17 to 30

The organic electric element was manufactured in the same manner as in the Comparative Example 16, except that the first, the second, the fourth and the fifth compounds were used in the types and ratios shown in Table 3 below. Table 4 shows the performances of the manufactured organic electric elements.

TABLE 3

|  | fourth chemical compound | fifth compound chemical | sixth compound chemical | seventh compound chemical | eighth compound chemical | $L_6$-$L_4$ (eV) | $L_6$-$H_5$ (eV) | $L_4$-$H_5$ (eV) |
|---|---|---|---|---|---|---|---|---|
| Comparative Example 16 | F4-TCNQ (10%) | NPD | Bphen | F4-TCNQ (10%) | NPD | 2.2 | 2.5 | 0.3 |
| Comparative Example 17 | F4-TCNQ (10%) | D01 | Bphen | F4-TCNQ (10%) | D01 | 2.2 | 2.16 | −0.04 |
| Comparative Example 18 | F4-TCNQ (10%) | D16 | Bphen | F4-TCNQ (10%) | D16 | 2.2 | 2.14 | −0.06 |
| Comparative Example 19 | F4-TCNQ (10%) | D19 | Bphen | F4-TCNQ (10%) | D19 | 2.2 | 2.1 | −0.1 |

TABLE 3-continued

| | fourth chemical compound | fifth compound chemical | sixth compound chemical | seventh compound chemical | eighth compound chemical | $L_6$-$L_4$ (eV) | $L_6$-$H_5$ (eV) | $L_4$-$H_5$ (eV) |
|---|---|---|---|---|---|---|---|---|
| Comparative Example 20 | F4-TCNQ (10%) | D22 | Bphen | F4-TCNQ (10%) | D22 | 2.2 | 2.18 | −0.02 |
| Comparative Example 21 | F4-TCNQ (10%) | D28 | Bphen | F4-TCNQ (10%) | D28 | 2.2 | 2.17 | −0.03 |
| Comparative Example 22 | F4-TCNQ (10%) | D52 | Bphen | F4-TCNQ (10%) | D52 | 2.2 | 2.25 | 0.05 |
| Comparative Example 23 | F4-TCNQ (10%) | 25 | Bphen | F4-TCNQ (10%) | 25 | 2.2 | 2.23 | 0.03 |
| Comparative Example 24 | F4-TCNQ (10%) | 34 | Bphen | F4-TCNQ (10%) | 34 | 2.2 | 2.19 | −0.01 |
| Comparative Example 25 | F4-TCNQ (10%) | 60 | Bphen | F4-TCNQ (10%) | 60 | 2.2 | 2.2 | 0 |
| Comparative Example 26 | F4-TCNQ (10%) | 4-4 | Bphen | F4-TCNQ (10%) | 43559 | 2.2 | 2.21 | 0.01 |
| Comparative Example 27 | F4-TCNQ (10%) | 4-9 | Bphen | F4-TCNQ (10%) | 43564 | 2.2 | 2.22 | 0.02 |
| Comparative Example 28 | F4-TCNQ (10%) | 4-11 | Bphen | F4-TCNQ (10%) | 43566 | 2.2 | 2.19 | −0.01 |
| Comparative Example 29 | F4-TCNQ (10%) | 5-2 | Bphen | F4-TCNQ (10%) | 43587 | 2.2 | 2.2 | 0 |
| Comparative Example 30 | F4-TCNQ (10%) | 5-8 | Bphen | F4-TCNQ (10%) | 43593 | 2.2 | 2.2 | 0 |
| Embodiment 46 | A04 (10%) | NPD | Bphen | A04 (10%) | NPD | 1.75 | 2.5 | 0.75 |
| Embodiment 47 | A04 (10%) | D01 | Bphen | A04 (10%) | D01 | 1.75 | 2.16 | 0.41 |
| Embodiment 48 | A04 (10%) | D16 | Bphen | A04 (10%) | D16 | 1.75 | 2.14 | 0.39 |
| Embodiment 49 | A04 (10%) | D19 | Bphen | A04 (10%) | D19 | 1.75 | 2.1 | 0.35 |
| Embodiment 50 | A04 (10%) | D22 | Bphen | A04 (10%) | D22 | 1.75 | 2.18 | 0.43 |
| Embodiment 51 | A04 (10%) | D28 | Bphen | A04 (10%) | D28 | 1.75 | 2.17 | 0.44 |
| Embodiment 52 | A04 (10%) | D52 | Bphen | A04 (10%) | D52 | 1.75 | 2.25 | 0.5 |
| Embodiment 53 | A15 (10%) | NPD | Bphen | A15 (10%) | NPD | 1.74 | 2.5 | 0.76 |
| Embodiment 54 | A15 (10%) | D01 | Bphen | A15 (10%) | D01 | 1.74 | 2.16 | 0.42 |
| Embodiment 55 | A15 (10%) | D16 | Bphen | A15 (10%) | D16 | 1.74 | 2.14 | 0.4 |
| Embodiment 56 | A15 (10%) | D19 | Bphen | A15 (10%) | D19 | 1.74 | 2.1 | 0.36 |
| Embodiment 57 | A15 (10%) | D22 | Bphen | A15 (10%) | D22 | 1.74 | 2.18 | 0.44 |
| Embodiment 58 | A15 (10%) | D28 | Bphen | A15 (10%) | D28 | 1.74 | 2.17 | 0.45 |
| Embodiment 59 | A15 (10%) | D52 | Bphen | A15 (10%) | D52 | 1.74 | 2.25 | 0.51 |
| Embodiment 60 | A38 (10%) | NPD | Bphen | A38 (10%) | NPD | 1.8 | 2.5 | 0.7 |
| Embodiment 61 | A38 (10%) | D01 | Bphen | A38 (10%) | D01 | 1.8 | 2.16 | 0.36 |
| Embodiment 62 | A38 (10%) | D16 | Bphen | A38 (10%) | D16 | 1.8 | 2.14 | 0.34 |
| Embodiment 63 | A38 (10%) | D19 | Bphen | A38 (10%) | D19 | 1.8 | 2.1 | 0.3 |
| Embodiment 64 | A38 (10%) | D22 | Bphen | A38 (10%) | D22 | 1.8 | 2.18 | 0.38 |
| Embodiment 65 | A38 (10%) | D28 | Bphen | A38 (10%) | D28 | 1.8 | 2.17 | 0.39 |
| Embodiment 66 | A38 (10%) | D52 | Bphen | A38 (10%) | D52 | 1.8 | 2.25 | 0.45 |
| Embodiment 67 | A04 (10%) | NPD | E05 | A04 (10%) | NPD | 1.69 | 2.44 | 0.75 |
| Embodiment 68 | A04 (10%) | D16 | E05 | A04 (10%) | D16 | 1.69 | 2.08 | 0.39 |
| Embodiment 69 | A04 (10%) | D22 | E27 | A04 (10%) | D22 | 1.63 | 2.06 | 0.43 |
| Embodiment 70 | A15 (10%) | NPD | E05 | A15 (10%) | NPD | 1.68 | 2.44 | 0.76 |
| Embodiment 71 | A15 (10%) | D16 | E05 | A15 (10%) | D16 | 1.68 | 2.08 | 0.4 |
| Embodiment 72 | A15 (10%) | D22 | E27 | A15 (10%) | D22 | 1.62 | 2.06 | 0.44 |
| Embodiment 73 | A04 (10%) | NPD | Bphen | A04 (10%) | NPD | 1.75 | 2.5 | 0.75 |
| Embodiment 74 | A04 (10%) | 25 | Bphen | A04 (10%) | 25 | 1.75 | 2.23 | 0.48 |
| Embodiment 75 | A04 (10%) | 34 | Bphen | A04 (10%) | 34 | 1.75 | 2.19 | 0.44 |
| Embodiment 76 | A04 (10%) | 60 | Bphen | A04 (10%) | 60 | 1.75 | 2.2 | 0.45 |
| Embodiment 77 | A15 (10%) | NPD | Bphen | A15 (10%) | NPD | 1.74 | 2.5 | 0.76 |
| Embodiment 78 | A15 (10%) | 25 | Bphen | A15 (10%) | 25 | 1.74 | 2.23 | 0.49 |
| Embodiment 79 | A15 (10%) | 34 | Bphen | A15 (10%) | 34 | 1.74 | 2.19 | 0.45 |
| Embodiment 80 | A15 (10%) | 60 | Bphen | A15 (10%) | 60 | 1.74 | 2.2 | 0.46 |
| Embodiment 81 | A38 (10%) | NPD | Bphen | A38 (10%) | NPD | 1.8 | 2.5 | 0.3 |
| Embodiment 82 | A38 (10%) | 25 | Bphen | A38 (10%) | 25 | 1.8 | 2.23 | 0.57 |
| Embodiment 83 | A38 (10%) | 34 | Bphen | A38 (10%) | 34 | 1.8 | 2.19 | 0.61 |
| Embodiment 84 | A38 (10%) | 60 | Bphen | A38 (10%) | 60 | 1.8 | 2.2 | 0.6 |
| Embodiment 85 | A15 (10%) | NPD | E05 | A15 (10%) | NPD | 1.68 | 2.44 | 0.76 |
| Embodiment 86 | A15 (10%) | 25 | E05 | A15 (10%) | 25 | 1.68 | 2.17 | 0.49 |
| Embodiment 87 | A15 (10%) | 34 | E27 | A15 (10%) | 34 | 1.62 | 2.07 | 0.45 |
| Embodiment 88 | A38 (10%) | NPD | E05 | A38 (10%) | NPD | 1.74 | 2.44 | 0.7 |
| Embodiment 89 | A38 (10%) | 25 | E05 | A38 (10%) | 25 | 1.74 | 2.17 | 0.57 |
| Embodiment 90 | A38 (10%) | 34 | E27 | A38 (10%) | 34 | 1.68 | 2.07 | 0.61 |
| Embodiment 91 | A15 (10%) | NPD | Bphen | A15 (10%) | NPD | 1.74 | 2.5 | 0.76 |
| Embodiment 92 | A15 (10%) | 4-4 | Bphen | A15 (10%) | 43559 | 1.74 | 2.21 | 0.47 |
| Embodiment 93 | A15 (10%) | 4-9 | Bphen | A15 (10%) | 43564 | 1.74 | 2.22 | 0.48 |
| Embodiment 94 | A15 (10%) | 4-11 | Bphen | A15 (10%) | 43566 | 1.74 | 2.19 | 0.45 |
| Embodiment 95 | A15 (10%) | 5-2 | Bphen | A15 (10%) | 43587 | 1.74 | 2.2 | 0.46 |
| Embodiment 96 | A15 (10%) | 5-8 | Bphen | A15 (10%) | 43593 | 1.74 | 2.2 | 0.46 |
| Embodiment 97 | A38 (10%) | NPD | Bphen | A38 (10%) | NPD | 1.8 | 2.5 | 0.7 |
| Embodiment 98 | A38 (10%) | 4-4 | Bphen | A38 (10%) | 43559 | 1.8 | 2.21 | 0.41 |
| Embodiment 99 | A38 (10%) | 4-9 | Bphen | A38 (10%) | 43564 | 1.8 | 2.22 | 0.42 |

TABLE 3-continued

| | fourth chemical compound | fifth compound chemical | sixth compound chemical | seventh compound chemical | eighth compound chemical | $L_6$-$L_4$ (eV) | $L_6$-$H_5$ (eV) | $L_4$-$H_5$ (eV) |
|---|---|---|---|---|---|---|---|---|
| Embodiment 100 | A38 (10%) | 4-11 | Bphen | A38 (10%) | 43566 | 1.8 | 2.19 | 0.39 |
| Embodiment 101 | A38 (10%) | 5-2 | Bphen | A38 (10%) | 43587 | 1.8 | 2.2 | 0.4 |
| Embodiment 102 | A38 (10%) | 5-8 | Bphen | A38 (10%) | 43593 | 1.8 | 2.2 | 0.4 |
| Embodiment 103 | A15 (10%) | NPD | E05 | A15 (10%) | NPD | 1.68 | 2.44 | 0.76 |
| Embodiment 104 | A15 (10%) | 4-11 | E05 | A15 (10%) | 4-11 | 1.68 | 2.19 | 0.45 |
| Embodiment 105 | A15 (10%) | 5-8 | E27 | A15 (10%) | 5-8 | 1.62 | 2.2 | 0.4 |
| Embodiment 106 | A38 (10%) | NPD | E05 | A38 (10%) | NPD | 1.74 | 2.44 | 0.7 |
| Embodiment 107 | A38 (10%) | 4-11 | E05 | A38 (10%) | 4-11 | 1.74 | 2.19 | 0.39 |
| Embodiment 108 | A38 (10%) | 5-8 | E27 | A38 (10%) | 5-8 | 1.68 | 2.2 | 0.4 |

TABLE 4

| | driving voltage (V) | effi- ciency (cd/A) | color coordinate (CIE x, y) | | lifespan (T95, hr) |
|---|---|---|---|---|---|
| Comparative Example 16 | 10.6 | 56.1 | 0.317 | 0.33 | 283 |
| Comparative Example 17 | 10.4 | 56.4 | 0.32 | 0.345 | 294 |
| Comparative Example 18 | 9.8 | 59.4 | 0.323 | 0.34 | 264 |
| Comparative Example 19 | 9.9 | 58.9 | 0.321 | 0.336 | 271 |
| Comparative Example 20 | 10.2 | 56.3 | 0.318 | 0.344 | 280 |
| Comparative Example 21 | 10.2 | 55.8 | 0.325 | 0.342 | 245 |
| Comparative Example 22 | 11.3 | 55.4 | 0.319 | 0.344 | 249 |
| Comparative Example 23 | 10.4 | 53.3 | 0.32 | 0.331 | 280 |
| Comparative Example 24 | 9.7 | 54.2 | 0.319 | 0.336 | 330 |
| Comparative Example 25 | 9.9 | 54.9 | 0.32 | 0.333 | 328 |
| Comparative Example 26 | 10.2 | 57.2 | 0.32 | 0.334 | 315 |
| Comparative Example 27 | 10.5 | 56.8 | 0.318 | 0.329 | 346 |
| Comparative Example 28 | 9.8 | 57.5 | 0.322 | 0.336 | 351 |
| Comparative Example 29 | 10.2 | 56.9 | 0.325 | 0.333 | 338 |
| Comparative Example 30 | 10.1 | 57.6 | 0.321 | 0.34 | 340 |
| Embodiment 46 | 9.5 | 60.3 | 0.322 | 0.339 | 305 |
| Embodiment 47 | 9.2 | 61.4 | 0.32 | 0.34 | 313 |
| Embodiment 48 | 8.7 | 63.4 | 0.325 | 0.338 | 335 |
| Embodiment 49 | 9 | 62.2 | 0.323 | 0.335 | 319 |
| Embodiment 50 | 8.4 | 64 | 0.327 | 0.341 | 350 |
| Embodiment 51 | 8.8 | 62.5 | 0.319 | 0.34 | 322 |
| Embodiment 52 | 9.4 | 61.9 | 0.32 | 0.343 | 330 |
| Embodiment 53 | 9.3 | 61.8 | 0.326 | 0.339 | 314 |
| Embodiment 54 | 9.2 | 62.6 | 0.325 | 0.341 | 325 |
| Embodiment 55 | 8.5 | 63.4 | 0.324 | 0.34 | 364 |
| Embodiment 56 | 8.9 | 62.9 | 0.322 | 0.337 | 342 |
| Embodiment 57 | 8.2 | 64.2 | 0.319 | 0.341 | 369 |
| Embodiment 58 | 8.7 | 64 | 0.321 | 0.34 | 303 |
| Embodiment 59 | 9.1 | 62.8 | 0.323 | 0.342 | 347 |
| Embodiment 60 | 9.1 | 62.4 | 0.32 | 0.338 | 305 |
| Embodiment 61 | 9.2 | 62 | 0.319 | 0.335 | 321 |
| Embodiment 62 | 8 | 64.2 | 0.322 | 0.339 | 361 |
| Embodiment 63 | 8.7 | 62.7 | 0.323 | 0.337 | 333 |
| Embodiment 64 | 8.1 | 63.5 | 0.32 | 0.341 | 382 |
| Embodiment 65 | 8.6 | 63.8 | 0.324 | 0.344 | 326 |
| Embodiment 66 | 9 | 63 | 0.323 | 0.343 | 340 |
| Embodiment 67 | 9.1 | 62.7 | 0.326 | 0.331 | 310 |
| Embodiment 68 | 8.7 | 63.4 | 0.319 | 0.338 | 335 |
| Embodiment 69 | 8.4 | 64 | 0.327 | 0.341 | 350 |
| Embodiment 70 | 8.9 | 63 | 0.321 | 0.331 | 341 |
| Embodiment 71 | 8.5 | 63.4 | 0.317 | 0.34 | 364 |
| Embodiment 72 | 8.2 | 64.2 | 0.319 | 0.341 | 369 |
| Embodiment 73 | 9.4 | 56.4 | 0.323 | 0.335 | 338 |
| Embodiment 74 | 9 | 57 | 0.323 | 0.334 | 361 |
| Embodiment 75 | 8.6 | 56.9 | 0.322 | 0.332 | 380 |
| Embodiment 76 | 8.8 | 57.2 | 0.32 | 0.331 | 380 |
| Embodiment 77 | 9.3 | 56.5 | 0.321 | 0.334 | 326 |
| Embodiment 78 | 9 | 56.9 | 0.321 | 0.331 | 364 |
| Embodiment 79 | 8.4 | 57.6 | 0.322 | 0.332 | 368 |
| Embodiment 80 | 8.8 | 58.1 | 0.318 | 0.33 | 372 |
| Embodiment 81 | 9.2 | 55.8 | 0.318 | 0.338 | 347 |
| Embodiment 82 | 8.8 | 56.1 | 0.318 | 0.33 | 348 |
| Embodiment 83 | 8.4 | 57.9 | 0.321 | 0.334 | 374 |
| Embodiment 84 | 8.3 | 58.2 | 0.326 | 0.333 | 391 |
| Embodiment 85 | 9 | 60.3 | 0.323 | 0.337 | 453 |
| Embodiment 86 | 8.4 | 57.6 | 0.322 | 0.332 | 368 |
| Embodiment 87 | 9.1 | 57.4 | 0.32 | 0.335 | 383 |
| Embodiment 88 | 8.9 | 56.2 | 0.32 | 0.334 | 353 |
| Embodiment 89 | 8.4 | 57.9 | 0.321 | 0.334 | 374 |
| Embodiment 90 | 8.8 | 57.1 | 0.323 | 0.335 | 384 |
| Embodiment 91 | 9.6 | 59.5 | 0.324 | 0.339 | 426 |
| Embodiment 92 | 9.1 | 60 | 0.32 | 0.347 | 521 |
| Embodiment 93 | 8.8 | 64.5 | 0.315 | 0.338 | 538 |
| Embodiment 94 | 8.3 | 62.2 | 0.322 | 0.331 | 526 |
| Embodiment 95 | 8.2 | 61.8 | 0.322 | 0.342 | 510 |
| Embodiment 96 | 8.4 | 64.4 | 0.321 | 0.341 | 542 |
| Embodiment 97 | 9.5 | 59.7 | 0.321 | 0.34 | 461 |
| Embodiment 98 | 8.9 | 60.2 | 0.321 | 0.342 | 518 |
| Embodiment 99 | 8.6 | 64.9 | 0.32 | 0.34 | 532 |
| Embodiment 100 | 8.2 | 62.7 | 0.322 | 0.341 | 527 |
| Embodiment 101 | 8.2 | 62.2 | 0.322 | 0.343 | 515 |
| Embodiment 102 | 8.3 | 65 | 0.321 | 0.34 | 539 |
| Embodiment 103 | 9 | 60.3 | 0.323 | 0.337 | 453 |
| Embodiment 104 | 8.3 | 62.2 | 0.322 | 0.331 | 526 |
| Embodiment 105 | 8.4 | 64.4 | 0.321 | 0.345 | 542 |
| Embodiment 106 | 8.9 | 63 | 0.321 | 0.331 | 341 |
| Embodiment 107 | 8.2 | 62.7 | 0.322 | 0.342 | 527 |
| Embodiment 108 | 8.2 | 65 | 0.321 | 0.34 | 539 |

As can be seen from the result of the table 4, since the organic electric element according to the embodiments satisfies one or more of the general formula 4 to general formula 6, it may have excellent efficiency or lifespan compared to the organic electric element of the Comparative Example.

As can be seen from the result of the Table 4, the organic electric element according to the embodiments includes the charge generating layer including the first layer including the first compound and the second compound according to the embodiments so that it may have excellent efficiency or lifespan compared to the organic electric element of the Comparative Example.

In the case of Embodiments 46, 53, 60, 73, 77, 81, 91 and 97 including the first layer including the fourth compound represented by at least one of the chemical formula 1 and the chemical formula 2, its efficiency of lifespan is improved compared to the organic electric element of the Comparative Embodiment.

In addition, compared to the Embodiments 46, 53 and 60, it can be seen that the organic electric element of the Embodiments 47-52, 54-59 and 61-66 including the second layer comprising the fifth compound represented by the chemical formula 7 has better efficiency and longer life than the organic electric elements of Embodiments 46, 53 and 60.

In addition, it can be seen that the organic electric element of the Embodiments 67 and 70 comprising the third layer containing the sixth compound represented by the chemical formula 13 has better efficiency and longer life than the organic electric elements of Embodiments 46, 53 and 60.

In addition, it can be seen that the organic electric element of the embodiments 68-69 and 71-72 comprising the second layer further comprising the fourth compound represented by at least one of the chemical formulas 1 and 2 has better efficiency and longer life than the organic electric elements of Embodiments 67 and 70.

In addition, it can be seen that the organic electric element of the embodiments 74-76, 78-80 and 82-84 comprising the second layer comprising the fifth compound represented by the chemical formula 8 has better efficiency and longer life than the organic electric elements of Embodiments 73, 77 and 81.

In addition, it can be seen that the organic electric element of the embodiments 85 and 88 comprising the third layer further comprising the sixth compound represented by at least one of the chemical formula 13 has better efficiency and longer life than the organic electric elements of Embodiments 73, 77 and 81.

In addition, it can be seen that the organic electric element of the embodiments 86-87 and 89-90 comprising the second layer further comprising the fourth compound represented by at least one of the chemical formulas 1 and 2 has better efficiency and longer life than the organic electric elements of Embodiments 85 and 88.

In addition, it can be seen that the organic electric element of the embodiments 92-96 and 98-102 comprising the second layer comprising the fifth compound represented by the chemical formula 9 has better efficiency and longer life than the organic electric elements of Embodiments 91 and 97.

In addition, it can be seen that the organic electric element of the embodiments 68-69 and 71-72 comprising the third layer further comprising the sixth compound represented by the chemical formula 13 has better efficiency and longer life than the organic electric elements of Embodiments 46, 53 and 60.

In addition, it can be seen that the organic electric element of the embodiments 68-69 and 71-72 comprising the second layer further comprising the fifth compound represented by the chemical formula 10 has better efficiency and longer life than the organic electric elements of Embodiments 103 and 106.

Accordingly, when the second layer includes the fourth compound represented by one or more of the chemical formulas 1 and 2, efficiency or lifespan is improved, and additionally, when the second layer includes the fifth compound represented by the chemical formulas 7 to 9, the efficiency or lifetime is further improved. In addition, it can be seen that when the organic electric element includes the third layer including the sixth compound represented by the chemical formula 13, efficiency or lifetime is improved.

It will be apparent to those skilled in the art that various modifications and variations can be made in the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic electric element comprising:
a first electrode;
a second electrode; and
an organic layer positioned between the first electrode and the second electrode,
wherein the organic layer comprises a first layer comprises a first compound and a second compound, and an emitting layer comprises a third compound, and
wherein all of following general formulas 1 to 3 are satisfied:

$$0.32\ eV \leq L_1 - H_2 \leq 0.8\ eV \quad \text{[general formula 1]}$$

$$0.80\ eV \leq L_1 - H_3 \leq 1.4\ eV \quad \text{[general formula 2]}$$

$$0.40\ eV \leq H_2 - H_3 \leq 0.9\ eV \quad \text{[general formula 3]}$$

in the general formulas 1 to 3, $L_1$ is the LUMO (Lowest Unoccupied Molecular Orbital) energy level of the first compound,
$L_3$ is the LUMO (Lowest Unoccupied Molecular Orbital) energy level of the third compound,
$H_2$ is the HOMO (Highest Occupied Molecular Orbital) energy level of the second compound, and
$H_3$ is the HOMO (Highest Occupied Molecular Orbital) energy level of the third compound.

2. The organic electric element according to claim 1, wherein the first electrode is an anode electrode, the second electrode is a cathode electrode, and the first layer is positioned between the first electrode and the emitting layer.

3. The organic electric element according to claim 1, wherein the first layer is a hole injection layer, the first compound is a P-type dopant, and the second compound is a p-type host.

4. The organic electric element according to claim 1, wherein the emitting layer comprises a host and a dopant, and the third compound is one of the host and the dopant.

5. An organic electric element comprising:
a first electrode;
a second electrode; and
an organic layer positioned between the first electrode and the second electrode,
wherein the organic layer comprises a first stack comprising a first emitting layer, a second stack comprising a second emitting layer, and a charge generating layer positioned between the first stack and the second stack,
the charge generating layer comprises a second layer comprising a fourth compound and a fifth compound and a third layer comprising a sixth compound, and
all of following general formulas 4 to 6 are satisfied:

$$L_6 - L_4 \leq 2.1\ eV \quad \text{[general formula 4]}$$

$$L_6 - H_5 \leq 2.8\ eV \quad \text{[general formula 5]}$$

$$0.32\ eV \leq L_4 - H_5 \leq 0.8\ eV \quad \text{[general formula 6]}$$

in the general formulas 4 to 6, $L_6$ is the LUMO (Lowest Unoccupied Molecular Orbital) energy level of the sixth compound,
$L_4$ is the LUMO (Lowest Unoccupied Molecular Orbital) energy level of the fourth compound, and
$H_5$ is the HOMO (Highest Occupied Molecular Orbital) energy level of the fifth compound.

6. The organic electric element according to claim 5, wherein the first electrode is an anode electrode, the second electrode is a cathode electrode, and the second layer is positioned between the second electrode and the emitting third layer.

7. The organic electric element according to claim 5, wherein the second layer is a p-type charge generating layer, the third layer is a n-type charge generating layer, and the fourth compound is a P-type dopant, and the fifth compound is a p-type host.

8. The organic electric element according to claim 5, further comprises a hole injection layer positioned between the first electrode and the first emitting layer, and
　　the hole injection layer comprises the fourth compound and the fifth compound.

9. A display panel comprising a subpixel comprising the organic electric element of claim 1.

10. A display device comprising;
　　the display panel of claim 9; and
　　a driving circuit for driving the display panel.

11. A display panel comprising a subpixel comprising the organic electric element of claim 5.

12. A display device comprising;
　　the display panel of claim 11; and
　　a driving circuit for driving the display panel.

\* \* \* \* \*